US008582929B2

(12) United States Patent
Yi et al.

(10) Patent No.: US 8,582,929 B2
(45) Date of Patent: Nov. 12, 2013

(54) ULTRA-SENSITIVE ELECTRIC FIELD DETECTION DEVICE

(75) Inventors: Fei Yi, Evanston, IL (US); Seng-Tiong Ho, Wheeling, IL (US)

(73) Assignee: Northwestern University, Evanston, IL (US)

( * ) Notice: Subject to any disclaimer, the term of this patent is extended or adjusted under 35 U.S.C. 154(b) by 64 days.

(21) Appl. No.: 13/274,609

(22) Filed: Oct. 17, 2011

(65) Prior Publication Data
US 2012/0093455 A1    Apr. 19, 2012

Related U.S. Application Data

(60) Provisional application No. 61/393,429, filed on Oct. 15, 2010.

(51) Int. Cl.
*G02F 1/295* (2006.01)

(52) U.S. Cl.
USPC ............... 385/10; 385/8; 385/15; 385/40

(58) Field of Classification Search
USPC ............... 385/2–3, 8–10, 14–16, 39–42
See application file for complete search history.

(56) References Cited

U.S. PATENT DOCUMENTS

| | | | | |
|---|---|---|---|---|
| 4,900,112 A | * | 2/1990 | Kawachi et al. | 385/14 |
| 5,418,868 A | * | 5/1995 | Cohen et al. | 385/16 |
| 6,240,221 B1 | * | 5/2001 | Thompson | 385/14 |
| 7,016,555 B2 | * | 3/2006 | Ridgway et al. | 385/3 |

OTHER PUBLICATIONS

Sun, D.G. et al., Design and Fabrication of Electro-Optic Waveguides with Self-Assembled Superlattice Films, Optics and Laser Technology 39, 2007, vol. 2, 285-289.
Gan, H. et al., Optical Modulation from an Electro-Optic Polymer Based Hybrid Fabry-Perot Etalon Using Transparent Conducting Oxides, Organic Photonic Mater. and Devices., 2007, vol. 6470, 64700F-1.
Gan, H. et al., Hybrid Fabry-Perot Etalon Using an Electro-Optic Polymer for Optical Modulation, Appl. Phys. Lett., 2006, vol. 89, 141113.
Huang, Y. et al., A Single-Directional Microcavity Laser with Mircoloop Mirrors and Widened Medium Realized with Quantum-Well Intermixing, Photonics Technology Lett., 2006, vol. 18, 130.

(Continued)

*Primary Examiner* — Ellen Kim
(74) *Attorney, Agent, or Firm* — Morris, Manning & Martin, LLP; Tim Tingkang Xia, Esq.

(57) ABSTRACT

An electric field detection device. In one embodiment, the electric field detection device includes an interferometer having a reference arm and an active arm. The reference arm comprises a first electro-optic waveguide. The active arm comprises a first electrically conductive plate, a second electrically conductive plate spaced apart from the first electrically conductive plate defining a first gap therebetween, a third electrically conductive plate disposed in the first gap and vertically extending from the first electrically conductive plate to define a T-shape structure and a second gap between the third electrically conductive plate and the second electrically conductive plate, where the second gap is substantially smaller than the first gap; and a second electro-optic waveguide disposed in the second gap and being in electrical communication with the second and third electrically conductive plates.

50 Claims, 35 Drawing Sheets

(56) References Cited

OTHER PUBLICATIONS

Wang, L. et al., Near-Infrared Transparent Electrodes for Precision Teng-Man Electro-Optic Measurements: In2o3 Thin-Film Electrodes with Tunable Near-Infrared Transparency, Appl. Phys. Lett., 2005, vol. 87, 161107.
Xu, G. et al., Low-Voltage Organic Electro-Optic Modulators Using Transparent Conducting Oxides as Electrodes, Proc. SPIE, 2005, vol. 5935, 0Y1-0Y9.
Kang, H. et al., Exceptional Molecular Hyperpolarizabilities in Twisted Electron System Chromophores, Angew. Chem. Int. Ed., 2005, vol. 44, 7922-7925.
Yang, Y. et al., High-Performance Organic Light-Emitting Diodes Using ITO Anodes Grown on Plastic by Room-Temperature Ion-Assisted Deposition, Adv. Mater., 2004, vol. 16, 321-324.
Zhu, P. et al., Self-Assembled Materials and Devices that Process Light, Proc SPIE, 2004, vol. 5261, 105-116.
Marks, T.J. et al., Electro-Optic Waveguide Modulators by the Integration of Self-Assembled Superlattices with Polymeric and Semiconductor Materials, Proc. SPIE, 2003, vol. 4991, 133-143.
Solomon, G.S. et al., Large Spontaneous Emission Enhancement in InAs Quantum Dots Coupled to Mircodisk Whispering Gallery Modes, Phys. Stat. Sol., 2003, vol. 238, 309-312.
Zhao, Y.G. et al., Second-Generation Approach to All-Organic Modulators Based on Intrinsically Polar Self-Assembled Molecular Superlattices, Optical Engineering, 2003, vol. 42, 298-299.
Fang, W. et al., Large Enhancement of Spontaneous Emission Rates of InAs Quantum Dots in GaAs Microdisks, Optics Lett, 2002, vol. 27, 948-950.
Liu, Z. et al., Waveguide Electro-Optic Modulators Based on Intrinsically Polar Self-Assembled Superlattices (SASs) (SASs), SPIE Proceeding, 2002, vol. 4798, 151-162.
Ong, H.C. et al., Effect of a Microstructure on the Formation of Self-Assembled Laser Cavities in Polycrystalline ZnO, 2001, vol. 90, 1663.
Zhao, Y.G. et al., Traveling Wave Electro-Optic Phase Modulators Based on Intrinsically Polar Self-Assembled Chromophoric Superlattices, App. Phys. Lett., 2001, vol. 79, 587-589.
Ma, Y. et al., InGaAsP Thin-Film Mircodisk Resonators Fabricated by Polymer Wafer Bonding for Wavelength Add-Drop Filters, IEEE Photonics Technology Lett., 2000, vol. 12, 1495.
Zhao, Y.G. et al., Polymer Waveguides Useful Over a Very Wide Wavelength Range from the Ultraviolet to Infrared, ' Appl. Phys. Lett., 2000, vol. 77, 2961.
Rafizadeh, D. et al., Propagation Loss Measurements in Semiconductor Mircocavity Ring and Disk Resonators, Journal of Lightwave Technology, 1998, vol. 16, 1302-1314.
Chin, M.K. et al., Design and Modeling of Waveguide-Coupled Single-Mode Microring Resonators, Journal of Lightwave Technology, 1998, vol. 16, 1433-1446.
Hasenberg, T.C. et al., All-Binary InAs/GaAs Optical Waveguide Phase Modulator as 1.06, IEEE Photonics Technology Lett., 1994, vol. 6, 1210-1212.
Akca, I.B. et al., Electro-Optic Modulation on InAs Quantum Dot Waveguides, Eindhoven, Netherlands, 2008.
Wakita, K. et al., High-Speed InGaA1As/InA1As Multiple Quantum Well Electrooptic Phase Modulators with Bandwidth in Excess of 20 GHz, IEEE Photonics Technology Lett, 1992, vol. 4, 29.
Ranalli, E.R. et al., Narrow Bandwidth Electrooptic Polarization Modulator Using GaAs Quantum-Well Waveguides, IEEE Photonics Technology Lett., 1991,vol. 4, 320.
Moreau, G. et al., InGaAs/GaAs QD-Based 100 nm Bandwidth Electro Optic Modulator for 1.55 um Applications, Conf. on Lasers and Electro-Optics, 2007.
Arakawa, T. et al., GaAs/A1GaAs Five-Layer Asymmetric Coupled Quantum Well (FACQW) Mach-Zehnder Modulator, Conf. on Lasers and Electro-Optics, 2007.
Mcllvaney, K. et al., A Low Drive Voltage GaAs/A1GaAs Coupled Quantum Well Modulator Exhibiting Blue and Red Absorption Edge Shifts, IEE Colloquium, Apr. 1-4, 1990.
Tatebayashi, J. et al., Measurement of Electro-Optic Coefficients of 1.3 um Self-Assembled InAs/GaAs Quantum Dots, Electronics Lett., 2007, vol. 43, 410-412.
Tsuzuki, K. et al., Low Driving Voltage 40 Gbit/s n-i-n Mach-Zehnder Modulator Fabricated on InP Substrate, IEICE Transactions on Electronics, 2005, vol. E88-C, 960-966.
Cho, C.C. et al., Low Dielectric-Constant Insulators for Electronics Applications, Mater. Chemistry and Physics, 1995, vol. 42, 91-95.
Akca, I.B. et al., Electro-Optic and Electro-Absorption Characterization of InAs Quantum Dot Waveguides, Optics Express, 2008, vol. 16, 3439.
Chen, Y. et al., Polarization-Independent Strained InGaAs/InGaA1As Quantum-Well Phase Modulators, IEEE Photonics Technology Lett., 1992, vol. 4, 1120-1123.
Yi, F. et al., Organic Electro-Optic Modulators with Substantially Enhanced Performance Based on Transparent Electrodes, Transparent Electronics, 2009.
Yi, F. et al., Transparent Conducting Oxide (TCO) Electrode Based Organic Electro-Optic (EO) Modulator with Ultra High Switching Voltage-Size Performance, Frontiers in Optics, 2008.
Xu, G.Y. et al., Organic Electro-Optic Modulator Using Transparent Conducting Oxides as Electrodes, Optics Express, 2005, vol. 13, 7380-7385.
Wang, L. et al., High-Performance Transparent Inorganic-Organic Hybrid Thin-Film n-Type Transistors, Nature Mater., 2006, vol. 5, 893-900.
Sun, H. et al., All-Dielectric Electrooptic Sensor Based on a Polymer Microresonator Coupled Side-Polished Optical Fiber, IEEE Sensors Journal, 2007, vol. 7, 515-523.
Irwin, M.D. et al., p-Type Semiconducting Nickel Oxide as an Efficiency-Enhancing Anode Interfacial Layer in Polymer Bulk-Heterojunction Solar Cells, PNAS, 2008, vol. 105, 2783-2787.

\* cited by examiner

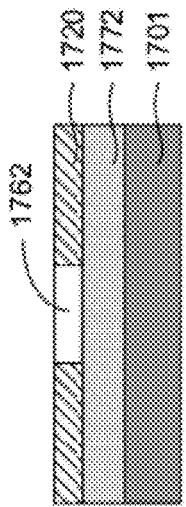
Fig. 18A
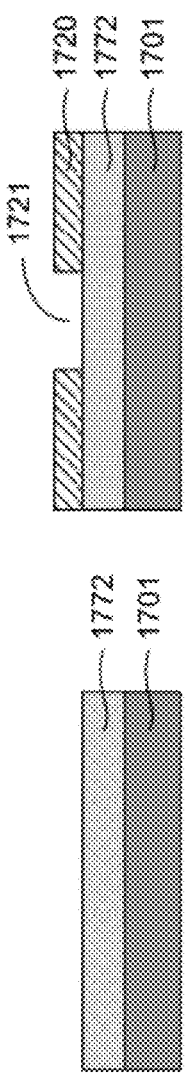
Fig. 18B
Fig. 18C
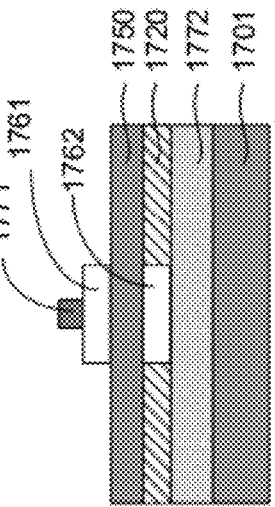
Fig. 18D
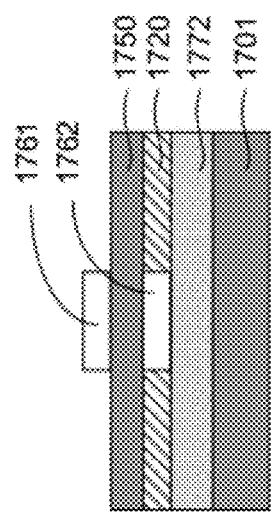
Fig. 18E
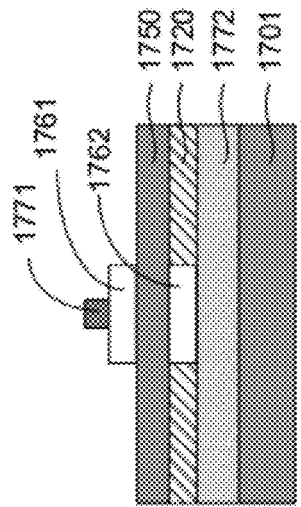
Fig. 18F

ULTRA-SENSITIVE ELECTRIC FIELD DETECTION DEVICE

CROSS-REFERENCE TO RELATED PATENT APPLICATION

This application claims priority to and the benefit of, pursuant to 35 U.S.C. §119(e), U.S. provisional patent application Ser. No. 61/393,429, filed Oct. 15, 2010, entitled "ULTRA-SENSITIVE ELECTRIC FILED DETECTION DEVICE," by Fei Yi and Seng-Tiong Ho, the content of which is incorporated herein in its entirety by reference.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates generally to an electric field detection device, more particularly to an electric field detection device that utilizes a micro-antenna and an electro-optic waveguide structure to enhance the sensitivity of the electric field detection.

BACKGROUND OF THE INVENTION

Electric field sensing is often performed using an antenna and receiver combination. In these systems, the sensitivity is related to both the design of the antenna and the receiver electronics. Obtaining a system that has a high sensitivity over a broad frequency response has proven to be very challenging. In addition, since the antenna size is related to the wavelength of the signal, the electric field detectors are relatively large, especially at lower frequencies. Therefore, compact detectors and arrays are difficult to achieve. Sensor architectures that do not have an antenna, for example, the optical or high impedance based sensors, have not yet demonstrated a sensitivity comparable to that of the antenna based systems.

Therefore, a heretofore unaddressed need exists in the art to address the aforementioned deficiencies and inadequacies.

SUMMARY OF THE INVENTION

In one aspect, the present invention provides an electric field detection device. In one embodiment, the electric field detection device includes an interferometer having a reference arm and an active arm. The reference arm comprises a first electro-optic (EO) waveguide.

The active arm comprises a first metallic plate, a second metallic plate spaced apart from the first metallic plate defining a first gap therebetween, a third metallic plate disposed in the first gap and vertically extending from the first metallic plate to define a T-shape structure and a second gap between the third metallic plate and the second metallic plate, where the second gap is substantially smaller than the first gap, a second electro-optic waveguide disposed in the second gap, where the second electro-optic waveguide comprises a waveguide layer, a first cladding layer disposed between the third metallic plate and the waveguide layer, and a second cladding layer disposed between the waveguide layer and the second metallic plate, and a dielectric layer disposed in the first gap and surrounding the third metallic plate and the second electro-optic waveguide. The second electro-optic waveguide is in electrical communication with the third metallic plate and the second metallic plate, respectively.

In one embodiment, the first and third metallic plates are formed integrally.

In one embodiment, the dielectric layer is formed of CYTOP™.

In one embodiment, each of the first and second cladding layers is formed of a transparent conducting oxide (TCO), where the TCO comprises one of Sn-doped $In_2O_3$, $In_2O_3$, ZnO, and NiO. In another embodiment, each of the first and second cladding layers is formed of an electrically non-conductive material.

The waveguide layer, in one embodiment, is formed of a semiconductor material selected from groups III-V of the Period Table, where the semiconductor material comprises GaAs. In one embodiment, the waveguide layer comprises quantum well structures or quantum dot structures of the semiconductor material.

In another embodiment, the waveguide layer is formed of an organic electro-optic material, where the organic electro-optic material comprises molecularly self-assembled super-lattices. In one embodiment, the organic electro-optic material comprises an organic material with an electro-optic coefficient $r_{33}$ higher than about 100 pm/V.

In one embodiment, each of the first and second electro-optic waveguides comprises a retro-reflector at the end thereof, where the retro-reflector comprises a micro-loop mirror. The retro-reflector comprises a metallic coating at the end of a respective electro-optic waveguide.

In one embodiment, the electric field detection device further includes a first optical ring resonator coupled to the first electro-optic waveguide and a second optical ring resonator coupled to the second electro-optic waveguide.

In one embodiment, the interferometer further comprises an input/output waveguide having a first end and a second end, where the first end is optically coupled to both the first and second electro-optic waveguides, and the second end is optically coupled to an optical fiber, where the second end of the input/output waveguide is tapered to a pointed tip such that the width of the tip is less than half of the wavelength of a light beam propagating in the input/output waveguide, and the optical fiber has a lens tip.

In one embodiment, the electric field detection device further includes a gradient-index (GRIN) lens configured to facilitate the optical coupling between the second end of the input/output waveguide and the optical fiber.

In one embodiment, the reference arm has an optical path-length that is about $\lambda/8$ longer than the optical path-length of the active arm, where $\lambda$ is the wavelength of a light beam propagating in the interferometer. The electric field detection device may further have a heater disposed in the vicinity of the reference arm adapted for tuning the optical path-length of the reference arm.

In another aspect, the present relates to an electric field detection device. In one embodiment, the electric field detection device includes an interferometer having a reference arm and an active arm. The reference arm comprises a first electro-optic (EO) waveguide. The active arm comprises a first electrically conductive plate, a second electrically conductive plate spaced apart from the first electrically conductive plate defining a first gap therebetween, a third electrically conductive plate disposed in the first gap and vertically extending from the first electrically conductive plate to define a T-shape structure and a second gap between the third electrically conductive plate and the second electrically conductive plate, where the second gap is substantially smaller than the first gap; and a second electro-optic waveguide disposed in the second gap, the second electro-optic waveguide having a first surface and an opposite, second surface, where the first surface is in electrical communication with the third electrically conductive plate and the second surface is in electrical communication with the second electrically conductive plate.

In one embodiment, each of the first, second and third electrically conductive plates is formed of a metal. In one embodiment, the first and third electrically conductive plates are formed integrally.

In one embodiment, the active arm further comprises a dielectric layer disposed in the first gap and surrounding the third electrically conductive plate and the second electro-optic waveguide.

In one embodiment, the second electro-optic waveguide further comprises a first cladding layer disposed on the first surface thereof and a second cladding layer disposed on the second surface thereof. In one embodiment, each of the first and second cladding layers is formed of a transparent conducting oxide (TCO). In another embodiment, each of the first and second cladding layers is formed of an electrically non-conductive material.

In one embodiment, each of the first and second electro-optic waveguides comprises a high-refractive-index-contrast waveguide, where the high-refractive-index-contrast waveguide is formed of a semiconductor material selected from groups III-V of the Period Table. In one embodiment, the semiconductor material comprises GaAs. In one embodiment, the high-refractive-index-contrast waveguide comprises quantum well structures or quantum dot structures of the semiconductor material.

In another one embodiment, each of the first and second electro-optic waveguides is formed of an organic electro-optic material. In one embodiment, the organic electro-optic material comprises molecularly self-assembled superlattices.

In one embodiment, each of the first and second electro-optic waveguides comprises a retro-reflector at the end thereof.

Additionally, the electric field detection device further includes a first optical ring resonator coupled to the first electro-optic waveguide and a second optical ring resonator coupled to the second electro-optic waveguide. In one embodiment, the interferometer further comprises an input/output waveguide having a first end and a second end, where the first end is optically coupled to both the first and second electro-optic waveguides, and the second end is optically coupled to an optical fiber.

Furthermore, the electric field detection device includes a gradient-index (GRIN) lens configured to facilitate the optical coupling between the second end of the input/output waveguide and the optical fiber. In one embodiment, the reference arm has an optical path-length that is about $\lambda/8$ longer than the optical path-length of the active arm, where $\lambda$ is the wavelength of a light beam propagating in the interferometer. In one embodiment, the electric field detection device includes a heater disposed in the vicinity of the reference arm adapted for tuning the optical path-length of the reference arm.

In yet another aspect, the present invention relates to an electric field detection system. In one embodiment, the electric field detection system has an electric field detection device as disclosed above, and an optical circulator having a first port configured to receive an input light beam, a second port configured to transmit the input light beam to and to receive an output light beam from the electric field detection device, and a third port configured to transmit the output light beam received from the electric field detection device to a light detection system.

In one embodiment, the electric field detection system further has a first beam splitter, the first beam splitter having an input port configured to receive a source light beam, a first output port configured to transmit a first part of the source light beam to the first port of the optical circulator, and a second output port configured to transmit a second part of the source light beam to the light detection system.

In one embodiment, the light detection system comprises a second beam splitter, the second beam splitter having a first input port configured to receive the output light beam transmitted from the third port of the optical circulator, a second input port configured to receive the second part of the source light beam transmitted from the second output port of the first beam splitter, a first output port configured to output an enhanced light beam resulted from a constructive interference of the light beams received from the first and the second input ports of the second beam splitter, and a second output port configured to output a reduced light beam resulted from a destructive interference of the light beams received from the first and second input ports of the second beam splitter.

Additionally, the light detection system further comprises a light detector configured to receive the light beam transmitted from the second output port of the second beam splitter.

Furthermore, the light detection system comprises a phase shifter and an optical attenuator coupled in series between the second output port of the first beam splitter and the second input port of the second beam splitter, where the light detection system further comprises a feedback controller coupled between the light detector and the phase shifter and between the light detector and the optical attenuator, respectively.

In a further aspect, the present invention relates to an electric field detection module comprising a plurality of the above-disclosed electric field detection devices arranged in an array.

In one embodiment, the electric field detection module further comprises a dense wavelength division multiplexer (DWDM) coupled to the plurality of electric field detection devices via an optical fiber and a gradient-index (GRIN) lens, where the DWDM comprises a diffraction grating.

These and other aspects of the present invention will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment.

FIG. 18A-18K show schematically a fabrication process of a micro-antenna and TCO enhanced organic electro-optic waveguide according to one embodiment of the present invention.

DETAILED DESCRIPTION OF THE INVENTION

Figure 1:
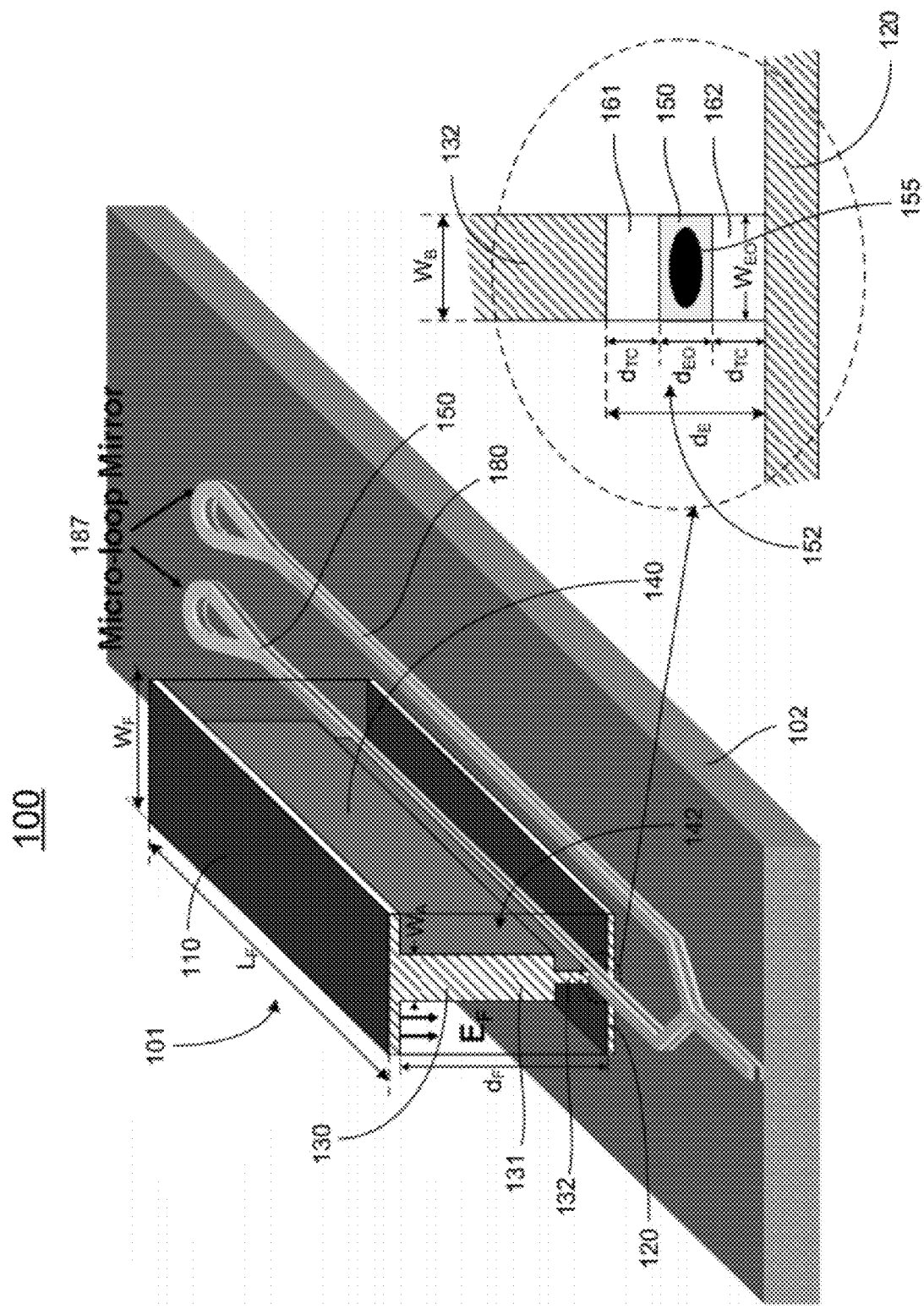
FIG. 1 shows schematically a perspective view of an electric field detection device according to one embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed as a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving" and the like are to be understood to be open-ended, i.e., to mean including but not limited to.

The terms "III-V", as used herein, refers to a material selected from Groups III-V in the Periodic Table.

The description will be made as to the embodiments of the present invention in conjunction with the accompanying drawings in FIGS. 1-32. In accordance with the purposes of this invention, as embodied and broadly described herein, this invention, in one aspect, relates to an ultra-sensitive electric field detection device over a wide frequency range while being compact and power efficient.

According to embodiments of the present invention, the electric field detection device has a sensitivity about 0.1 $\mu V/m \cdot Hz^{1/2}$ and a frequency range of about 0.5 Hz to about 1 GHz with a response bandwidth of about 1,000 Hz, however, conventional electro-optic based approaches can only achieve a typical electric field detection sensitivity of tens of $mV/m \cdot Hz^{1/2}$. In one embodiment, the electric field detection device has a size as small as about 1 $mm^2$. In another embodiment, a plurality of such devices is fabricated into an array, for example a 5×5 array.

According to the present invention, the central component to the electric field detection device is an electro-optic (EO) waveguide. In one embodiment, the electro-optic waveguide includes a thin-film, III-V material based electro-optic waveguide structure with dimensions of around 0.3 $\mu m$. The fabrication of such an III-V electro-optic waveguide structure involves wafer bonding, thin film transfer technique and a mode enlarger for easy optical coupling, which are referred in the specification as III-V WB-TT-ME.

In another embodiment, the electro-optic waveguide includes an organic electro-optic waveguide with dimensions of around 1.5-2 $\mu m$. The organic electro-optic waveguide structure include a robust molecularly self-assembled (referred in the specification as Org-Mole-SA) organic thin film.

In yet another embodiment, the electric field detection device further includes a micro-antenna. The use of the micro-antenna enables an applied electric field to the electro-optic waveguide to be enhanced about 150 times or more. Further enhancement of the electric field is achieved with the micro antenna combined with a transparent-conducting oxide (TCO) based electro-optic waveguide structure, which is another 4-6 times enhancement over just using the micro-antenna alone.

In a further embodiment, the electric field detection device utilizes a multiple optical passing scheme having an integrated resonator structure and an integrated retro-reflector that enables effectively over 20 times longer optical interaction length and hence over 20 times higher sensitivity. The retro-reflector enables simple packaging with only one input fiber connected to the sensor instead of utilizing two fibers (one input and one output).

In yet a further embodiment, the electric field detection device includes an optical carrier power reduction scheme that enables a strong optical signal to be generated by the electric field by using a high optical power of about 100 mW in the electro-optic waveguide. The optical carrier power is reduced before it reaches the high-speed (about 1 GHz) photodetector via an interferometric technique so that the beam's power reaching the photodetector is below the detector saturation power of about 1 mW.

In one embodiment, the electric field detection device is corresponding to a sensitive wideband photodetection system in which a sensitive low-noise, wide-band photodector-amplifier module with about 10-100 $fW/Hz^{1/2}$ optical power sensitivity enables the optical signal to be converted to an electrical signal and measured. The use of an intensity stabilized laser and intensity noise subtraction via a balanced dual detector pair further enables the measurements to be sensitive down to about 0.5 Hz.

According to one embodiment of the present invention, with all the above-mentioned enhancements combined together, the electric field detection device provides a total of over 100,000 times enhancement in the electric field detection sensitivity. In another embodiment, another factor of 10 times improvement is achieved by using quantum well/dot structure for the III-V based electro-optic structure and organic electro-optic materials of high electro-optic tensor (coefficient) $r_{33}$ for the organic based structure. It turns out that a 300 times increase in sensitivity is sufficient to reach the targeted electric field detection sensitivity of 0.1 $\mu V/m \cdot Hz^{1/2}$, assuming an achievable 1 GHz broadband photodetection sensitivity of 10 $fW/Hz^{1/2}$ for the optical power.

According to one embodiment of the present invention, the ultra-sensitive electric field detection device is based on detecting the external field induced optical phase shift in an electro-optic waveguide via a number of innovative components to greatly enhance the detection sensitivity as briefly described below.

Novel Micro-antenna Design to Increase Sensitivity by about 150 Times: A micro-antenna is adapted for amplifying the electric field strength by about 150 times and applying the amplified electric field to the electro-optic material region (actual enhancement is about 300 times but reduced by 2 times due to the filling dielectric materials with a dielectric constant of about 2).

Micro-antenna Effect Enhanced by TCO Based EO Structure: The 150 times enhancement of the electric field by the use of a micro-antenna is achieved only with the use of a TCO to conduct voltages directly across the electro-optic material, otherwise the enhancement is about 3-6 times lower depending on the electro-optic material used.

Utilizing III-V and Organic EO Materials: The central component of the electric field detection device according to the present invention is an electro-optic waveguide, formed of an III-V based electro-optic material or organic electro-optic material. In one embodiment, an inorganic high refractive-index-contrast waveguide is used. In another embodiment, a low dielectric constant organic material is used. Both types of materials can give very comparable performances. The micro-antenna structure is applied to both types of material but with about 5 times smaller enhancement for the organic case.

III-V Focused on GaAs: In one embodiment, the III-V based EO waveguide initially employs bulk GaAs for ease of fabrication and demonstration. A further enhancement by about 3-10 times is achieved by using quantum dots or quantum wells. The high refractive-index-contrast of an III-V material enables the waveguide core thickness to be as thin as about 0.3 µm, which is about 5 times thinner than the organic material case (about 1.5 µm thick), enabling 5 times higher electric field enhancement utilizing the micro-antenna design. One potential drawback of GaAs is its high dielectric constant $\in=12.5$ that is 5 times higher than the $\in=2.5$ for the organic materials. Hence, the in-material electric field could potentially be reduced by 5 times, but it is only reduced slightly as shown later. According to the present invention, the material effect on the micro-antenna is dominated by the much larger filling material under the micro-antenna and not by the electro-optic material. The material parameter $n^3 r_{33}$ of the bulk GaAs is about 58 pm/V. Compared to the typical organic electro-optic material with the parameter $n^3 r_{33}$ of about 150 pm/V (assuming the electro-optic coefficient $r_{33}=30$ pm/V), the parameter $n^3 r_{33}$ is about 3 times higher for organic materials, which indicates that the electro-optic response for GaAs is about 3 times worse. However, GaAs gained about 5 times more in the electric field strength from the micro-antenna enhancement. As a result, GaAs still comes out about 5/3 times better. If the organic case employs the recently developed high electro-optic coefficient $r_{33}$ organic material with the electro-optic coefficient $r_{33}$ of 150 pm/V, then the organic case may be better than GaAs by about 3 times. But then the use of quantum well and quantum dots in the III-V based device could also lead to another 3-10 times enhancement so they can again be very comparable. The optical wavelength to be used for the electric field detector probing is at 1.0 µm and 1.3 µm. The coupling into the GaAs waveguide is performed via a mode-enlarging tapered structure or an integrated high-NA micro GRIN lens. The process for fabricating the III-V based device include wafer bonding and thin-film transfer and the use of mode enlarger (III-V WB-TF-ME).

Organics focused on Robust Self-Assembly: The organic EO waveguide initially employs molecularly self-assembled electro-optic materials. In one embodiment, poled organic materials with a high electro-optic coefficient $r_{33}$ are also used. The self-assembly material currently has the electro-optic coefficient $r_{33}$ of about 30 pm/V but the material is covalently bonded and highly robust compared to spin-coated poled organic materials. The main advantages of a self-assembly material are that: (a) it does not need poling; (b) it can withstand high laser power of greater than 100 mW in the waveguide; (c) it has no pin holes and no poling produce them so it is very suitable for the application; (d) its optical loss is low less than 1 dB/cm; (e) it can withstand high temperatures of greater than 200° C.; (f) electro-optic modulators that demonstrate the above advantages have been developed. In one embodiment, an organic material with 5-10 times higher electro-optic coefficient $r_{33}$ is employed. The other organic electro-optic materials such as poled polymers can also be used for the organic based EO waveguide. The optical wavelength to be used for the electric field detector probing is at 1.0 µm and 1.3 µm.

Multi-pass and/or Resonator Structures to Increase Sensitivity about 10 Times: To achieve more phase shift within a 1 mm-size device, two methods are used to achieve multiple passing through the electro-optic region: (a) a ring resonator scheme in which a 1 mm long electro-optic section utilizing a resonator with a finesse of 10 makes the effective optical interaction length about 10 times longer. With an enhancement of about 10 times, a device having an about 1 mm-long electro-optic region acts like a device having an about 1 cm-long electro-optic region. (b) A retro-reflector based on micro-loop mirror or metallic coating enables dual pass to achieve about 2 times the phase shift. In one embodiment, a 10-20 times increase in sensitivity is achieved by combining schemes (a) and (b).

Interferometeric Optical-Carrier Reduction Enabling High Optical Power and Increase in Sensitivity by 10-100 Times: Higher optical power in the waveguide (10-100 mW) results in a 10-100 times higher sensitivity than that when only 1 mW optical power is used since the electro-optic modulated signal sideband generated has a higher power. However, most high-sensitivity photo detectors (e.g. APD) saturate at about 1 mW. According to the present invention, an optical-carrier-reduction scheme is employed to bring the 10-100 mW in-device optical carrier power down to about 1 mW so as to achieve a 10-100 times increase in sensitivity. This reduction is performed after the beam passes through the device and is converted to an amplitude modulation. In one embodiment, the optical carrier reduction is achieved using an optical interference technique with matched arms, making it insensitive to laser frequency noise. The use of intensity stabilized laser and intensity noise cancellation with dual detectors further reduces the low-frequency noise and enable electric field detection down to 0.5 Hz.

High Sensitivity Wideband Detection: To address the 0.5 Hz to 1 GHz bandwidth requirement, a sensitive photo-detection system with a wide bandwidth is used. An RF spectrum analyzer with an optical input head can reach about 10 fW/Hz$^{1/2}$ optical power sensitivity with about 1 GHz bandwidth. Portable APD detector module has sensitivity ranging from about 30 fW/Hz$^{1/2}$ to about 500 fW/Hz$^{1/2}$. If 30 fW/Hz$^{1/2}$ detection sensitivity is assumed, to ensure 0.5 Hz is detected, equal-path-length interference is used to convert the phase-shift to an intensity modulation, which is insensitive to the laser phase noise. Thus, the resonator also utilizes a phase-shift resonance geometry instead of an intensity resonance geometry since the intensity-resonance geometry is very sensitive to laser frequency noise or phase noise, which has 1/f behavior at low spectral frequency. Lasers with intensity stabilization and the use of intensity noise subtraction with a balanced dual detector pair (if needed) further ensures that the measurements are sensitive down to about 0.5 Hz.

DWDM-On-A-Chip for Array Addressing: According to the present invention, both multi-fiber inputs and DWDM-On-A-Chip technology for 5×5 array addressing are utilized. The DWDM-On-A-Chip technology enables the use of a single fiber. It is applied to the GaAs based device and utilizes a monolithically integrated super-compact grating (Array-SCG) technology. The SCG involves only planar waveguide and is capable of substantially lower loss (<2 dB) than compact AWG based on channel waveguides (>10 dB).

In summary, the factors: micro-antenna, TCO enhancement, multi-pass, and optical carrier reduction, result in about 100,000 times increase in sensitivity compared to conventional electro-optic approaches that has a sensitivity of about tens of mV/m·Hz$^{1/2}$. A 300 times increase in sensitivity is sufficient to reach an electric field detection sensitivity of 0.1 μV/m·Hz$^{1/2}$, assuming an achievable 1 GHz broadband photodetection sensitivity of 10 fW/Hz$^{1/2}$ for the optical power. As discussed below, not all factors have to be included to meet the performance parameters listed in Table 1. For example, the use of quantum-well structure, micro-antenna, a double-pass scheme, and sensitive detector giving very low wall-plugged power is sufficient to reach the performance parameters listed under Embodiment I in Table 1. Multi-pass and optical carrier reduction can bring another over 500 times higher sensitivity than that needed for meeting the performance parameters listed under Embodiment II in Table 1, but requires more complex system control and higher wall-plugged power.

TABLE 1 performance parameters of an electric field detection device according to embodiments of the present invention

| | Embodiment I | Embodiment II |
| --- | --- | --- |
| Sensitivity | 100 μV/m · Hz$^{1/2}$ | 0.1 μV/m · Hz$^{1/2}$ |
| Bandwidth | 10 Hz | 1000 Hz |
| Frequency range | 0.5-10$^5$ Hz | 0.5-10$^9$ Hz |

TABLE 1-continued performance parameters of an electric field detection device according to embodiments of the present invention

| | Embodiment I | Embodiment II |
| --- | --- | --- |
| Sensor size | 25 mm$^2$ | 1 mm$^2$ |
| Array size | 1 device | 5 × 5 devices |

An alternative scheme to increase sensitivity by 100 times more is to use a long winding waveguide on the 1×1 mm$^2$ area, which increases the interaction length by about 100 times. However, such method cannot work unless the waveguide has very low loss. The micro-antenna approach is superior since it gets about 150 times sensitivity increase using a 1×1 mm$^2$ area for the micro-antenna. The waveguide is basically only 1 mm long so the optical throughput still is high.

According to the present invention, with all these enhancements combined together, the electric field detection device provides a total of over 100,000 times enhancement in the electric field detection sensitivity, compared to conventional electric field detection devices. Another factor of about 10 times improvement is achieved by using quantum well/dot structure for the III-V based electro-optic waveguide and organic electro-optic materials of a high EO coefficient $r_{33}$ for the organic based waveguide. It turns out that a 300 times increase in sensitivity is sufficient to reach the targeted electric field detection sensitivity of 0.1 μV/m·Hz$^{1/2}$, assuming an achievable 1 GHz broadband photodetection sensitivity of 10 fW/Hz$^{1/2}$ for the optical power.

Table 2 summarizes the various enhancement factors of the electric field detection device according to embodiments of the present invention, which show that with the use of the III-V or organic electro-optic materials, the sensitivity of about 0.1 μV/m·Hz$^{1/2}$ is reached without employing optical carrier power reduction enhancement of 100 times or the resonator enhancement of greater than 5 times (see case A in the total enhancement row). This results in a simple low wall-plugged power system. With the optical carrier power reduction enhancement and with the use of resonator, a 500 times higher sensitivity, i.e., 0.0002 μV/m·Hz$^{1/2}$ is reached (see case D in the total enhancement row). However, the system control is more complex and the wall-plugged power is higher. The use of quantum well/quantum dot for the case of III-V results in another 3-10 times enhancement without increasing the wall-plugged power. The equivalent for the organic scheme is the use of high $r_{33}$ materials.

TABLE 2 the various enhancement factors of the electric field detection device according to embodiments of the present invention

| Factors (1 mm device) | III-V WB-TT-ME | Organics |
| --- | --- | --- |
| $n^3 r_{33}$ (typical) | 58 pm/V (Bulk GaAs) | 148 pm/V (Org. Mole-SA) ($r_{33}$ = 30 pm/V) About 3 times higher than GaAs |
| $n^3 r_{33}$ (enhanced) | With use of QW/QD 200-600 pm/V | High-$r_{33}$ Organics ($r_{33}$ = 150 pm/V) 740 pm/V |
| Optical wavelengths | 1 μm and 1.3 μm | 1 μm and 1.3 μm |
| Micro-antenna without TCO | About 40 times sensitivity | About 8 times sensitivity |
| (i) micro-antenna with TCO enhancement. | About 150 times sensitivity | About 50 times sensitivity |
| (ii) multi-pass, using a resonator | Greater than 5 times sensitivity | Greater than 5 times sensitivity |
| (iii) multi-pass, using a retro reflector | About 2 times sensitivity | About 2 times sensitivity |

TABLE 2-continued the various enhancement factors of the electric field detection device according to embodiments of the present invention

| Factors (1 mm device) | III-V WB-TT-ME | Organics |
|---|---|---|
| (iv) carrier power reduction | About 100 times sensitivity | About 100 times sensitivity |
| (i) · (ii) · (iii) · (iv) | 150,000 times sensitivity | 50,000 times sensitivity |
| EO Electrode Distance | 0.3 μm | 1.5 μm |
| Total Enhancement<br>A: with a micro-antenna and retro reflectors.<br>B: Add QW or high $r_{33}$ to A<br>C. Add Resonator to A<br>D. All added to A | A: about 300 times (with (i) & (iii))<br>B: about 900 times (QW with (i) & (iii))<br>C: 1,500 times ((i), (iii), (ii))<br>D: 150,000 times ((i), (ii), (iii), (iv)) | A: 100 times (with (i) & (iii))<br>B: 500 times (high r33 with (i) & (iii))<br>C: 500 times ((i), (iii), (ii))<br>D: 50,000 times ((i), (ii), (iii), (iv))<br>About 3 times lower than GaAs |
| Sensitive wideband photodetection system (Sen-WB-PD) | 1 GHz BW<br>Min about 10 fW/Hz$^{1/2}$ | 1 GHz BW<br>Min about 10 fW/Hz$^{1/2}$ |
| Projected sensitivity for 1 mm device. Assuming the photodetector sensitivity of 10 fW/Hz$^{1/2}$ | A: 0.1 μV/m · Hz$^{1/2}$<br>B: 0.03 μV/m · Hz$^{1/2}$<br>C: 0.02 μV/m · Hz$^{1/2}$<br>D: 0.0002 μV/m · Hz$^{1/2}$ | A: 0.1 μV/m · Hz$^{1/2}$<br>B: 0.02 μV/m · Hz$^{1/2}$<br>C: 0.02 μV/m · Hz$^{1/2}$<br>D: 0.0002 μV/m · Hz$^{1/2}$ |

Figure 2:
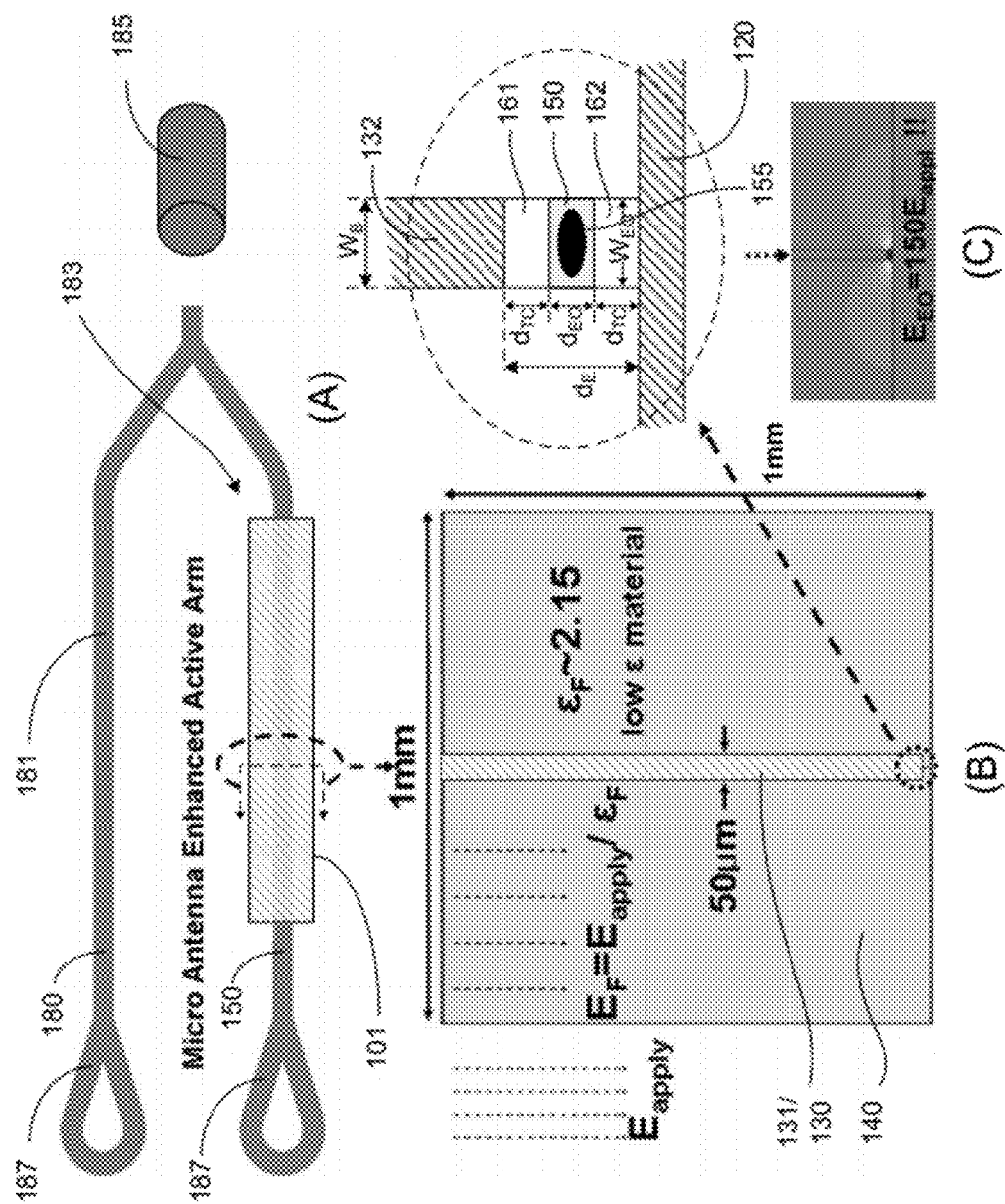
FIG. 2 shows schematically (A) a top view and (B) a cross-sectional view of the electric field detection device shown in FIG. 1 and (C) an enhancement of the electric field therein, according to one embodiment of the present invention.

Referring to FIGS. 1 and 2, an electric field detection device 100 is shown according to one embodiment of the present invention. The electric field detection device 100 includes an interferometer having a reference arm 181 and an active arm 183. The active arm 183 includes a micro-antenna 101. In the exemplary embodiment, the micro-antenna 101 has a first electrically conductive plate 110 and a second electrically conductive plate 130 arranged parallel to each other and spaced apart by a distance, $d_F$, defining a first gap 142 therebetween, and a third electrically conductive plate 130 disposed in the first gap 140 and vertically attached to and being in electrical contact with the first electrically conductive plate 110 so as to define a second gap 152 with a gap width, $d_E$, between the third electrically conductive plate 130 and the second electrically conductive plate 120. As such, the first electrically conductive plate 110 and the third electrically conductive plate 130 define a T-shape structure. In one embodiment, the first electrically conductive plate 110 and the third electrically conductive plate 130 are formed integrally.

As shown in FIG. 1, each of the first and second electrically conductive plates 110 and 120 has a width $W_F$ and a length $L_F$. The third electrically conductive plate 130 has a body portion 131 having one end connected to the first electrically conductive plate 110 and a tip portion 132 extending from the other end of the body portion 131 such that the second gap 152 is defined between the tip portion 132 and the second electrically conductive plate 120. The third electrically conductive plate 130 has a length that is the same as that of the first and second electrically conductive plate 110. The body portion 131 has a width $d_A$ and a thickness $W_A$. The tip portion 132 has a width $d_B$ and a thickness $W_B$.

The first and second electrically conductive plates 110 and 120 constitute a receiving part of the detection device 100 for receiving an external electric field to be detected, and thus, are called the field receiving plates (F-RPs). The third electrically conductive plate 130 is adapted for applying the electric field to the electro-optic waveguide 150 and is called the EO-field applying plates (EOF-APs). In one embodiment, each of the first to third electrically conductive plates 110, 120 and 130 is formed of an electrically conductive material such as a metal.

The electric field detection device 100 also has a second electro-optic waveguide structure formed in the second gap 152. The electro-optic waveguide structure 150 has a width $W_{EO}$ that is equal to the thickness $W_B$ of the tip portion 132 of the third electrically conductive plates 130 and a height $d_{EO}$, as shown in FIG. 1. Specifically, the second electro-optic waveguide structure has a waveguide layer 150, a first (top) cladding layer 161 disposed between the third metallic plate 130 and the waveguide layer 150, and a second (bottom) cladding layer 162 disposed between the waveguide layer 150 and the second metallic plate 120. Each of the top and bottom cladding layers 161 and 162 has a height $d_{TC}$ and a width that is the same as width $W_{EO}$ of the electro-optic waveguide structure 150.

In one embodiment, the electro-optic waveguide layer 150 is formed of a material of groups III-V of the periodic table. For example, the electro-optic waveguide layer 150 is formed of GaAs. The GaAs electro-optic property imposes a phase shift on the TE-polarized (with polarization parallel to the substrate plane) propagating beam under the influence of an applied electric field. Additionally, the electro-optic waveguide layer 150 may have quantum-wells (QWs) or quantum-dots (QDs) 155 formed therein.

In another embodiment, the electro-optic waveguide layer 150 is formed of an organic electro-optic material, where the organic electro-optic material comprises molecularly self-assembled superlattices. Preferably, the organic electro-optic material comprises an organic material with an electro-optic coefficient $r_{33}$ higher than about 100 pm/V.

In one embodiment, the top and bottom claddings layers 161 and 162 are electrically non-conductive. In another embodiment, the top and bottom claddings layers 161 and 162 are electrically conductive, for example, formed of a transparent-conducting oxide (TCO) material, such as Sn-doped $In_2O_3$, $In_2O_3$, ZnO, NiO, or the like.

The remaining portion of the first gap 142 defined between the first and second electrically conductive plates 110 and 120 is filled with a dielectric material (dielectric layer) 140 having a dielectric constant, $\in_F$, so that the third metallic plate 130 and the second electro-optic waveguide 150 is surrounded by the dielectric layer 140. In one embodiment, the dielectric layer 140 is formed of CYTOP™.

Additionally, as shown in FIGS. 1 and 2, each of the first and second electro-optic waveguides 180 and 150 comprises a retro-reflector 187 at the end thereof. In one embodiment, the retro-reflector 187 comprises a micro-loop mirror. In another embodiment, the retro-reflector comprises a metallic coating at the end of a respective electro-optic waveguide.

In one embodiment, the interferometer further comprises an input/output waveguide 185 having a first end and a second end, where the first end is optically coupled to both the first and second electro-optic waveguides 180 and 150, and the second end is optically coupled to an optical fiber. In one embodiment, the second end of the input/output waveguide is tapered to a pointed tip such that the width of the tip is less than half of the wavelength of a light beam propagating in the input/output waveguide, and the optical fiber has a lens tip.

In one embodiment, the reference arm has an optical path-length that is about $\lambda/8$ longer than the optical path-length of the active arm, where $\lambda$ is the wavelength of a light beam propagating in the interferometer. The electric field detection device may further have a heater disposed in the vicinity of the reference arm adapted for tuning the optical path-length of the reference arm.

In one embodiment, the electric field detection device further includes a first optical ring resonator coupled to the first electro-optic waveguide and a second optical ring resonator coupled to the second electro-optic waveguide.

In one embodiment, the electric field detection device further includes a gradient-index (GRIN) lens configured to facilitate the optical coupling between the second end of the input/output waveguide and the optical fiber.

In one aspect of the present invention, an electric field detection system has an electric field detection device as disclosed above, and an optical circulator having a first port configured to receive an input light beam, a second port configured to transmit the input light beam to and to receive an output light beam from the electric field detection device, and a third port configured to transmit the output light beam received from the electric field detection device to a light detection system.

In another aspect of the present invention, an electric field detection module comprises a plurality of the above-disclosed electric field detection devices arranged in an array. In one embodiment, the electric field detection module further comprises a dense wavelength division multiplexer (DWDM) coupled to the plurality of electric field detection devices via an optical fiber and a gradient-index (GRIN) lens, where the DWDM comprises a diffraction grating.

Various micro fabrication techniques and materials (e.g. TCO and organic materials) required for the successful realization of the electric field detection devices have been developed. The fabrication involves wafer-level process and hence enables many devices to be fabricated on a single wafer run, resulting in economy of scale and potentially low-cost devices.

These and other aspects of the present invention are further described below. Without intent to limit the scope of the invention, exemplary devices and their related results according to the embodiments of the present invention are given below. Note again that titles or subtitles may be used in the examples for convenience of a reader, which in no way should limit the scope of the invention. Moreover, certain Theories are proposed and disclosed herein; however, in no way they, whether they are right or wrong, should limit the scope of the invention.

EXAMPLE 1

Electric Field Enhancement Using a Micro-Antenna

Figure 3:
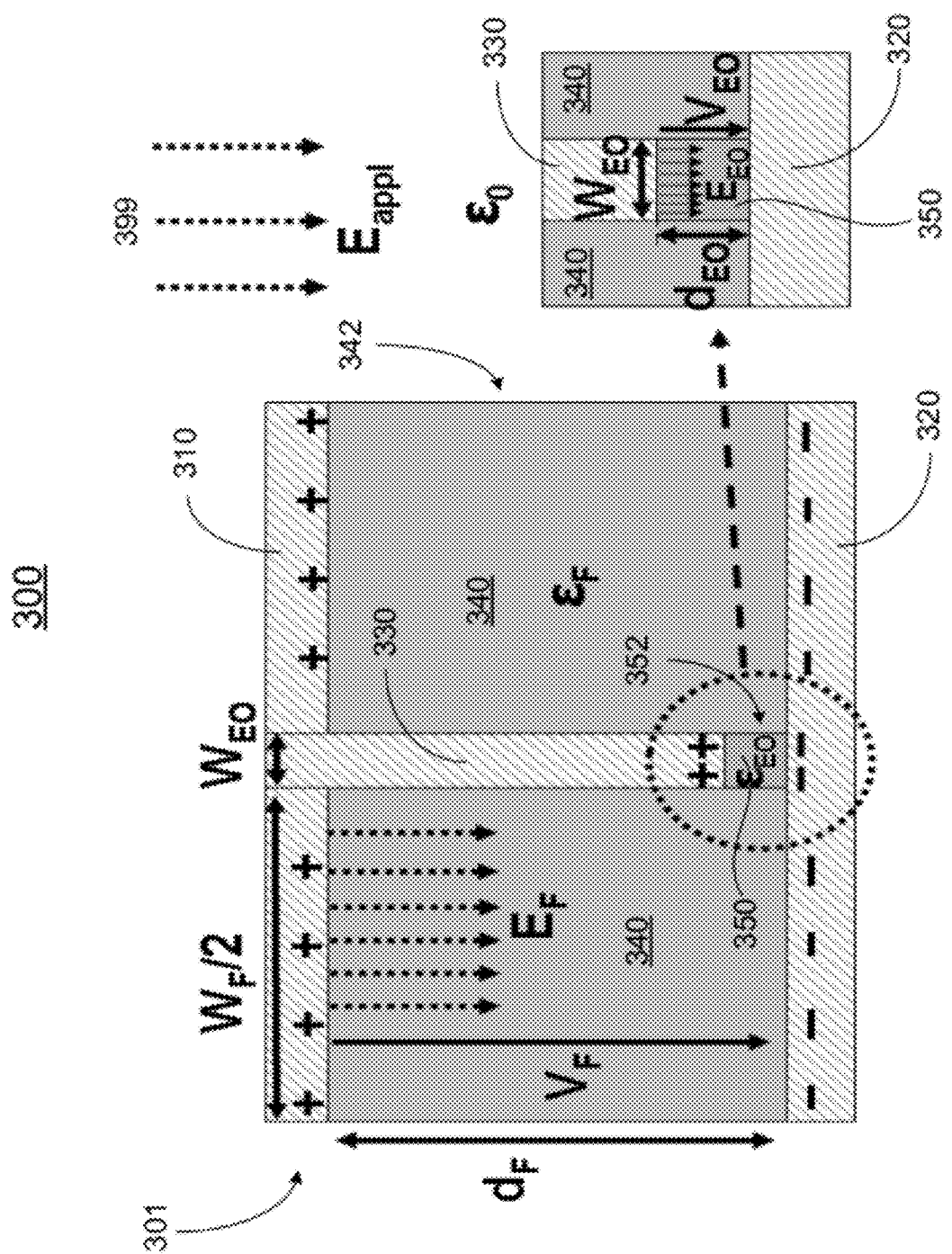
FIG. 3 shows schematically the structure of a micro-antenna formed by two connected parallel plates, according to one embodiment of the present invention.

Referring now to FIG. 3, an electric field detection device 300 including a micro-antenna 301, which provides about 100 times enhancement in sensitivity, is shown according to one embodiment of the present invention. In the exemplary embodiment, the micro-antenna 301 has a first metallic plate 310 and a second metallic plate 330 arranged parallel to each other and spaced apart by a distance, $d_F$, defining a first gap 342 therebetween, and a third metallic plate 330 disposed in the first gap 340 and vertically attached to and being in electrical contact with the first metallic plate 310 so as to define a second gap 352 with a gap width, $d_{EO}$, between the third metallic plate 330 and the second metallic plate 330. The electric field detection device 300 also has an electro-optic waveguide 350 structure formed in the second gap 352. The remaining portion of the first gap 342 defined between the first and second metallic plates 310 and 320 is filled with a dielectric material (dielectric layer) 340 having a dielectric constant, $\in_F$. The first and second metallic plates 310 and 320 constitute a receiving part of the detection device 300 for receiving an external electric field to be detected, and thus, are called the field receiving plates (F-RPs). The third metallic plate 330 is adapted for applying the electric field to the electro-optic waveguide 350 and is called the EO-field applying plates (EOF-APs).

In one embodiment, each of the first and second metallic plates 310 and 320 has a width $W_F$ and a length $L_F$ (not shown). The third metallic plate 330 has a thickness (width) $W_{EO}$ and a length $L_{EO}$. The electro-optic waveguide 350 has a width, $W_{EO}$, that is equal to the thickness of the third metallic plate 330, and a height, $d_{EO}$, that is the same as the gap width of the second gap 352. The external electric field 399 to be measured is assumed to have electric field strength $E_{Appl}$. The electric field between the first and second metallic plates 310 and 320 is set to be $E_F$. If the material 340 in-between the first and second metallic plates 310 and 320 has a dielectric constant $\in_F$, then $E_F$ is scaled down from the external electric field $E_{Appl}$ due to the dielectric boundary conditions and is given by $E_F=E_{Appl}\cdot(\in_0/\in_4)$. Thus, it is important to choose the filling material 320 in-between the first pair of metallic plates 310 to have a low dielectric constant. In one embodiment, CYTOP having a dielectric constant of about 2.15 is used. Other dielectric materials with low dielectric constants can also be used to practice the present invention.

The electric field $E_F$ in the dielectric layer 340 between the first and second metallic plates 310 and 320 induces a voltage $V_F$ given by $E_F$ times $d_F$:

$$V_F = E_F \cdot d_F \tag{EQ1}$$

The voltage $V_F$ is then conducted to the third metallic plate 330 that applies it across the electro-optic waveguide core 350. The first and second metallic plates 310 and 320 and the third metallic plate 330 have the same length so that $L_F=L_{EO}$. Since the first metallic plate 310 and the third metallic plate 330 are electrically connected, they have the same voltage difference $V_F$ between the first metallic plate 310 and the second metallic plate 320, and the third metallic plate 330 and the second metallic plate 320. Let the electric field across the second gap 352 be $E_{EO}$, then the voltage $V_F$ is related to $E_{EO}$ by:

$$V_F = E_{EO} \cdot d_{EO} \tag{EQ2}$$

The physics applied hereto is that by connecting one of the large first and second metal plates with a small metallic plate disposed between the first and second metal plates, the voltage across the two large metal plates and the voltage across one large metal plates and the small metallic plate are forced to be equal, and the electrical charge concentrates in the small plate region, and therefore enhances the electric field therein. It is like a lightning rod which has very strong electric field at the tip region. A more systematic explanation is described in terms of the "ideal", "non-ideal", and "without-top-plate" cases as follows.

Ideal Case

Equating EQ1 and EQ2 via the common voltage $V_F$, one obtains $$E_{EO}=E_F \cdot (d_F/d_{EO})=E_{Appl} \cdot (d_F/d_{EO}) \cdot (\in_0/\in_F) \quad (EQ3).$$

Thus, the electric field $E_{EO}$ at the electro-optic region 350 is increased by the plate-distance ratio $(d_F/d_{EO})$. As discussed below, the distance $d_{EO}$ is basically the height (thickness) of the electro-optic waveguide core 350 that is much smaller than the distance $d_F$. In one embodiment of the GaAs waveguide discussed below, $d_{EO}$ is about 0.3 μm. The distance $d_F$ is about 10 times or 100 times larger than $d_{EO}$. Foe example, $d_F$=30 μm that is 100 times larger than $d_{EO}$. As the induced voltage $V_F$ across $d_F$ is now applied across a 100 times smaller gap $d_{EO}$ at the third metallic plate 330, the field strength is increased by 100 times as given by the ratio $(d_F/d_{EO})$=30 μm/0.3 μm=100 for this example. As discussed below, in reality, it works only at the limit when the electric field receiving plates are dominantly large. Let's call this limit the "ideal scaling" and define $E_{IDEAL}=E_F \cdot (d_F/d_{EO})$ so that when $E_{EO}=E_{IDEAL}$, the ideal case is approached. In reality, $E_{EO}$ is always less than $E_{IDEAL}$. Under what condition can the ideal case be obtained is the subject of discussion below.

Non Ideal Case and Saturation Region

From the above discussions, a question is whether this means that one can make $d_F$ very large, say $d_F$=1 mm and obtain an incredible field enhancement of 3,300 times (assuming $d_{EO}$=0.3 μm)? A related question is whether the widths $W_F$ and $W_{EO}$ of the first to third plates play any role. What happens if the plate width $W_F$ of the first and second plates is small compare to the plate separation $d_F$? A quick answer is that in order to approach the ideal case, the "capacitance $C_F$" of the field receiving plates (F-RPs) 310 and 320 shall be larger than the "capacitance $C_{EO}$" of the EO-field applying (third) plate (EOF-AP) 330 and the second plate 320 in order for the voltage transfer to be determined by the field receiving plates 310. That is, one needs $C_F \gg C_{EO}$.

Let the dielectric constant of the dielectric material 340 in-between the field receiving plates 310 and 320 be $\in_F$ and the dielectric constant of the dielectric material 350 in-between the EO-field applying plate 330 and the second plate 320 be $E_{EO}$. Since $C=\in A/d$, one has $C_F=(W_F \cdot L_F \cdot \in_F)/d_F$ then the condition requiring $C_F \gg C_{EO}$ leads to $(W_F \cdot \in_F/d_F) \gg (W_{EO} \cdot \in_{EO}/d_{EO})$ or $W_F \gg W_{EO} \cdot (\in_{EO}/\in_F) \cdot (d_F/d_{EO})$.

Detailed field simulations show that if $C_F$ and $C_{EO}$ are exactly equal, the $E_{EO}$ achieved is at 50% of its ideal value $E_{Ideal}$. Similarly, if $C_F$ is 9 times larger than $C_{EO}$, then the $E_{EO}$ achieved is at about 90% of its ideal value $E_{Ideal}$, and one can call such a region the field-scaling saturation region. More precisely, if the saturation factor S is defined the ratio of $E_{EO}$ to $E_{Ideal}$, i.e., $S=(E_{EO}/E_{idea})$, the field saturation region is corresponding to S approaching its maximum value of 1. Numerical simulation shows that in terms of the capacitances, the saturation factor S is approximately given by $S \approx C_F/(C_F+C_{EO})$. Hence, when the capacitance of the field receiving plates dominates so that $C_F \gg C_{EO}$, S approaches 1.

Case without Top Plate

What is interesting is that from the simulation, it turns out that when $W_F$ goes to zero, the field scaling does not disappear but approaches about 20% of the ideal case. This is because the "vertically-connecting metal" plate 330 is used to connect the lower plate 320 to the upper plate 330 still interacts with the external electric field $E_{Appl}$ and has fringing field pattern that still gives a significant effective capacitance value for $C_F$. As the top plate is not really needed but it does not mean that one can put another device next to it as the fringing field still occupies some effective space around the vertically-connecting metal. A good design is still to have the top plate to confine the fringing field.

Numerical Simulation Results

Figure 4:
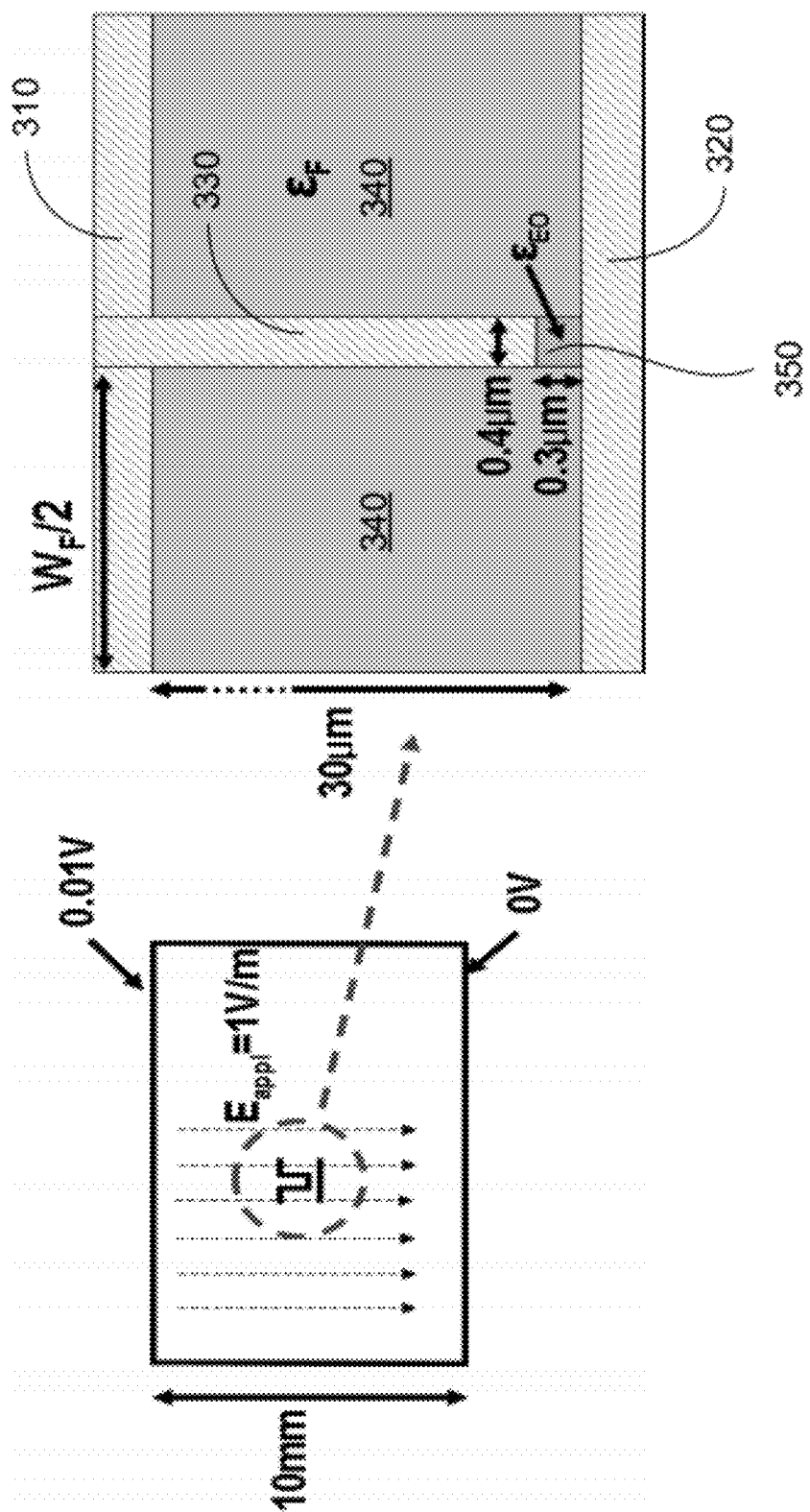
FIG. 4 shows schematically the structure of a micro-antenna according to one embodiment of the present invention.

In one embodiment, as shown in FIG. 4, a 0.01 V voltage is applied across 10 mm to obtain the external field $E_{Appl}$=1 V/m.

Figure 5:
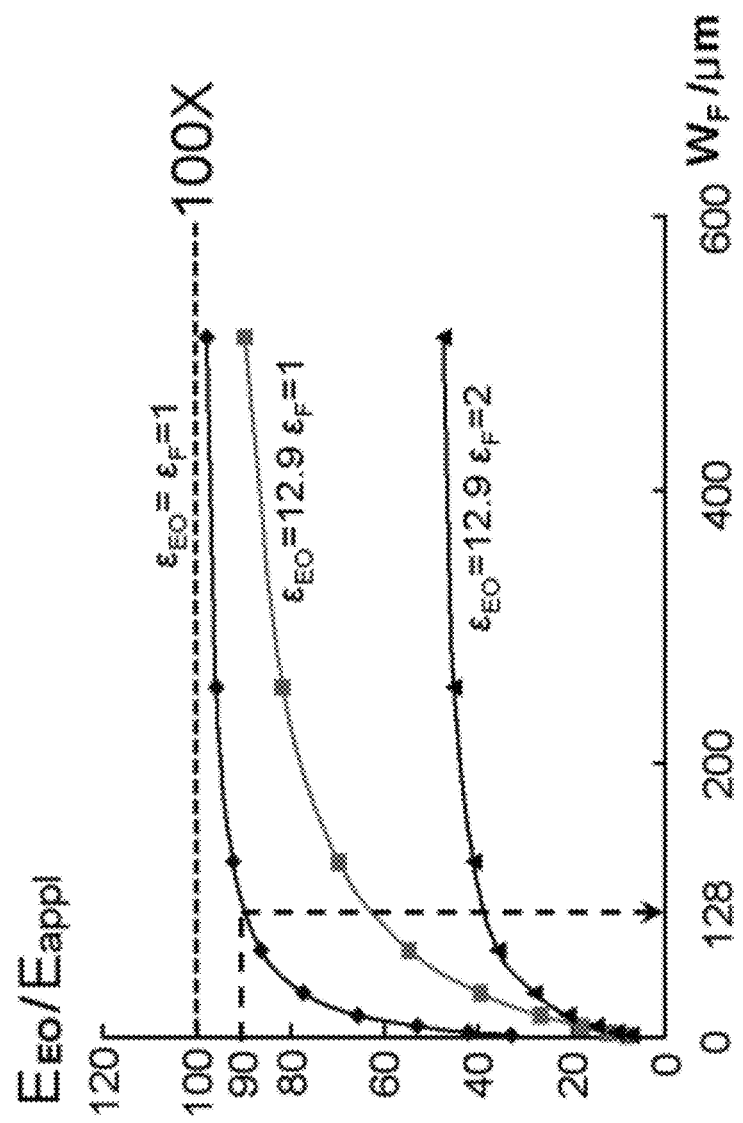
FIG. 5 shows the simulation results for the micro-antenna shown in FIG. 4, according to one embodiment of the present invention.

FIG. 5, shows: (1): in order to achieve $E_{Ideal}$, $W_F$ needs to be large enough so $C_F$ dominates the micro-antenna structure. For example, in order for saturation factor S=90%, $W_F$ is larger than 128 μm, and (2) the dielectric constants of the materials in the $C_{EO}$ region and the $C_F$ region scale down $E_F$, and thus $E_{EO}$ due to the relative dielectric constant of the material in the $C_F$ region, or $\in_F/\in_0$.

Enhancement Limitations

Figure 6:
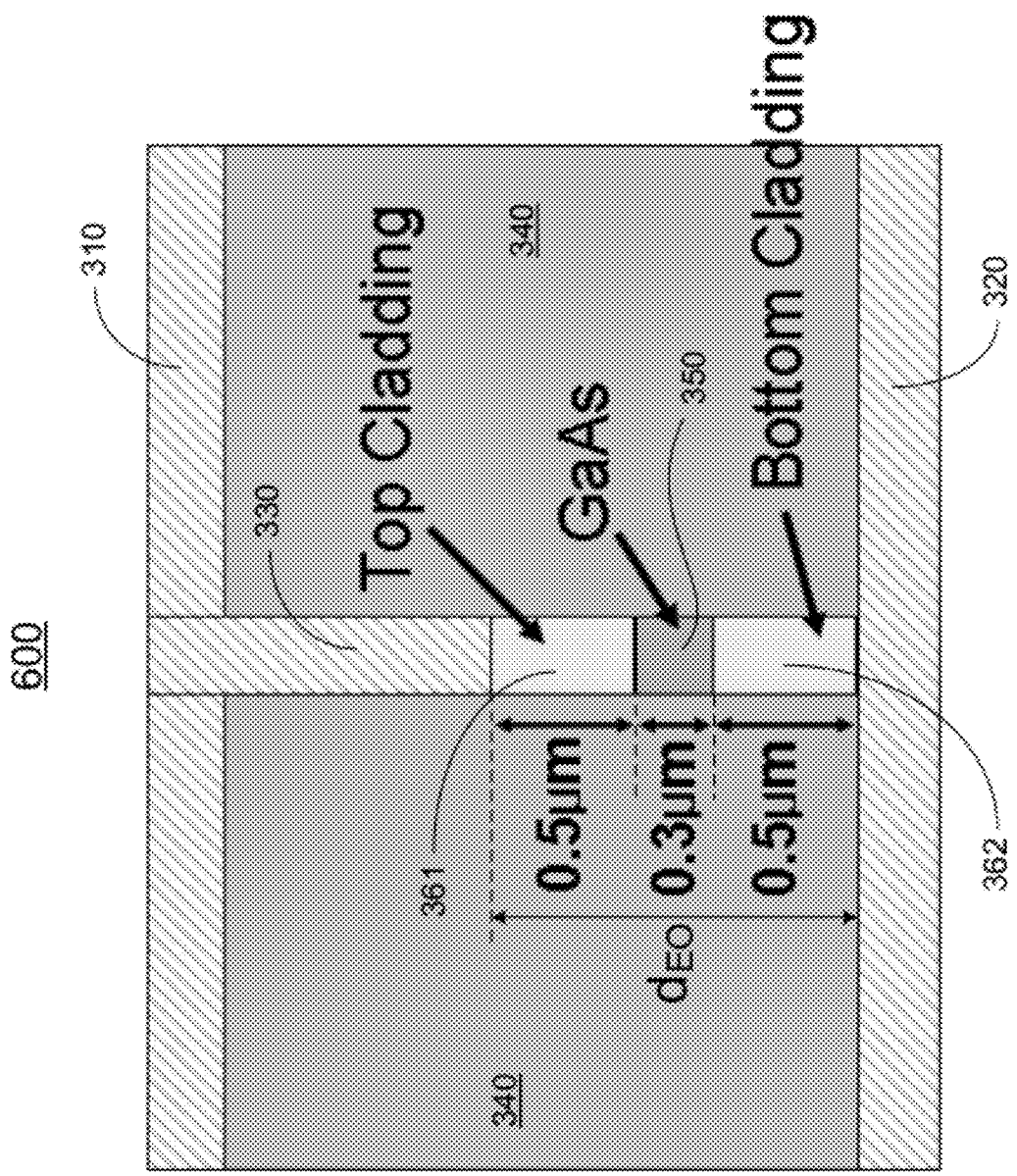
FIG. 6 shows schematically the structure of a micro-antenna enhanced GaAs electro-optic waveguide with conventional cladding according to one embodiment of the present invention.

From the above discussions, it is clear that given the area constrain of 1 mm² and assuming a square area so that the width of the electric receiving plate 310 is constrained to 1 mm, the smaller the EO-plate distance $d_{EO}$, the larger is the enhancement of the electric field. In one embodiment, as shown in FIG. 6, the electric field detection device 600 has an electro-optic waveguide structure 350 formed of GaAs. In order to avoid metal-induced optical loss, a low-refractive-index top cladding layer 361 is formed between the third plate 330 and the GaAs waveguide 350 and a low-refractive-index bottom cladding layer 362 is formed between the GaAs waveguide 350 and the second plate 320 in the second gap 352. In one embodiment, each of the low-refractive-index top and bottom cladding layers 361 and 362 has a thickness about 0.5 μm, as shown in FIG. 6. In the example, the EO-plate (second gap) distance $d_{EO}$=0.5 μm×2+0.3 μm=1.3 μm, if these claddings layers 361 and 362 are electrically non-conductive.

Figure 7:
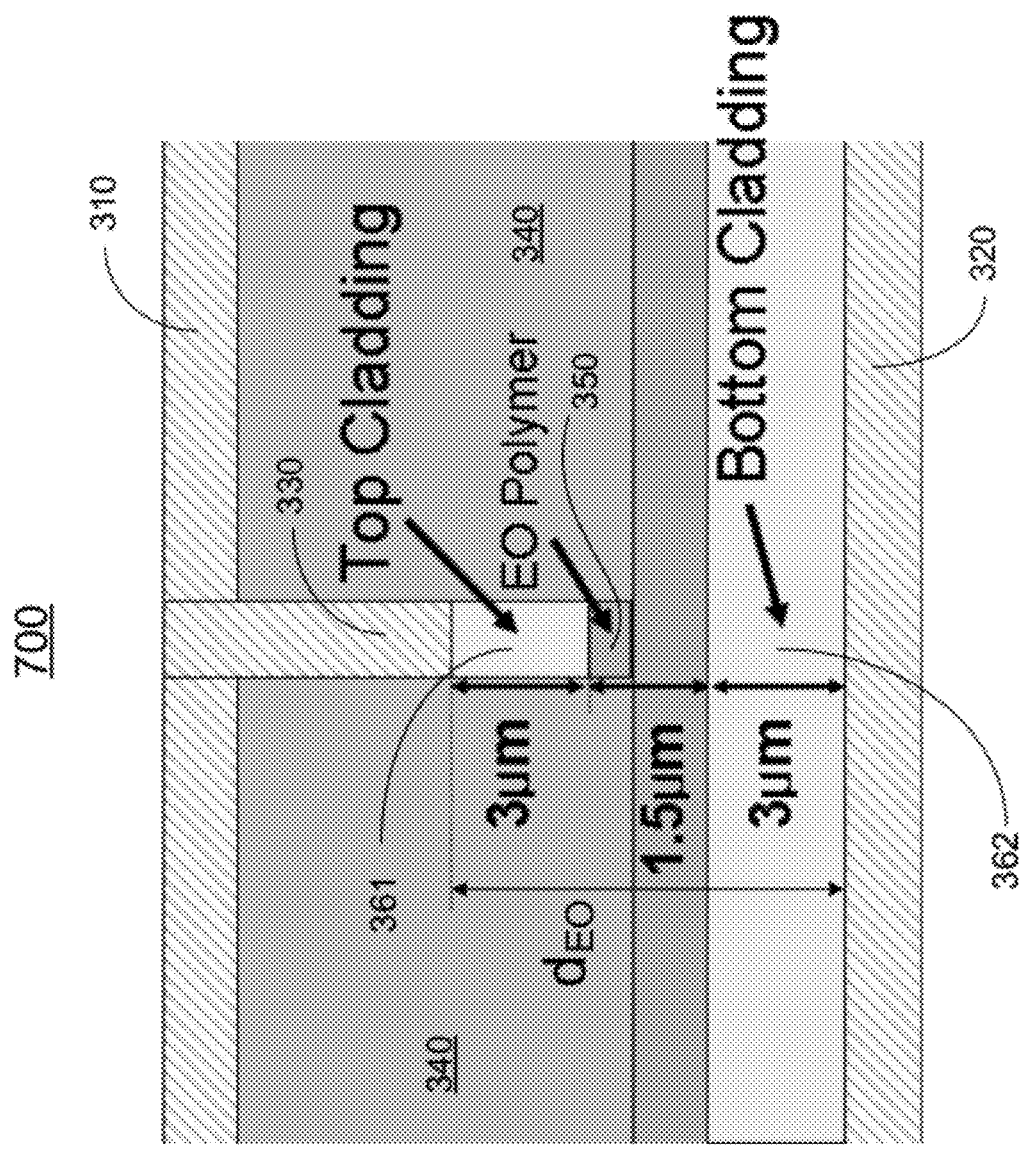
FIG. 7 shows schematically the structure of a micro-antenna enhanced organic waveguide with conventional cladding according to one embodiment of the present invention.

Similarly for an organic waveguide based device 700, each of the top and bottom cladding layers 361 and 362 typically has a thickness about 3 μm, as shown in FIG. 7, resulting in $d_{EO}$=3 μm×2+1.5 μm=7.5 μm, if the cladding layers 361 and 362 are electrically non-conductive, which results in 4 times to 5 times loss in potential field strength gain had there been no claddings. One way to gain the enhancement factor back is to make the cladding conductive.

EXAMPLE 2

Enhancement Using TCO based EO Waveguide Structure with Micro-Antenna

Figure 8:
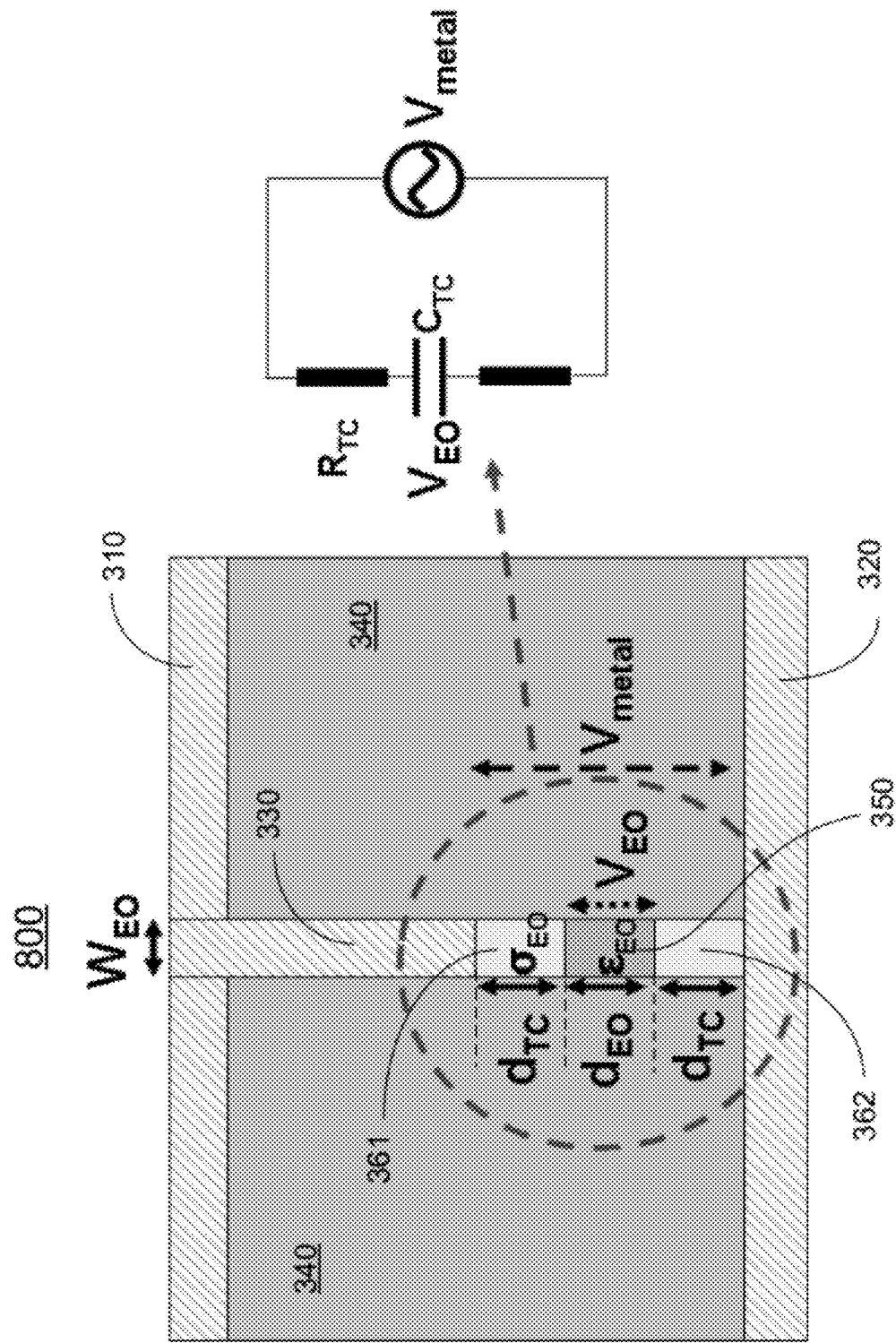
FIG. 8 shows schematically the structure of a micro-antenna enhanced and TCO-enhanced electro-optic waveguide and its equivalent RC circuit according to one embodiment of the present invention.
Figure 9:
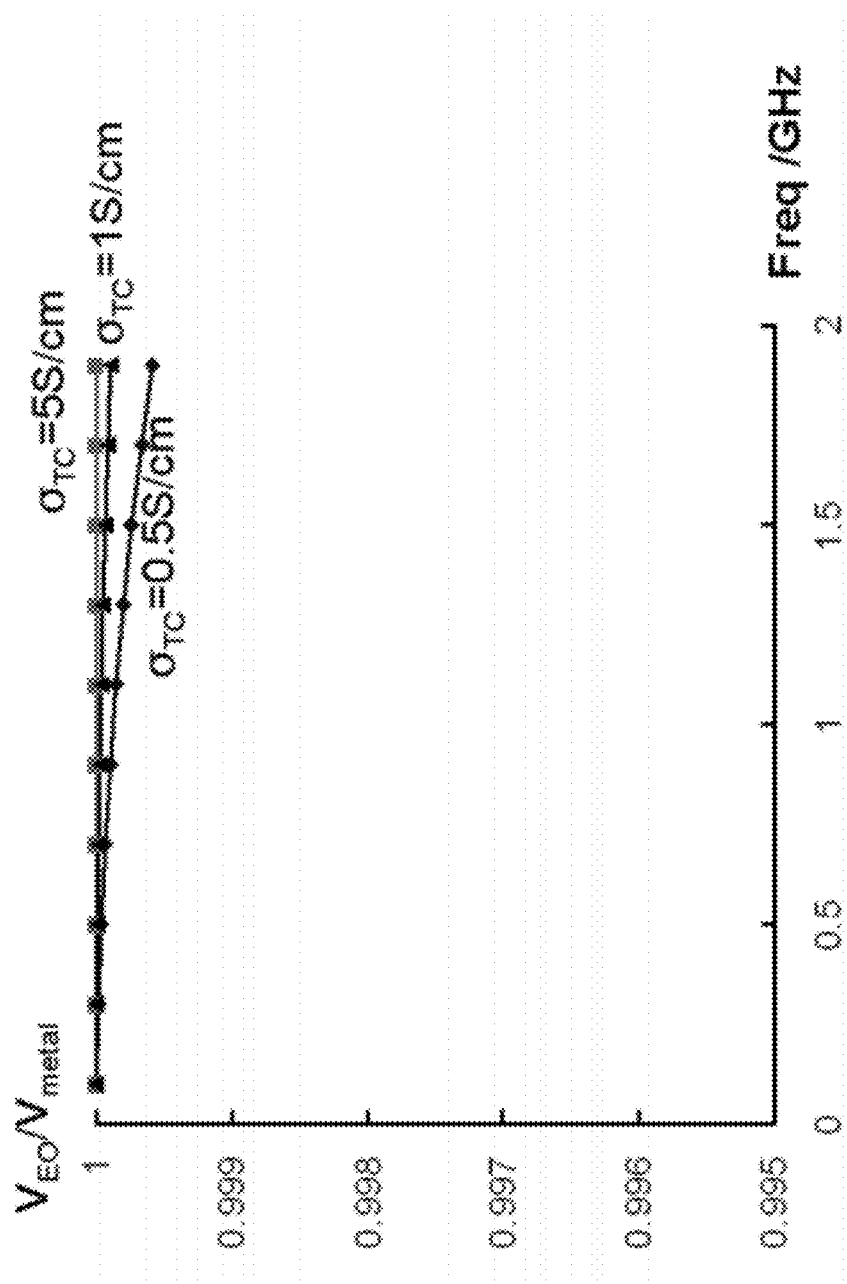
FIG. 9 shows the frequency response over a 1 GHz region for the TCO-enhanced electro-optic waveguide shown in FIG. 8, according to one embodiment of the present invention.

Referring to now FIG. 8, an electric field detection device 800 is shown according to one embodiment of the present invention. The detection device 800 is structurally similar to the detection device 600 shown in FIG. 6, except the top and bottom cladding layers 361 and 362 are electrically conductive, and formed of a transparent-conducting oxide (TCO) material. As discussed above, the use of TCO enables another 4 times to 5 times gain in the electric field detection sensitivity and still maintain the 1 GHz frequency response with the use of appropriate TCO materials and device structure. When using TCO layers as cladding, it is necessary to maintain the cladding to be low in optical loss. In one embodiment, the TCO is engineered to have the appropriate material figure of merits $F_{TCO}$ and electrical conductivity σ, so as to have a low optical loss.

The material figure of merit F is defined by the ratio of the electrical conductivity (σ) to optical loss (α) ($F_{TCO}$=σ/α). It has been shown that high-frequency (greater than 2.5 GHz) and low voltage can be achieved with $F_{TCO}$>0.1 and σ≈10 S. Appropriate TCO materials meeting such requirements have been successfully engineered. TCO based modulators that show the significant TCO advantages have been successfully realized. Similar conditions also apply to the application to the electric field detector. Hence, similar materials and structures already developed for the TCO-based modulators is used to achieve the 4-5 times higher field strength and still maintain the required high frequency response of greater than 1 GHz.

High Frequency Response with TCO

In one embodiment, the TCO bridge electrodes together with the electro-optic waveguide core is modeled as a RC circuit, in which the TCO layers 361 and 362 are modeled as two resistors R and the electro-optic region 350 is modeled as a capacitor.

Since the device length is short, compared with the wavelength of the electric field (λ=c/f=30 cm when f=1 GHz), the frequency response is mainly RC limited.

FIG. 8 shows the equivalent RC circuit and the extracted frequency response near 1 GHz range. In the RC circuit model R=$d_{TC}$/(σ$W_{EO}$ΔL) and C=∈$_{TC}W_{EO}$ΔL/$d_{EO}$. From the curves shown in FIG. 9, it can be seen that the frequency response near 1 GHz region is quite flat, which means the sensitivity of the TCO enhanced micro-antenna does not change when the frequency is below 1 GHz.

EXAMPLE 3

GaAs Based EO Waveguide Device

Figure 10:
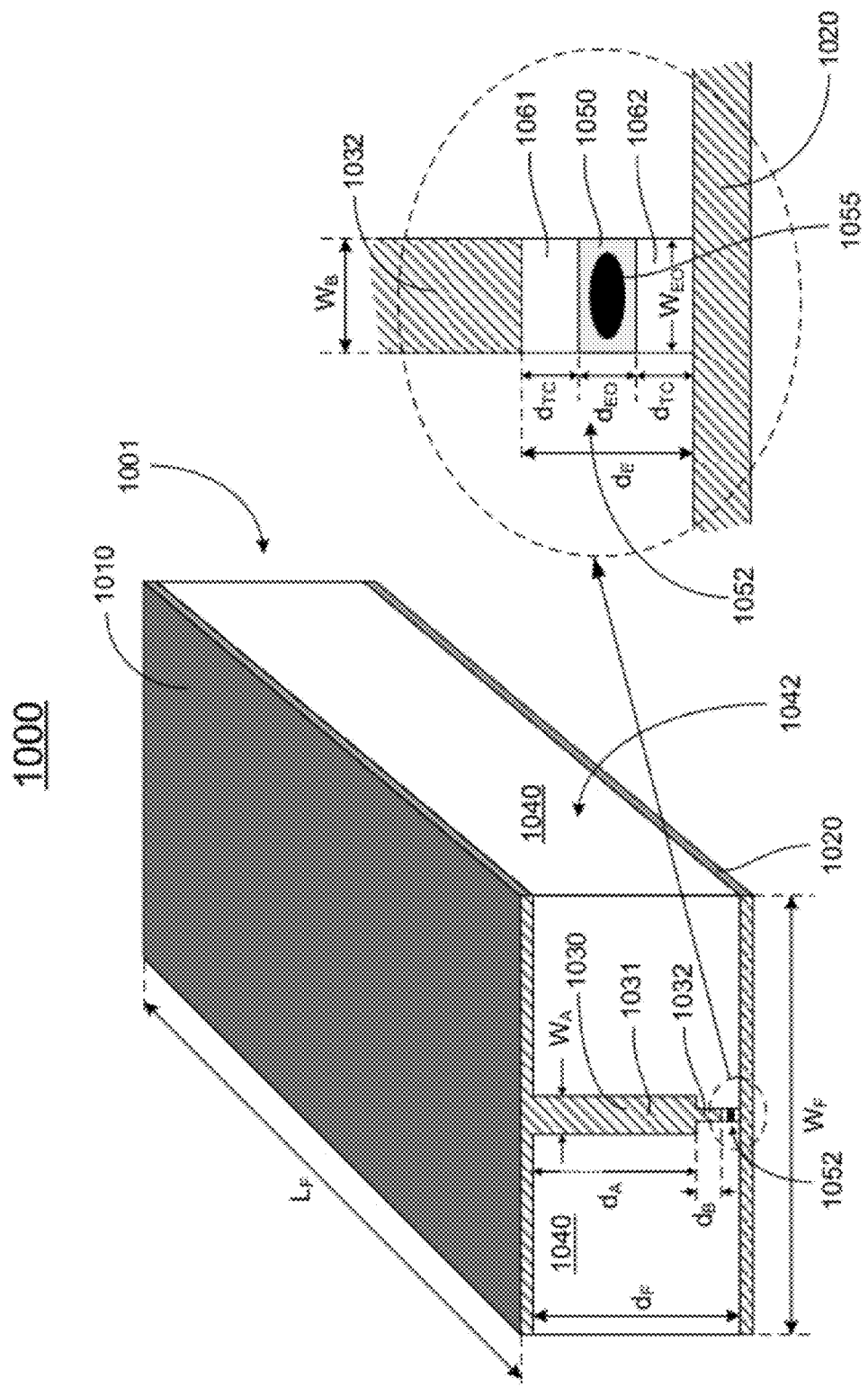
FIG. 10 shows schematically the structure of a GaAs electro-optic waveguide enhanced by a T-shaped micro-antenna and TCO electrodes, according to one embodiment of the present invention.

Referring to FIG. 10, an electric field detection device 1000 is shown according to one embodiment of the present invention. The electric field detection device 1000 is similar to the electric field detection device 100 shown in FIG. 1. The electric field detection device 1000 includes a micro-antenna 1001. In the exemplary embodiment, the micro-antenna 1001 has a first electrically conductive plate 1010 and a second electrically conductive plate 1030 arranged parallel to each other and spaced apart by a distance, $d_F$, defining a first gap 1042 therebetween, and a third electrically conductive plate 1030 disposed in the first gap 1040 and vertically attached to and being in electrical contact with the first electrically conductive plate 1010 so as to define a second gap 1052 with a gap width, $d_E$, between the third electrically conductive plate 1030 and the second electrically conductive plate 1020. As such, the first electrically conductive plate 1010 and the third electrically conductive plate 1030 define a T-shape structure. In one embodiment, the first electrically conductive plate 1010 and the third electrically conductive plate 1030 are formed integrally.

The first and second electrically conductive plates 1010 and 1020 constitute a receiving part of the detection device 1000 for receiving an external electric field to be detected, and thus, are called the field receiving plates (F-RPs). The third electrically conductive plate 1030 is adapted for applying the electric field to the electro-optic waveguide 1050 and is called the EO-field applying plates (EOF-APs).

In one embodiment, each of the first and second electrically conductive plates 1010 and 1020 has a width $W_F$ and a length $L_F$. The third electrically conductive plate 1030 has a body portion 1031 having one end connected to the first electrically conductive plate 1010 and a tip portion 1032 extending from the other end of the body portion 1031 such that the second gap 1052 is defined between the tip portion 1032 and the second electrically conductive plate 1020. The third electrically conductive plate 1030 has a length that is the same as that of the first and second electrically conductive plate 1010. The body portion 1031 has a width $d_A$ and a thickness $W_A$. The tip portion 1032 has a width $d_B$ and a thickness $W_B$.

In one embodiment, each of the first to third electrically conductive plates 1010, 1020 and 1030 is formed of an electrically conductive material such as a metal.

The electric field detection device 1000 also has an electro-optic waveguide structure 1050 formed in the second gap 1052. The electro-optic waveguide structure 1050 has a width $W_{EO}$ that is equal to the thickness $W_B$ of the tip portion 1032 of the third electrically conductive plates 1030 and a height $d_{EO}$, as shown in FIG. 10. The electro-optic waveguide structure 1050 is formed of a material of groups III-V of the periodic table. In one example, the electro-optic waveguide structure 1050 is formed of GaAs. Additionally, the electro-optic waveguide structure 1050 may have quantum-wells (QWs) or quantum-dots (QDs) 1055 formed therein.

In the exemplary embodiment, a low-refractive-index top cladding layer 1061 is formed between the tip portion 1032 of the third electrically conductive plate 1030 and the electro-optic waveguide structure 1050 and a low-refractive-index bottom cladding layer 1062 is formed between the electro-optic waveguide structure 1050 and the second electrically conductive plate 1020 in the second gap 1052. Each of the top and bottom cladding layers 1061 and 1062 has a height $d_{TC}$ and a width that is the same as width $W_{EO}$ of the electro-optic waveguide structure 1050. In one embodiment, these claddings layers 1061 and 1062 are electrically non-conductive. In another embodiment, the claddings layers 1061 and 1062 are electrically conductive, for example, formed of a transparent-conducting oxide (TCO) material. The GaAs electro-optic property imposes a phase shift on the TE-polarized (with polarization parallel to the substrate plane) propagating beam under the influence of an applied electric field.

The remaining portion of the first gap 1042 defined between the first and second electrically conductive plates 1010 and 1020 is filled with a dielectric material (dielectric layer) 1040 having a dielectric constant, ∈$_F$.

In one embodiment, the waveguide structure 1050 formed of GaAs with a refractive index of $n_{GaAs}$=3.5, a height (thickness) $d_{EO}$ of 0.3 μm, and a width $W_{EO}$ of 0.5 μm, and surrounded on both sides by a low refractive index polymer 1040 with a refractive index n<1.5 is used as a single-mode strongly-guiding waveguide to guide the optical beam. In one embodiment, the top and bottom cladding layers 1061 and 1062 are formed of a TCO material, with the height $d_{TC}$=0.5 μm and the width equal to $W_{EO}$=0.5 μm. The TCO layers 1061 and 1062 are fabricated using a self-aligned process as discussed in detail below. The TCO material has a low refractive index of n=1.7 but can act as a conducting material with low optical loss.

In one embodiment, the micro-antenna 1001 is fabricated on the top of the top-TCO layer of the GaAs waveguide. The EO-field applying plates (EOF-APs) of the micro-antenna have a top-plate width $W_{EO}$ of about 0.6 μm. As described below, the placement of such a structure on the top of the 0.5 μm-wide TCO can be done within 50 nm alignment accuracy using E-Beam lithography or stepper photolithography. Such an E-beam pattern realignment is routinely performed for nanophotonic device fabrications so it can be comfortably achieved.

Figure 11:
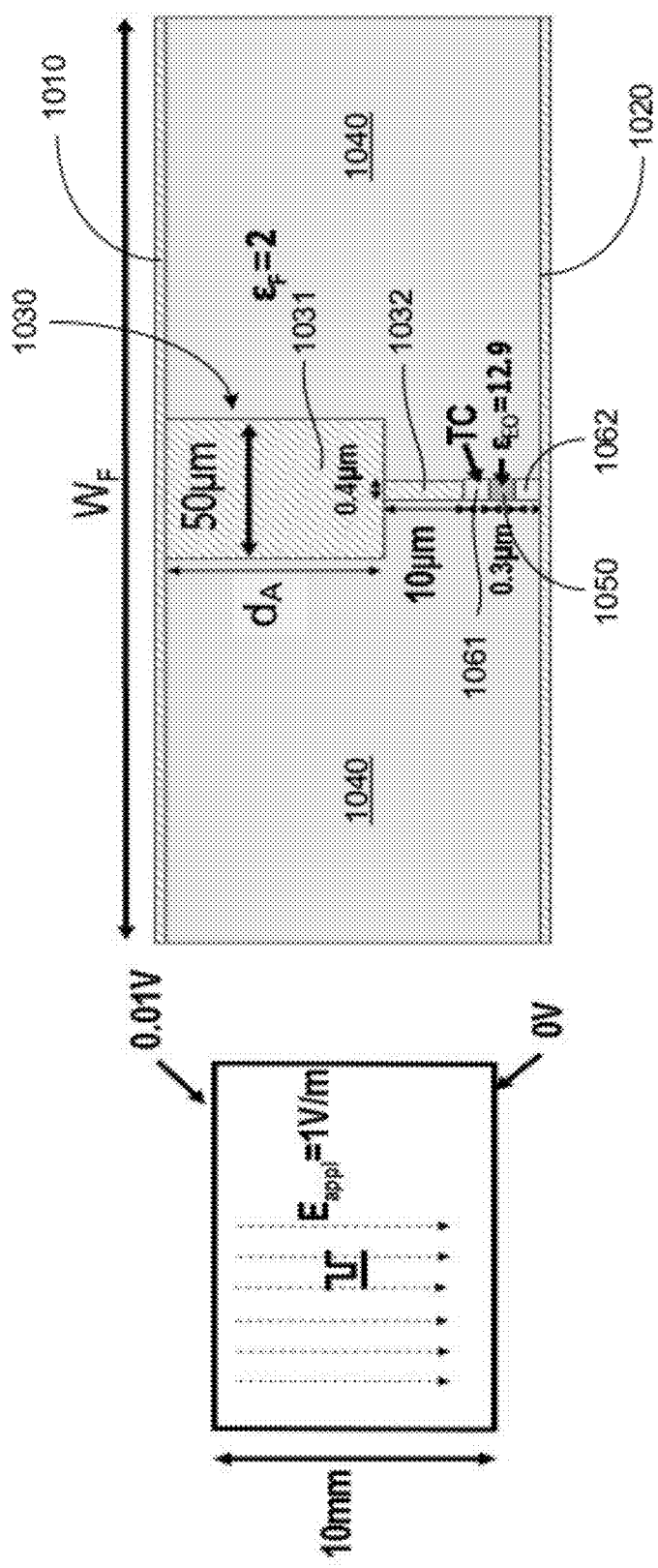
FIG. 11 shows schematically the structure of a micro-antenna enhanced GaAs electro-optic waveguide with TCO cladding, according to one embodiment of the present invention.
Figure 12:
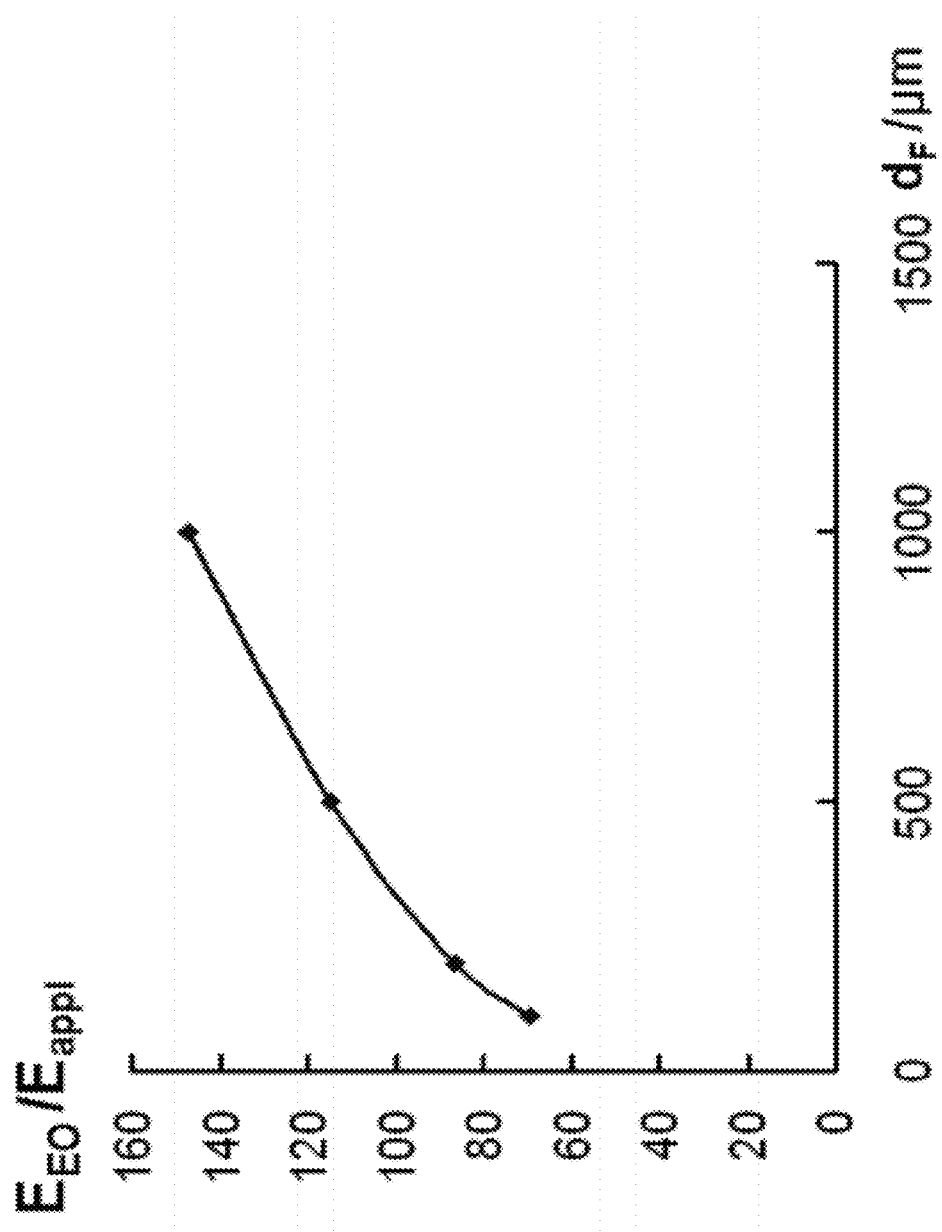
FIG. 12 shows the results of numerical simulations of the enhancement factor for the GaAs electro-optic waveguide shown in FIG. 11, according to one embodiment of the present invention.
Figure 13:
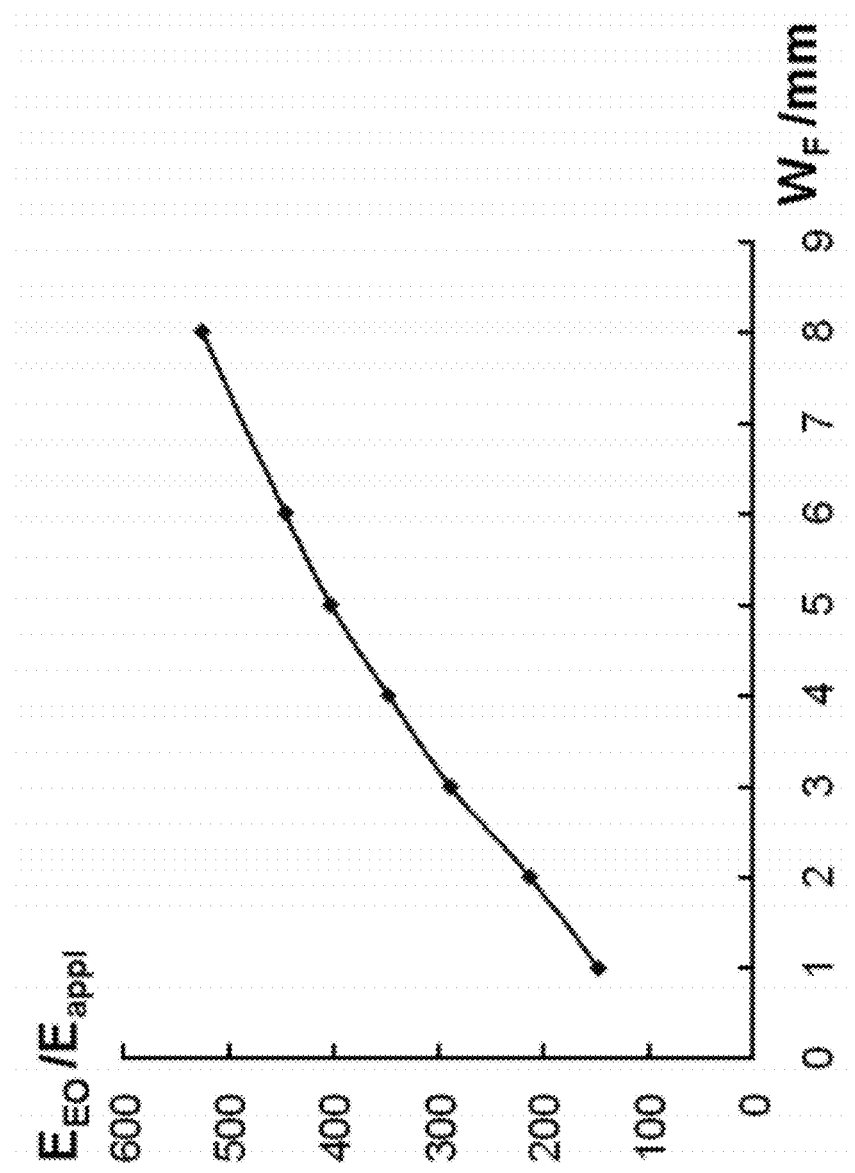
FIG. 13 shows the results of numerical simulations of the enhancement factor for the GaAs electro-optic waveguide shown in FIG. 11, according to one embodiment of the present invention.

Referring now to FIGS. 11-13, the micro-antenna 1001 has a vertically connected metallic plate 1030 of about 1 mm high ($d_A$). Its top is electrically connected to the first (top) plate 1010 with the width $W_F$ that forms the top plate 1010 of the pair of field receiving plates (F-RPs). In order to achieve the high electric field only the width of the tip 1032 (i.e., $W_{EO}$) has to be narrow as it determines the $C_{EO}$, which is made low comparing to $C_F$ of the large parallel plates 1010 and 1020. Thus, it is only required that the vertically connected metallic plate 1030 to have a narrow (tip) width $W_{EO}$ of 0.6 μm for the length $d_B$ of 3-5 μm. This has a structural width-to-height aspect ratio of less than 1:10, which can be easily fabricated using the standard nano-fabrication technique. The width $W_A$ of the vertically connected metallic plate is enlarged to 50 μm for ease of fabricating a $d_A$=1 mm high structure. This structure has a width-to-height aspect ratio of less than 1:20 and is quite manageable to fabricate.

Figure 14:
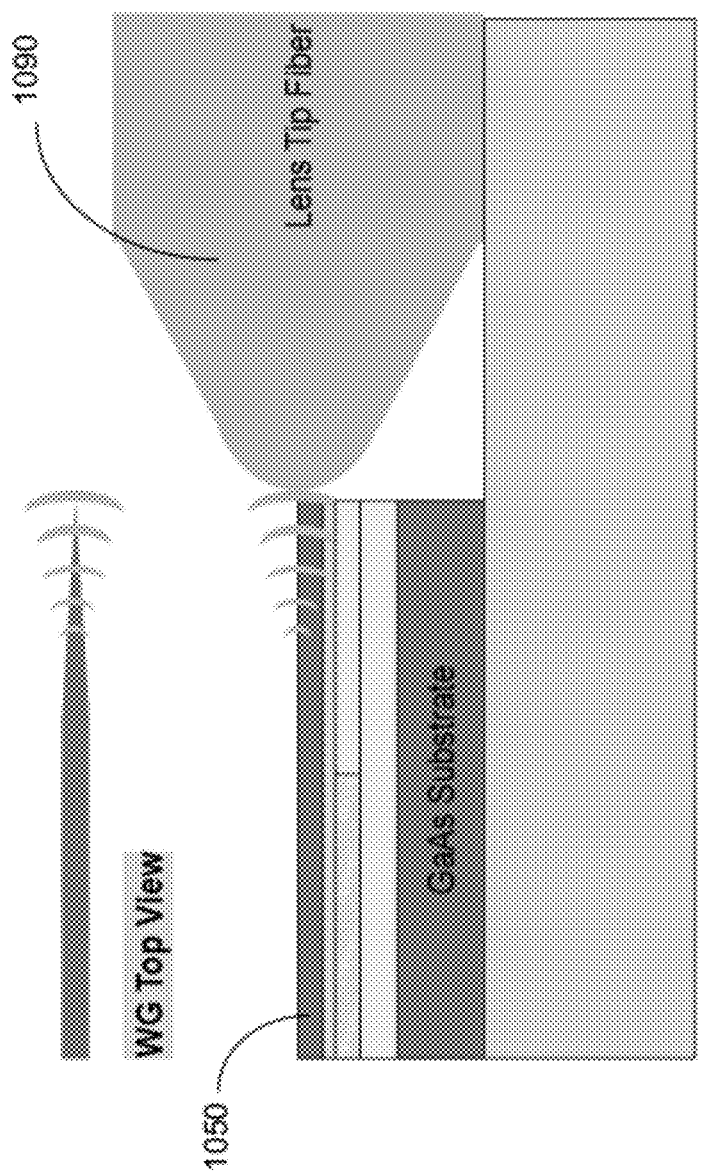
FIG. 14 shows schematically a coupling scheme using a down-tapered waveguide and an optical fiber with a lens tip according to one embodiment of the present invention.
Figure 15:
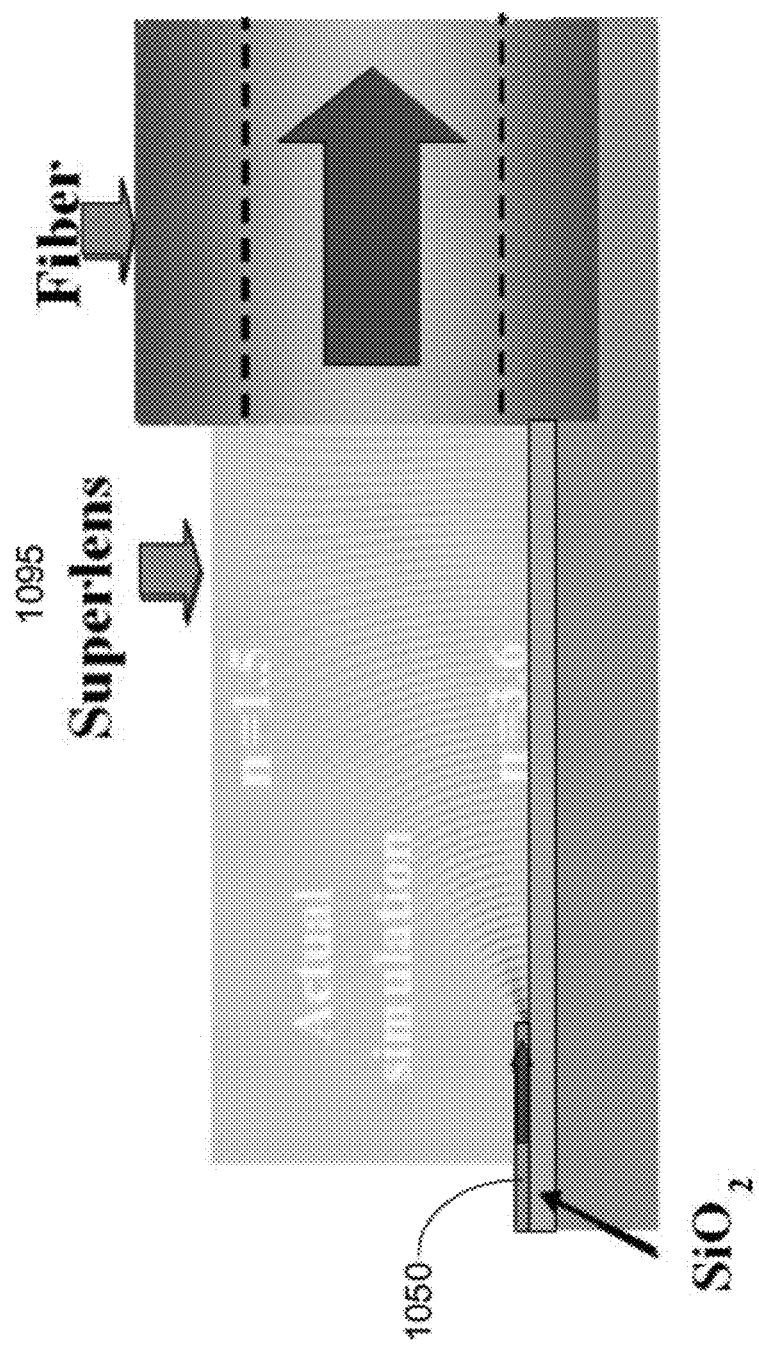
FIG. 15 shows schematically a coupling scheme between a waveguide and an optical fiber by using a miniature integrated super-high NA gradient-index (GRIN) lens according to one embodiment of the present invention.

At the output end, the optical mode is enlarged using a down-taper structure that tapers to a small pointed tip, as shown in FIG. 14. When the width $W_{EO}$ of the dielectric waveguide 1050 is narrower than half a wavelength in the material, the optical mode actually becomes larger enabling coupling of 30-50% into an optical fiber 1090. This is shown in FIG. 14. Alternatively, a unique beam enlarger based on a miniature integrated super-high NA GRIN lens (referred as "super-GRIN lens") has been developed. The super-GRIN lens 1095 has a micro-lens size of only 15 μm in height by 20 μm in length and width as shown in FIG. 15. The GRIN structure 1095 has a graded refractive index that can be realized using two alternating material layers (referred as the dual material approach). A preliminary version of the lens has been successfully realized on silicon substrate. In one embodiment, the lens is fabricated on the GaAs waveguide using standard multi-layer deposition technique for optical coating such as that used for DWDM filter. The lens efficiently enlarges the optical mode size to match the mode size of optical fiber. The super-GRIN lens 1095 is better than down taper as it does not need lens tip fiber and can use the typical cleaved fiber. It has much less stringent alignment tolerance. It enables higher coupling efficiency of >70% and much easier fiber alignment and device packaging.

Figure 16A:
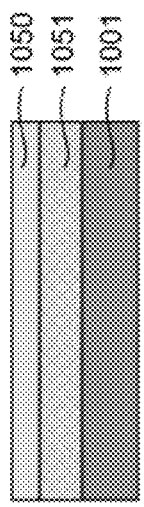
FIG. 16A-16O show schematically a fabrication process of a micro-antenna and TCO enhanced GaAs electro-optic waveguide according to one embodiment of the present invention.
Figure 16B:
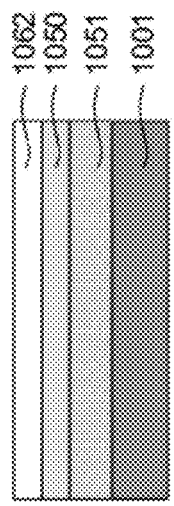
Figure 16C:
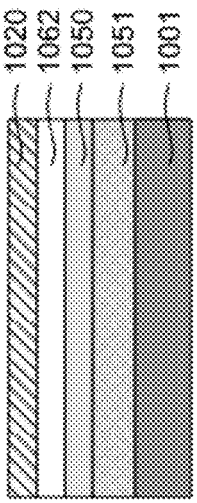
Figure 16D:
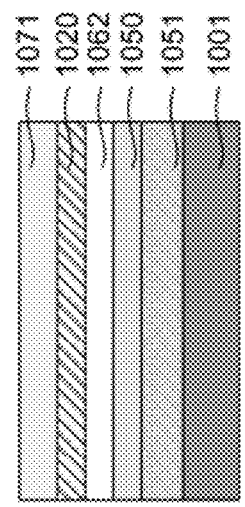
Figure 16E:
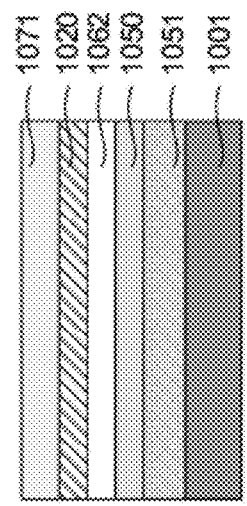
Figure 16F:
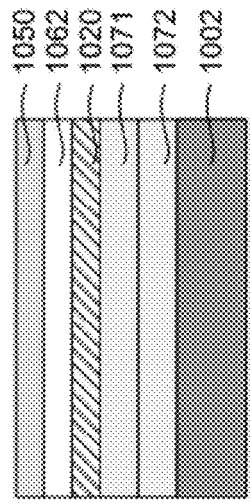
Figure 16G:
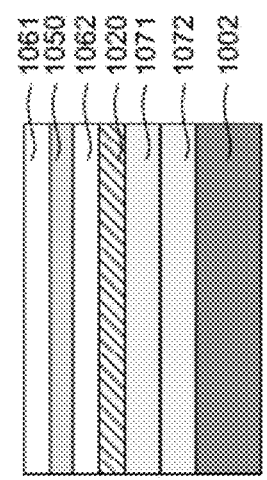
Figure 16H:
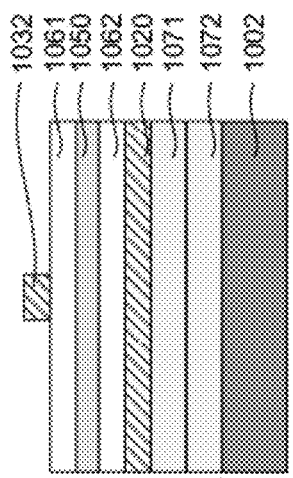
Figure 16I:
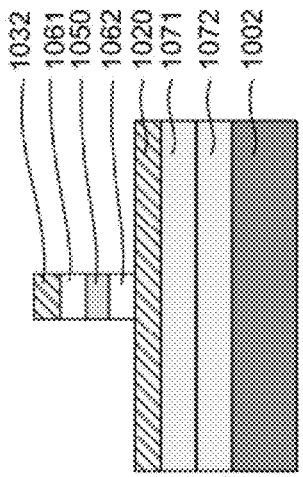
Figure 16J:
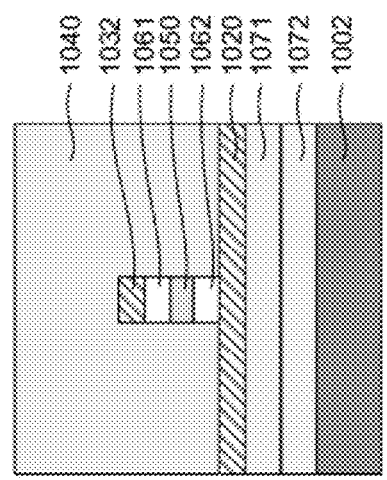
Figure 16K:
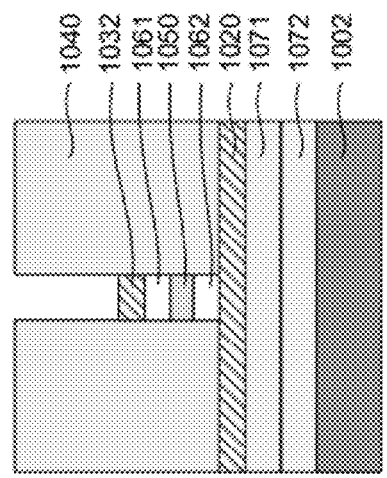
Figure 16L:
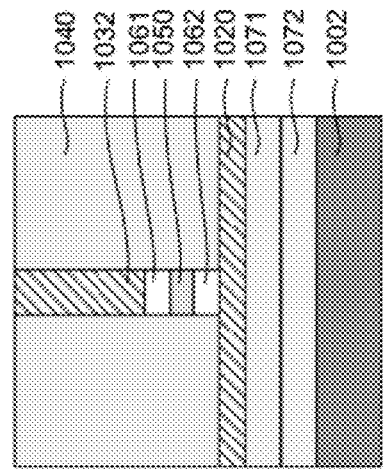
Figure 16O:
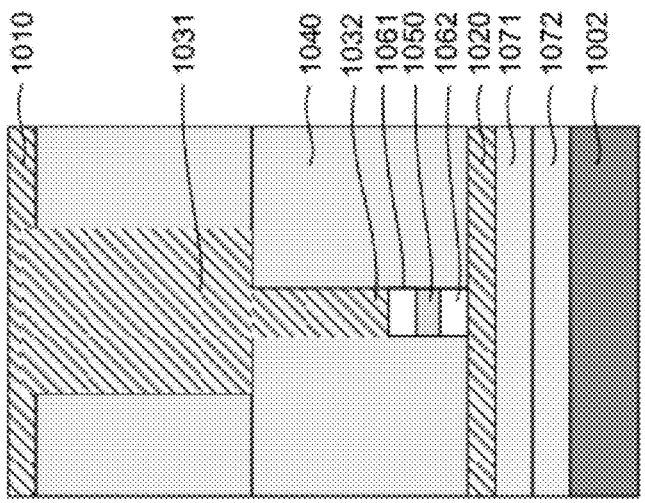
Figure 16N:
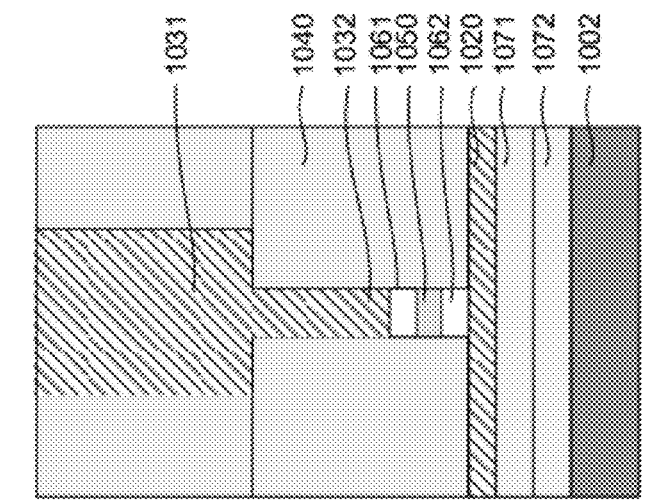

A process for fabricating an epi-layer structure including a GaAs/AlGaAs layer structure is shown in FIGS. 16A-16O, according to one embodiment of the present invention. A 1 μm-thick $Al_{0.6}Ga_{0.4}As$ structure 1051 is grown on a GaAs substrate 1001 followed by a thin 0.3 μm-thick top GaAs layer 1050, as shown in FIG. 16A. Through a wafer-bonding and etched-back process, the 0.3 μm-thick top GaAs layer 1050 is fabricated to form the GaAs electro-optic waveguide 1050 of the GaAs based electric field detector. First, a 0.3 μm-thick TCO layer 1062 is deposited on the GaAs layer 1050 as the bottom transparent conductive cladding layer 1062, as shown in FIG. 16B. The bottom metal layer 1020 (such as gold, aluminum, etc.) is then deposited on the top of the TCO layer 1062 as the bottom metallic plate 1020 of the T shape structure, as shown in FIG. 16C.

Figure 16M:
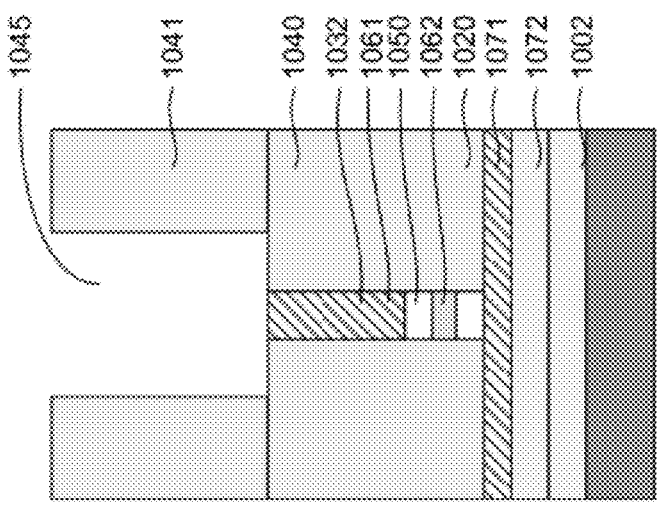

A layer 1071 of BCB is then spin-coated on the bottom metallic plate 1020 as the wafer bonding material, as shown in FIG. 16D. The substrate 1001 is then bonded with another substrate 1002 (called transfer substrate, typically also formed of GaAs) with a BCB layer 1072 on it, as shown in FIG. 16E. When the two wafers are bonded together, the original substrate 1001 is thinned down by polishing it till the 1 μm-thick $Al_{0.6}Ga_{0.4}As$ layer 1051 is exposed. Selective wet etching using HF then completely removes the $Al_{0.6}Ga_{0.4}As$ layer 1051, resulting in the thin 0.3 μm-thick GaAs layer 1050 on the TCO layer 1062, as shown in FIG. 16E. Below the TCO layer 1062 is the metal layer 1020, followed by the BCB layer 1071. Another 0.3 μm-thick TCO layer 1061 is deposited on the GaAs layer 1050 as the top transparent conductive cladding layer, as shown in FIG. 16G. A metal etch-mask with 0.3 μm width is then formed by e-beam lithography, as shown in FIG. 16H. The metal mask is used as a dry-etching mask to etch through the two TCO layers and the GaAs layer, as shown in FIG. 16I. A 5 μm-thick CYTOP 1040 is then spin coated to cover the etched structure and then a 0.3 μm wide window is opened above the GaAs/TCO waveguide, as shown in FIGS. 16J and 16K Electro-plating fills the 0.3 μm wide, 5 μm high trench to form a narrow metal tip 1032, as shown in FIG. 16L. A 1 mm-thick CYTOP layer 1041 is casted on the top of the wafer, and a 50 μm window 1045 is opened above the narrow tip 1032 and a second electroplating form the wider metal portion 1031, which is connected with the narrower tip 1032, as shown in FIGS. 16M and 16 N. Finally a 1 mm wide metal layer 1010 is deposited on the top of the structure as the top plate 1010 for the T-shape structure, as shown in FIG. 16O.

EXAMPLE 4

Organic Material Based EO Waveguide Device

Figure 17:
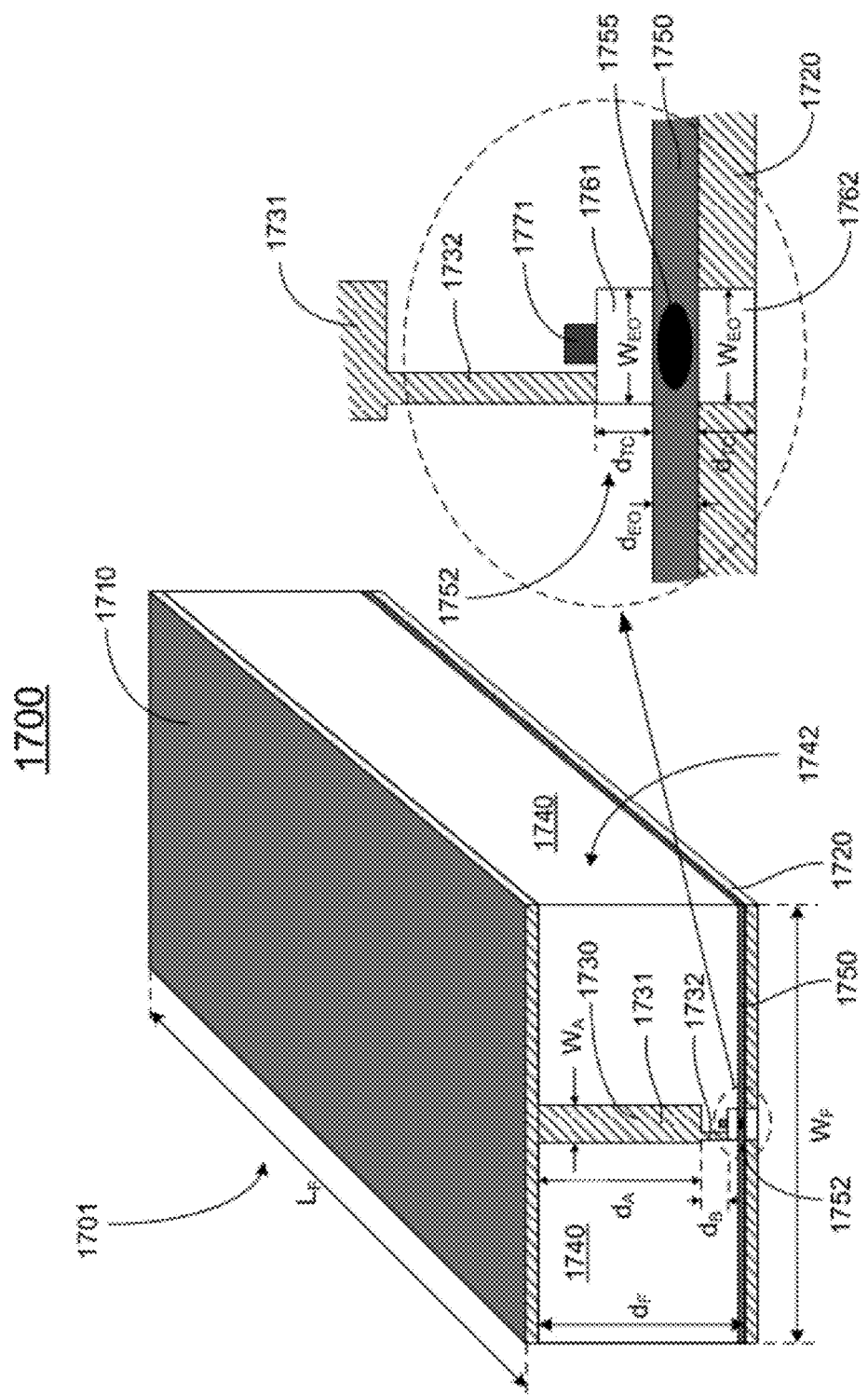
FIG. 17 shows schematically the structure of a micro-antenna and TCO enhanced organic electro-optic waveguide according to one embodiment of the present invention.

Referring to FIG. 17, an electric field detection device 1700 is shown according to one embodiment of the present invention. The electric field detection device 1700 is similar to the electric field detection device 1000 shown in FIG. 10, except that the device 1700 utilizes an organic electro-optic material to achieve the required electric field induced optical phase shift. The organic based structure has the potential advantage of low fabrication cost and larger beam size enabling reasonable coupling to be achieved without using mode-size enlarger. The recently engineered organic electro-optic materials with $r_{33}$ of 150 pm/V opens up the possibility of further increase its sensitivity once the organic-EO based structure is demonstrated. In one embodiment, molecularly self-assembled organic electro-optic material is used. The molecularly self-assembled organic electro-optic material has been proven to be highly robust. There are, among other things, advantages including (a) it does not need poling; (b) it can withstand high laser power of greater than 100 mW in the waveguide; (c) it has no pin holes and no poling that could produce them so it is very suitable for the application; (d) its optical loss is lower than 1 dB/cm; (e) it can withstand high temperature of greater than 200° C.; (f) electro-optic modulators that demonstrated the above advantages have been made; (g) its $r_{33}$ can be engineered to a higher value in later generation.

As shown in FIG. 17, the electric field detection device 1700 includes a micro-antenna 1701. In the embodiment, the micro-antenna 1701 has a first electrically conductive plate 1710 and a second electrically conductive plate 1730 arranged parallel to each other and spaced apart by a distance, $d_F$, defining a first gap 1742 therebetween, and a third electrically conductive plate 1730 disposed in the first gap 1740 and vertically attached to and being in electrical contact with the first electrically conductive plate 1710 so as to define a second gap 1752 with a gap width, $d_E$, between the third electrically conductive plate 1730 and the second electrically conductive plate 1720. As such, the first electrically conductive plate 1710 and the third electrically conductive plate 1730 define a T-shape structure. In one embodiment, the first electrically conductive plate 1710 and the third electrically conductive plate 1730 are formed integrally.

Each of the first and second electrically conductive plates 1710 and 1720 has a width $W_F$ and a length $L_F$. The third electrically conductive plate 1730 has a body portion 1731 having one end connected to the first electrically conductive plate 1710 and a tip portion 1732 extending from the other end of the body portion 1731 such that the second gap 1752 is defined between the tip portion 1732 and the second electrically conductive plate 1720. In one embodiment, each of the first to third electrically conductive plates 1710, 1720 and 1730 is formed of an electrically conductive material such as a metal. The third electrically conductive plate 1730 has a length that is the same as that of the first and second electrically conductive plate 1710. The body portion 1731 has a width $d_A$ and a thickness $W_A$. The tip portion 1732 has a width $d_B$ and a thickness $W_B$.

In one embodiment, each of the first to third electrically conductive plates 1010, 1020 and 1030 is formed of an electrically conductive material such as a metal. The first and second electrically conductive plates 1710 and 1720 constitute a receiving part of the detection device 1700 for receiving an external electric field to be detected, and thus, are called the field receiving plates (F-RPs). The third electrically conductive plate 1730 is adapted for applying the electric field to the electro-optic waveguide 1750 and is called the EO-field applying plates (EOF-APs).

The electric field detection device 1700 also has an electro-optic waveguide structure 1750 formed in the second gap 1752. The electro-optic waveguide structure 1750 has a width $W_{EO}$ that is equal to the thickness $W_B$ of the tip portion 1732 of the third electrically conductive plates 1730 and a height $d_{EO}$, as shown in FIG. 17.

In the exemplary embodiment, a low-refractive-index top cladding layer 1761 is formed between the tip portion 1732 of the third electrically conductive plate 1730 and the electro-optic waveguide structure 1750 and a low-refractive-index bottom cladding layer 1762 is formed between the electro-optic waveguide structure 1750 and the second electrically conductive plate 1720 in the second gap 1752. Each of the top and bottom cladding layers 1761 and 1762 has a height $d_{TC}$ and a width that is the same as width $W_{EO}$ of the electro-optic waveguide structure 1750. In one embodiment, these claddings layers 1761 and 1762 are electrically non-conductive. In another embodiment, the claddings layers 1761 and 1762 are electrically conductive, for example, formed of a transparent-conducting oxide (TCO) material. As shown in FIG. 17, the organic waveguide structure 1750 with a refractive index of $n_{org}$=1.65, a thickness of $d_{EO}$=1.5 μm, and a width of $W_{EO}$=2 μm, surrounded by a low refractive index polymer 1730 with a refractive index of n<1.5 (such as CYTOP™) is used as a single-mode waveguide 1750 to guide the optical beam by fabricating a ridge 1771 of about 2 μm wide formed by BCB material with a refractive index of $n_{BCB}$=1.6. The organic electro-optic property imposes a phase shift on the TM-polarized (with polarization perpendicular to the substrate plane) propagating beam under the influence of an applied electric field.

In one embodiment, the micro-antenna is fabricated on the top of the organic waveguide. The EO-field applying plates (EOF-APs) of the micro-antenna has two top-plates, one on the left and one on the right of the waveguiding region, each with a width of 1 μm (i.e. $W_{EO}$). The gap-space between the two top-plates is about 5 μm to avoid metal absorption for the optical beam. The voltage is conducted to the beam propagating region from these two top-plates via a short length TCO with a side-conduction geometry very similar to the TCO-based modulator structure. As described below, the placement of such metallic top-plate structure of 1 μm in width on top of the waveguide can be done within 50 nm alignment accuracy using e-beam lithography or stepper photolithography. Such e-beam pattern realignment is routinely performed so it can be comfortably achieved. The top plate is then connected to two vertically connected metallic plates with a narrow width of 1 μm for a length of 5 μm. These two 5 μm tall structures are then connected to another vertically connected metallic plate of about 1 mm high and 50 μm wide. Its top is then connected to a large parallel plate with width $W_F$ that forms the top plate of the pair of field receiving plates (F-RPs). In order to achieve the high electric field only the width of the tips (i.e. $W_{EO}$) have to be narrow as it determines the $C_{EO}$, which is low comparing to $C_F$ of the large parallel plates. It has a width-to-height aspect ratio of less than 1:10, which can be easily fabricated using the standard nano-fabrication technique. Above that, the width of the vertically connected metallic plate is enlarged to 50 μm for ease of fabricating a 1 mm high structure. Such structure has a width-to-height aspect ratio of less than 1:20 and shall be quite manageable to fabricate.

Figure 18I:
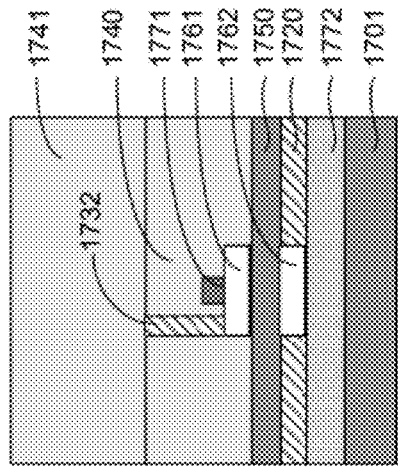
Figure 18H:
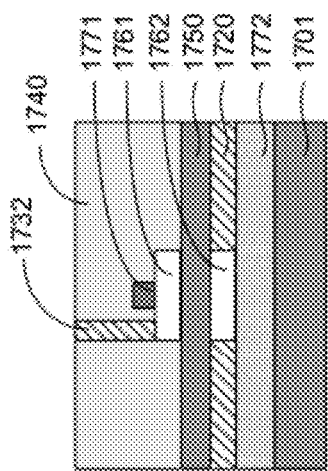
Figure 18K:
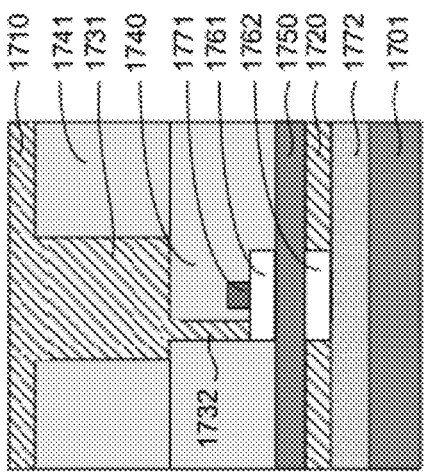
Figure 18G:
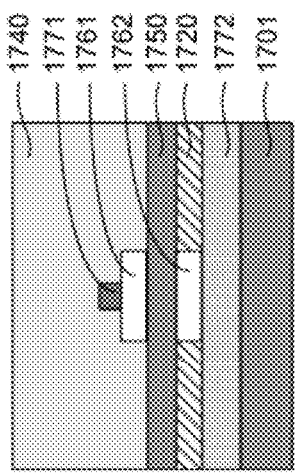
Figure 18J:
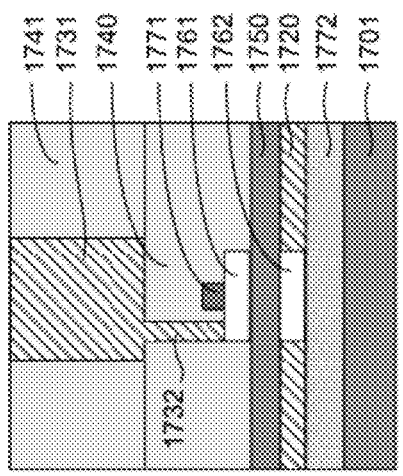

Referring also to FIGS. 18A-18K, the fabrication process of organic electro-optic material based E-Field detector is shown according to one embodiment of the present invention. At first, it starts from the substrate 1701 with a 0.3 μm thick bottom cladding layer (e.g. $SiO_2$ or BCB layer) 1772 on it, as shown in FIG. 18A. A metal layer 1720 is deposited on the bottom cladding layer 1772 and a 5 μm window 1721 is opened by photo lithography and wet etching, as shown in FIG. 18B. The bottom TC layer 1762 is then deposited to fill in the 5 μm window 1742 as the bottom TC layer 1762, as shown in FIG. 18C. A layer 1750 of an organic electro-optic material about 1 μm thick is spin coated or self-assembled on the top of the bottom electrode 1720 and 1762, as shown in FIG. 18D. Another TC layer 1761 which is also 5 μm wide is then patterned on the top of the electro-optic layer 1750, aligned with the bottom TCO electrode 1762, as shown in FIG. 18E. A BCB top cladding layer 1771 about 1 μm high and 1 μm wide is patterned on the top TC electrode 1761, in order to confine the optical mode laterally, as shown in FIG. 18F. A 5 μm thick CYTOP layer 1740 is spin coated to cover the whole structure, as shown in FIG. 18G and one 0.5 μm wide window is opened in order to fill in metal so that the parallel TC plates 1761 and 1762 connect with the wide metal tip 1732, as shown in FIG. 18H. After filling in the two 0.5 μm wide windows with metals like gold or aluminum by electroplating, another 1 mm CYTOP layer 1741 is coated on the structure, as shown in FIG. 18I. A 50 μm wide window is then opened and filled in with a metal material by electro-plating to form a wide metal tip 1731, as shown in FIG. 18J. Finally, a metal layer 1710 is deposited on the top as the top plate 1710 of the T shape structure, as shown in FIG. 18K.

EXAMPLE 5

Figure 19:
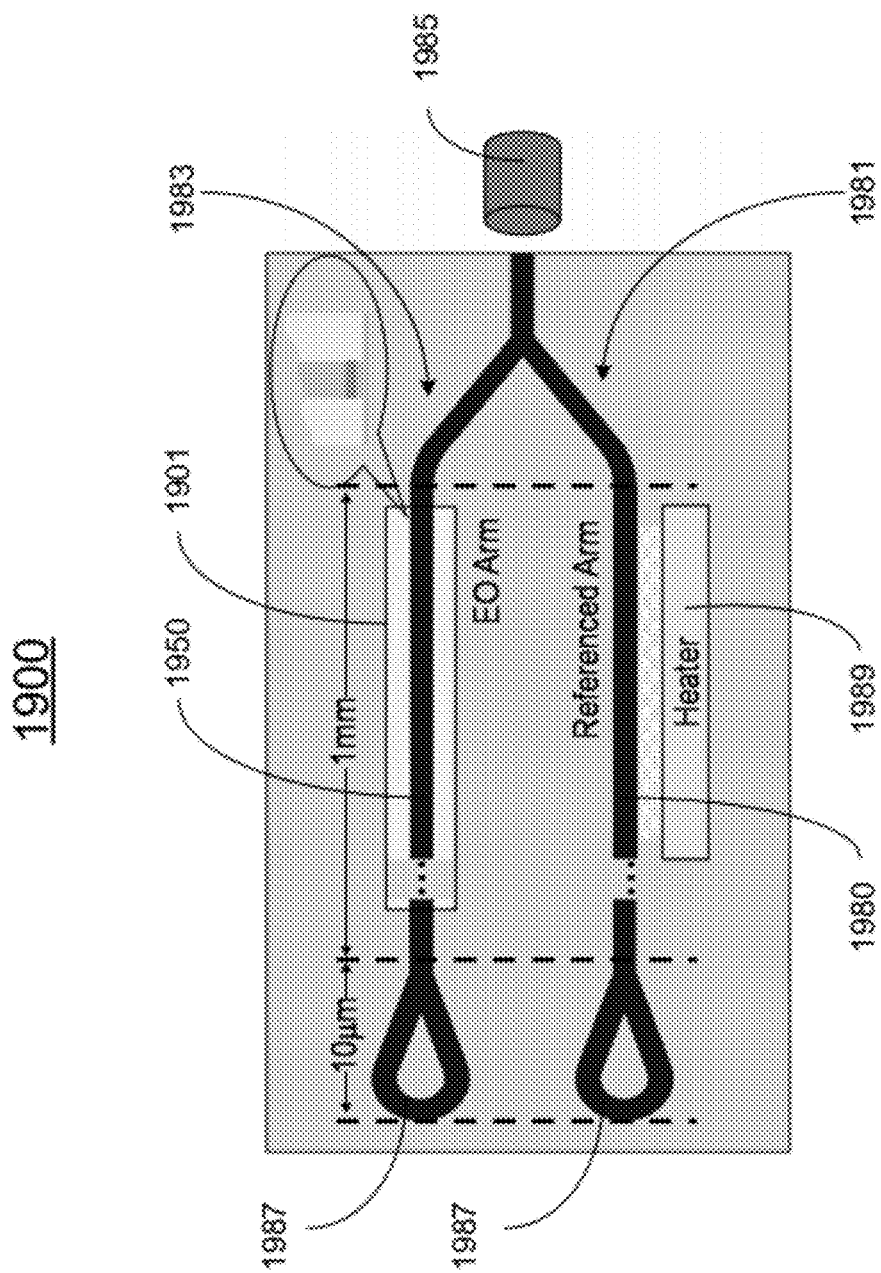
FIG. 19 shows schematically a Mach Zehnder interferometer structure for the electric field detector according to one embodiment of the present invention.

Mach-Zehnder Structure and Multiple Passing Scheme via Resonator and Retro-Reflector Referring to FIG. 19, this example shows a complete Mach Zehnder structure 1900 common to both the GaAs and organic based EO-waveguide electric field detection device. To form the Mach Zehnder interferometer structure 1900, from the top view, the micro-antenna 1901 is actually placed on only one (active) arm 1983 of the Mach Zehender interferometer structure 1900. An input beam splitter (a Y-junction) splits the beam by 50:50 to two GaAs waveguides 1950 and 1980. One waveguide 1950 goes under the micro-antenna 1901 and is called the electro-optic (active) arm 1983, while the other waveguide 1980 does not and is called the referenced arm 1981. To ease the manufacturing process, a reflector 1987 is placed at the end of the waveguides 1950 and 1980 so the split beams are retro-reflected back and recombined at the input Y-junction that now acts as the output combiner of the Mach Zehnder interferometer 1900. The return beam is then coupled back into the same input optical fiber and can be split out using a beam circulator.

The optical path-length of the reference arm 1981 is fabricated to be $\lambda/8$ longer than the electro-optic arm 1983 so that over the round trip it gains a $\lambda/4$ optical path-length difference before combining with the beam from the electro-optic arm 1983. This enables the default operating point to be at the linear slope of the Mach-Zehnder interferometer response curve. A resistive heater 1989 is fabricated very near the reference arm, which enables an electrical tuning of the relative phase shift between the reference arm 1981 and the electro-optic arm 1983 if needed. If the fabrication process can be fined tuned, or the phase difference can be tuned in advance using laser to physically chisel the waveguide width, such heating element may not be needed.

As shown in FIG. 19, the retro reflection is achieved by fabricating a micro-loop mirror 1987 or with the use of a metallic coating. Such a micro-loop mirror based high-reflector 1987 has been successfully fabricated for an InP based micro-loop mirror laser. The loop needs only a length of less than 20 µm and hence can be very compact and low loss.

Figure 20:
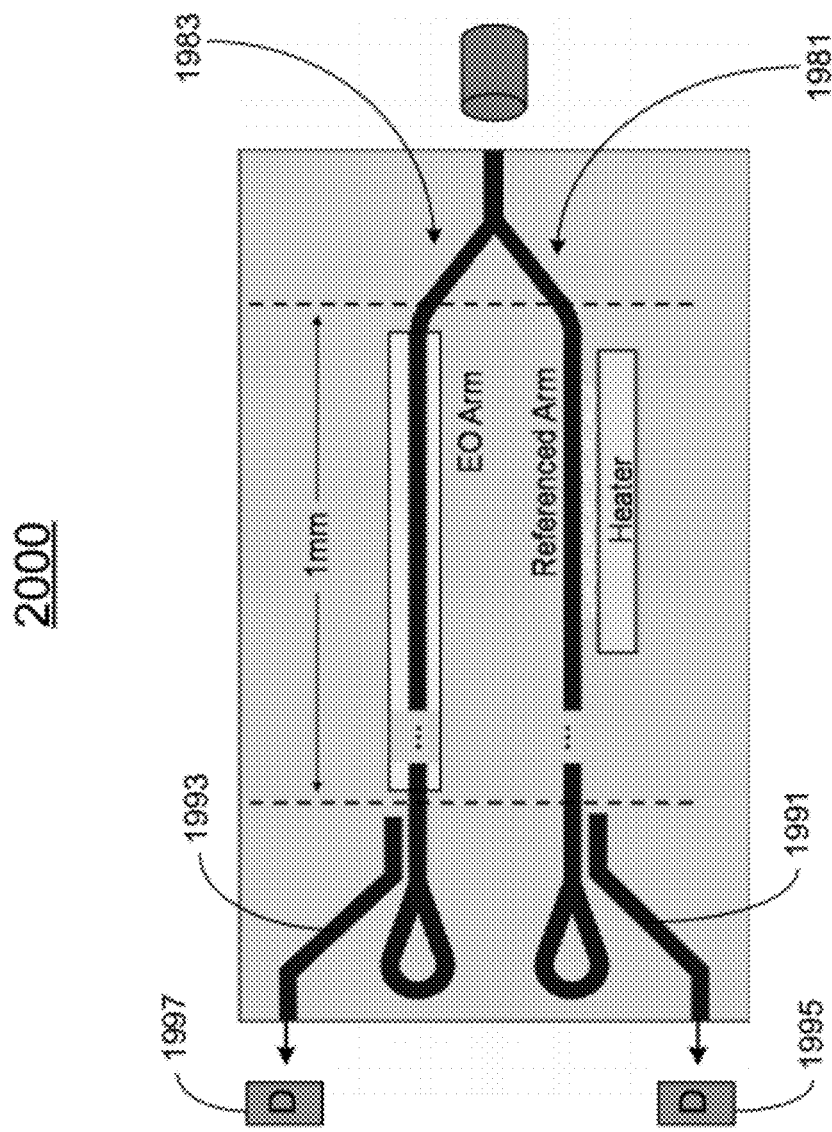
FIG. 20 shows schematically a Mach Zehnder interferometer structure having two coupling waveguides each of which being disposed near a respective retro reflector, according to one embodiment of the present invention.

FIG. 20 shows another embodiment of a Mach Zehnder structure 2000 according to the present invention. In addition to the setup of the Mach Zehnder structure 1900, shown in FIG. 19, the Mach Zehnder structure 2000 further has a coupling waveguide 1991 at close to the retro reflector of the reference arm 1981, which is used to couple about 1% of the light energy emitted out from the back of the reference arm 1981. A small 100 µm-large photodetector chip 1995 is mounted close to the output spot of the waveguide 1991 so as to measure the optical power in the reference arm 1981. Likewise, the Mach Zehnder structure 2000 also has a coupling waveguide 1993 at close to the retro reflector of the electro-optic arm 1983 and coupled to a 100 µm-large external photodetector chip 1997 to measure the optical power in the electro-optic arm 1981. Such a power detection aids in coupling the beam output from a lens-tip optical fiber into the input waveguide. They can also be used to help to diagnose the device 2000 operations such as checking on the 50:50 power splitting.

Figure 21:
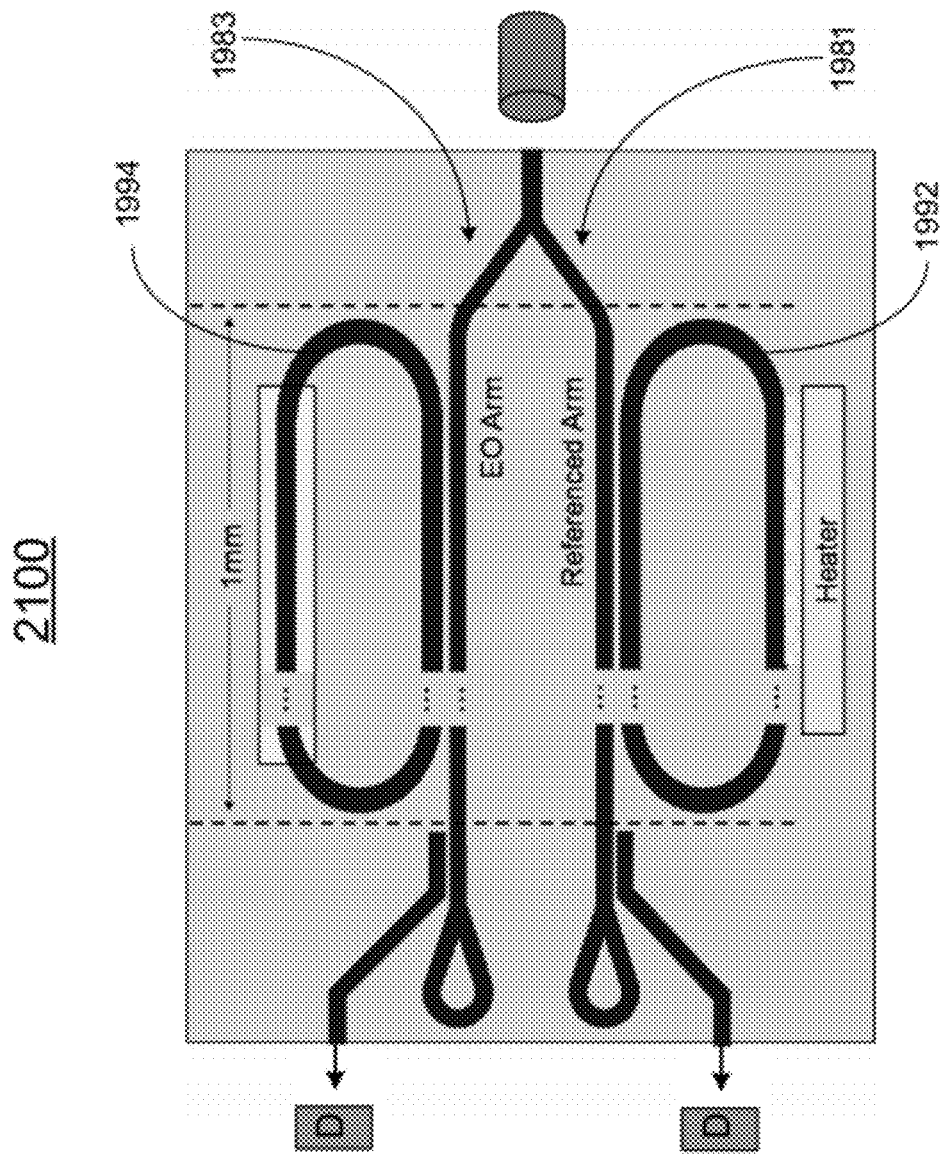
FIG. 21 shows schematically a Mach Zehnder interferometer structure with two optical ring resonators each of which being coupled to a respective arm of the interferometer, according to one embodiment of the present invention.

In one embodiment, the length of the waveguide 1991/1993 is about 5 mm, which gives a long interaction length to achieve the phase-shift needed to reach the performance parameters listed under Embodiment I in Table 1. To achieve the performance parameters listed under Embodiment II in Table 1, the waveguide length is reduced to 1 mm. In order to gain the interaction length back, the waveguide 1991/1993 is integrated with a ring resonator (resonant cavity) 1992/1994 that has a diameter of around 1 mm, as shown in FIG. 21. The resonator 1992/1994 is designed to achieve the appropriate Finesse to optimize its performance depending on the optical loss of the waveguide fabricated.

In one embodiment, the cavity coupling strength is designed so that the effective number of round trips in the cavity 1992/1994 gives a total optical path length is a few times shorter than the optical loss length given by the inverse of the optical loss coefficient ($\alpha$). This operates the resonator at the under damped region, making it acting like a good phase shifter without too much amplitude change at the optical resonance. Such a resonator based phase-shifter 2100 is shown in FIG. 21. It gives a 5 times more increase in sensitivity (depending on the waveguide loss coefficient) when the straight waveguide is only 1 mm long.

Usually, an ideal lossless ring resonator with a single coupling waveguide always transmits 100% of the optical power but at on-resonance, the energy in the ring resonators interfere with the laser beam that goes straight through to result in a $\pi$ phase shift compared to the beam that is tuned off resonance. So the optical phase at the output of this waveguide goes from zero to $\pi$ from below the resonance frequency to on resonance then go to $2\pi$ when tuned to above the resonance frequency. Thus, a frequency shift of the resonator translates to a phase shifting of the optical beam when it is at the resonance frequency. With two coupling waveguides, the ring resonator becomes an intensity modulator if the beam is sit at the slop of the resonance. However, such an intensity resonance configuration is sensitive to a laser frequency or phase noise that can have large 1/f behavior at low frequency. Thus, the intensity resonance configuration does not work if one wants the electric field detector to be sensitive at down to 0.5 Hz. The phase shifting configuration with two balanced arms (i.e. with the same resonator at the reference arm) enables one to have equal-path-length interference that makes the beam output insensitive to the laser frequency or phase noise. Hence, to meet the low frequency 0.5 Hz specification, it is essential to use the phase resonance configuration for the resonator together with the equal-arm Mach Zehnder inteferometer to convert phase shift to intensity change.

EXAMPLE 6

Molecularly Self-Assembled EO Materials Engineering for Electric Field Sensors

Figure 22:
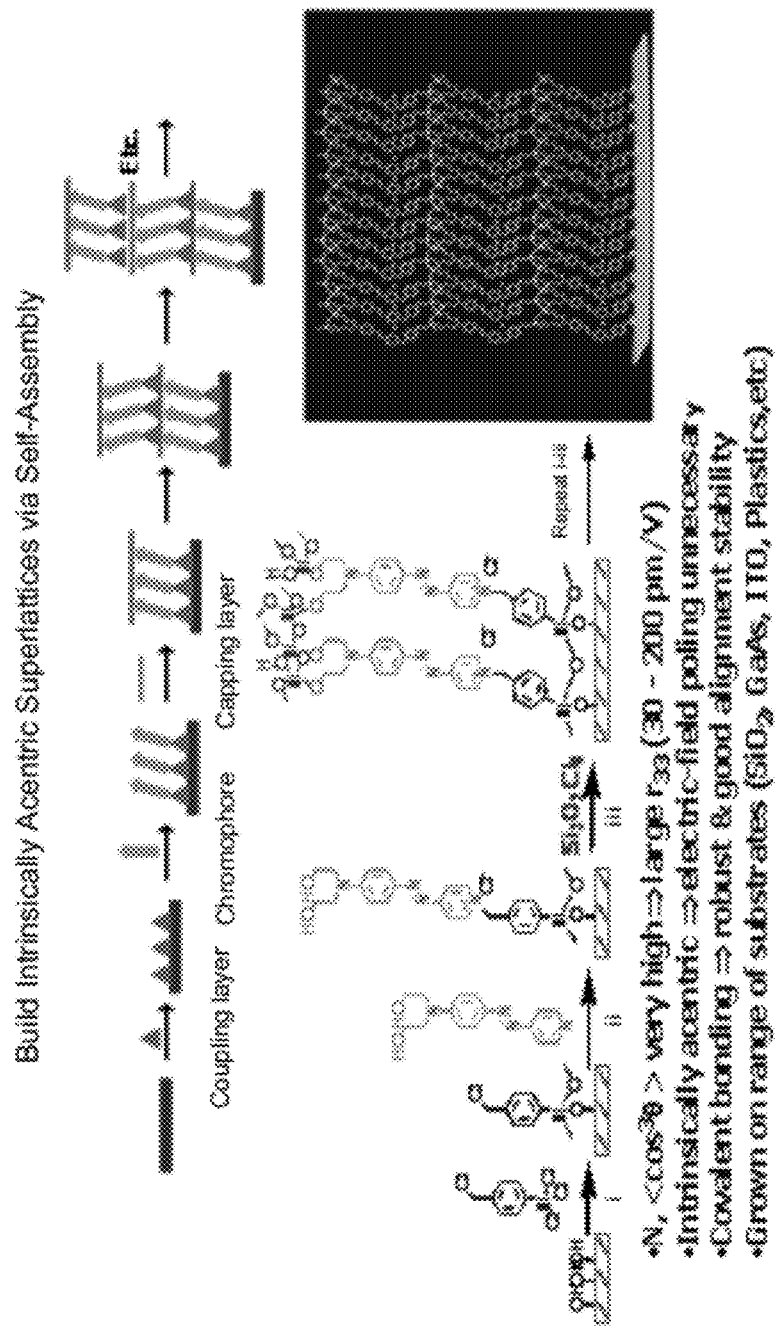
FIG. 22 shows schematically a process of forming high-response self-assembled superlattices (SASs) of an organic electro-optic material according to one embodiment of the present invention.
Figure 23:
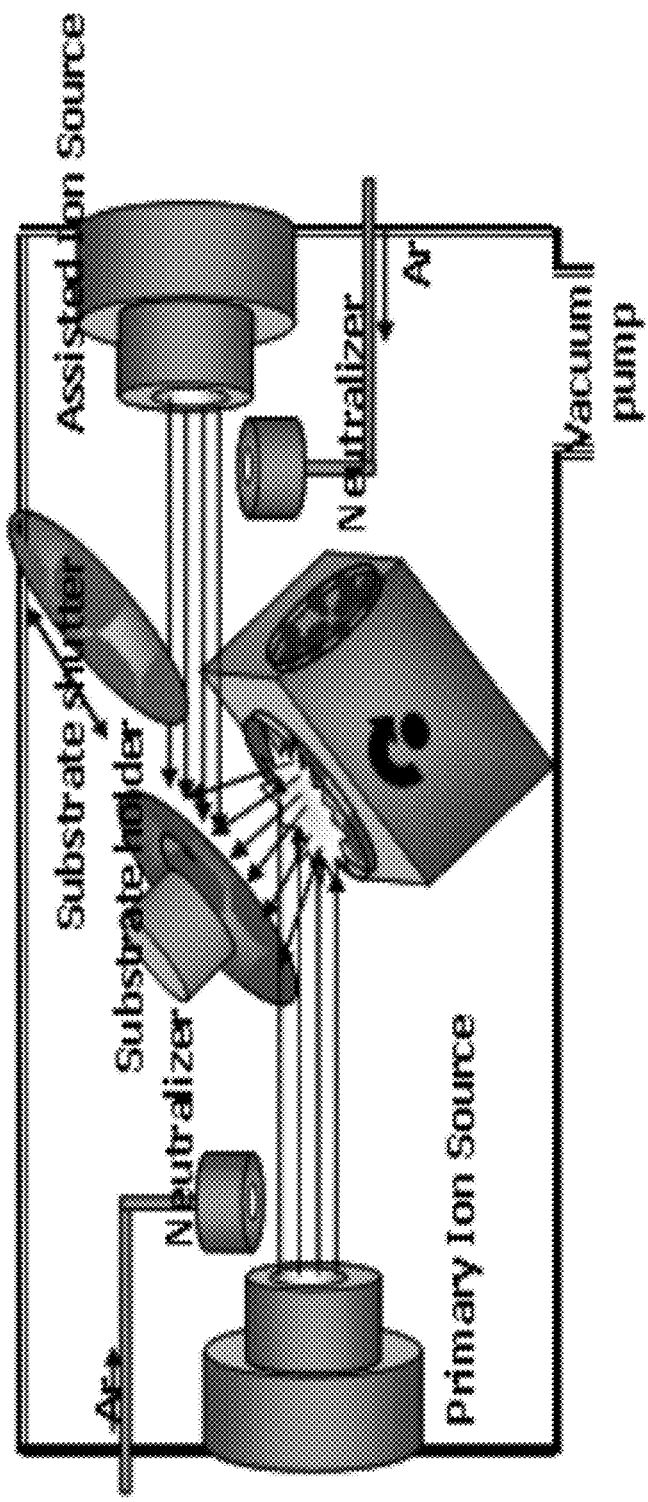
FIG. 23 shows schematically the setup of an ion-assisted deposition (IAD) tool for growing TCO films according to one embodiment of the present invention.

A new class of high-performance molecular electro-optic materials has been developed at Northwester University which is intrinsically acentric (no electric field poling is required) and can be applied to virtually any surface as a thermally/chemically robust, conformal coating by solution phase self-assembly techniques. The fabrication process uses successive layer-by-layer organosilane self-assembly reactions to build up structurally well-defined low-loss superlattices with the electro-optic coefficient $r_{33}$ about 65 pm/V, as shown in FIG. 22. These materials are stable to 350° C. in air, are radiation-hard, and are impervious to common organic solvents. In one embodiment, such materials are used to coat the surfaces of the electric field sensor(s) disclosed herein.

EXAMPLE 7

Transparent Conducting Oxide Materials Engineering for Electric Field Sensors

Transparent conducting oxides (TCOs) are degenerately doped metal oxide n-type semiconductors with large band gaps for excellent optical transparency in the visible range. TCO conductivity can be tuned to as high as 17,000 S/cm by tuning the carrier density through adding other ions as dopants or by creating oxygen vacancies. TCOs have found extensive commercial use in photovoltaic cells, flat-panel displays, and smart windows, and are a well-established technology. In one embodiment of the present invention, ion-assisted deposition (IAD) is used for TCO film growth. IAD utilizes two beams, a deposition beam which impinges on a rotating target of exactly known composition (FIG. 23) and an assist beam which continuously bathes the growing film in a second ion flux. For TCO films, the net result is excellent control of film dopant level, conductivity, optical absorption characteristics, densification, adhesion, and surface morphology at temperatures as low as room temperature. At Northwester University, the available IAD tool is located in a clean room and has precision control of $O_2$ partial pressure, growth and assist beam ion energies, and sample temperature. It has been used to grow excellent quality films of Sn-doped $In_2O_3$, $In_2O_3$, ZnO, NiO, and other TCOs on a variety of substrates, including $Si/SiO_2$ and plastic. Depending on the desired electrical and optical properties, these TCO films have been used as electrodes in ultra-low $V\pi$ electro-optic modulators, as high-mobility semiconductors in thin-film transistors, as hole extracting/-electron blocking layers in high-efficiency photovoltaic cells, and as electrodes for flexible organic light-emitting diodes. In the present invention, TCO films, beginning with $In_2O_3$ are grown as described in previous sections with conductivity and optical characteristics tuned to meet the specifications.

EXAMPLE 8

Optical Carrier Power Reduction Scheme

Figure 24:
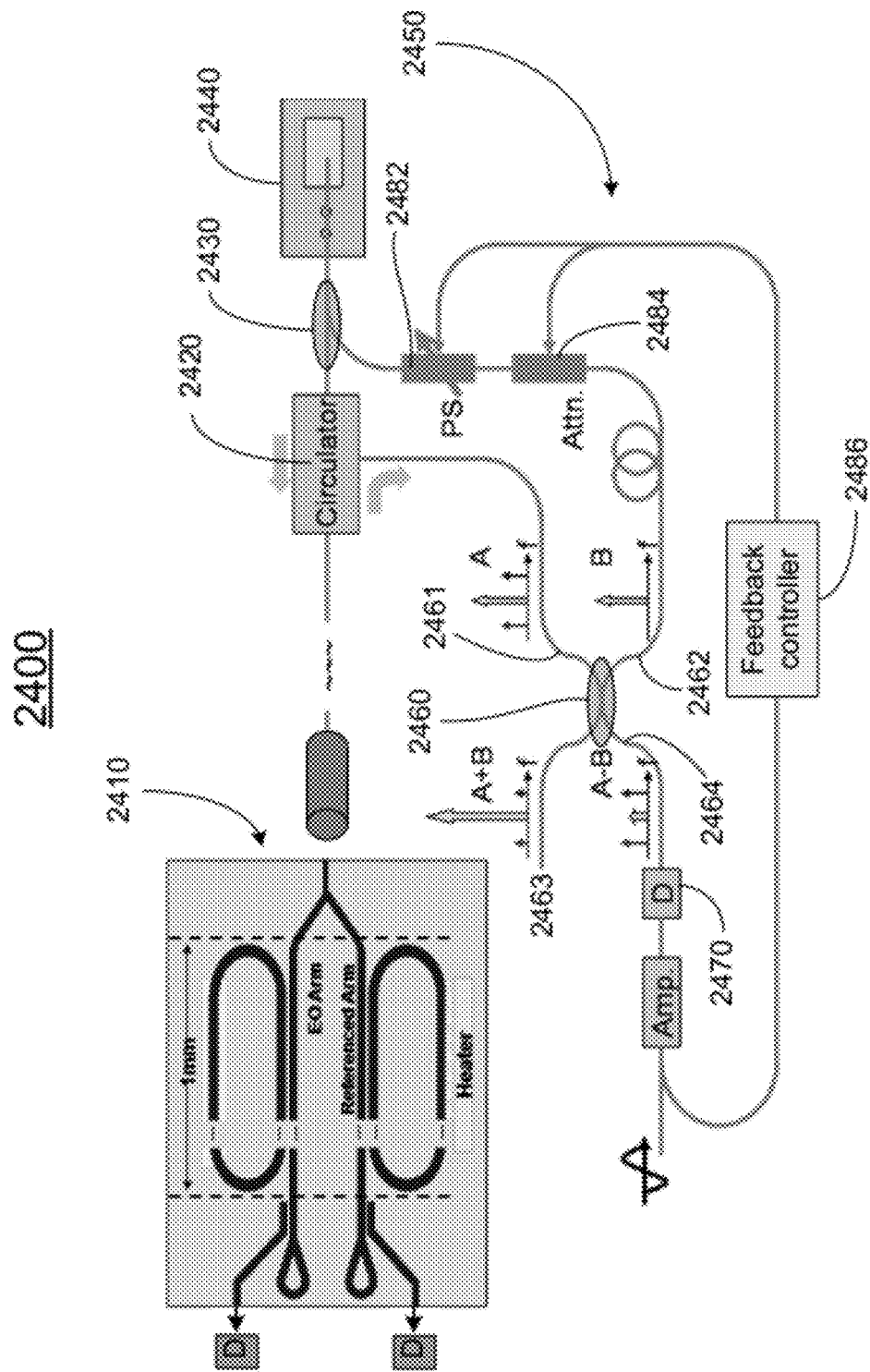
FIG. 24 shows schematically an electric field detection system employing a signal boost method via carrier-suppression/post-amplification and multipass according to one embodiment of the present invention.

In one embodiment of the present invention, an optical carrier power reduction scheme is employed to bring the high 10 mW-100 mW in-device optical carrier power down to 1 mW to achieve a 10-100 times increase in sensitivity of the electric field detection. This reduction is done after the beam passes through the electric field detection device and converted to the amplitude modulation. As shown in FIG. 24, the return beam is taken out via an optical circulator and goes to a fiber-based 50:50 beam splitter or coupler. The return beam has a high carrier power carries the amplitude modulation from the electric field detector.

FIG. 24 shows an electric field detection system 2400 according to one embodiment of the present invention. The electric field detection system 2400 has an electric field detection device 2410 that is the same as the detection device 2100 of FIG. 21 in the exemplary embodiment. Other embodiments of the electric field detection devices disclosed above according to the present invention can also be used. The electric field detection system 2400 also has an optical circulator 2420 having a first port configured to receive an input light beam, a second port configured to transmit the input light beam to and to receive an output light beam from the electric field detection device 2410, and a third port configured to transmit the output light beam received from the electric field detection device 2410 to a light detection system 2450.

The electric field detection system 2400 further has a first beam splitter 2430 having an input port configured to receive a source light beam from a light source 2440, a first output port configured to transmit a first part of the source light beam to the first port of the optical circulator 2420, and a second output port configured to transmit a second part of the source light beam to the light detection system 2450.

The light detection system 2450 has a second beam splitter 2460 having a first input port 2461 configured to receive the output light beam transmitted from the third port of the optical circulator 2420, a second input port 2462 configured to receive the second part of the source light beam transmitted from the second output port of the first beam splitter 2430, a first output port 2463 configured to output an enhanced light beam resulted from a constructive interference of the light beams received from the first and the second input ports 2461 and 2462 of the second beam splitter 2460, and a second output port 2464 configured to output a reduced light beam resulted from a destructive interference of the light beams received from the first and second input ports 2461 and 2462 of the second beam splitter 2460.

Additionally, the light detection system 2450 further includes a light detector 2470 configured to receive the light beam transmitted from the second output port 2464 of the second beam splitter 2460, a phase shifter 2482 and an optical attenuator 2484 coupled in series between the second output port of the first beam splitter 2430 and the second input port 2464 of the second beam splitter 2460, and a feedback controller 2486 coupled between the light detector 2470 and the phase shifter 2482 and between the light detector 2470 and the optical attenuator 2484, respectively.

As shown in FIG. 24, two (first and second) input ports 2461 and 2462 of the second beam splitter 2460 are labeled as input port A and input port B, respectively. Suppose the return beam goes to input port A. A portion of the original source laser beam that powers the electric field detector 2410 is split out and is introduced into input port B. As the carriers in port A and port B come from the same laser source, they can be made to interfere destructively at the A−B output port 2464 of the beam splitter and constructively at the A+B output port 2463. To ensure such interference, the beam that goes into port B is passed through an optical delay line so that it travels the same optical path length from the laser 2440 to Port B and the beam that goes from the laser 2440 to the electric field detector 2410 and back to Port A. Each of the A−B and A+B output ports has half the amplitude modulated side band power obtained from the beam at input port A. However, A−B port has much reduced carrier power. A phase shifter 2482 and attenuator 2484 allow the amplitude and phase control of the beam that goes to port B. By shifting the phase of port B beam, the carrier power level at the A−B output port can be controlled. These enable one to achieve an effective reduction of the optical carrier power and retain the strong amplitude modulated side band.

The beam at output port A−B is then sent to a sensitive 1 GHz photodetector 2470 to measure the amplitude modulated signal. The optical carrier power at A−B is reduced to about 1 mW so that it does not saturate the photodetector 2470. In fact the DC output from the photodetector 2470 can be used to feedback to control the phase shifter to maintain the carrier power level. The feedback-loop shall be designed to be slower than 0.5 Hz so as not to affect the signal being detected.

As the optical carrier reduction is be achieved by using optical interference technique with matched optical path lengths, it makes the resultant beam insensitive to laser frequency noise. Intensity stabilized laser and intensity noise cancellation scheme involving dual detectors could be used to further reduce the low-frequency noise and enable electric field detection down to 0.5 Hz.

EXAMPLE 9

Packaging of a Single Electric-Field Detection Device

Figure 25:
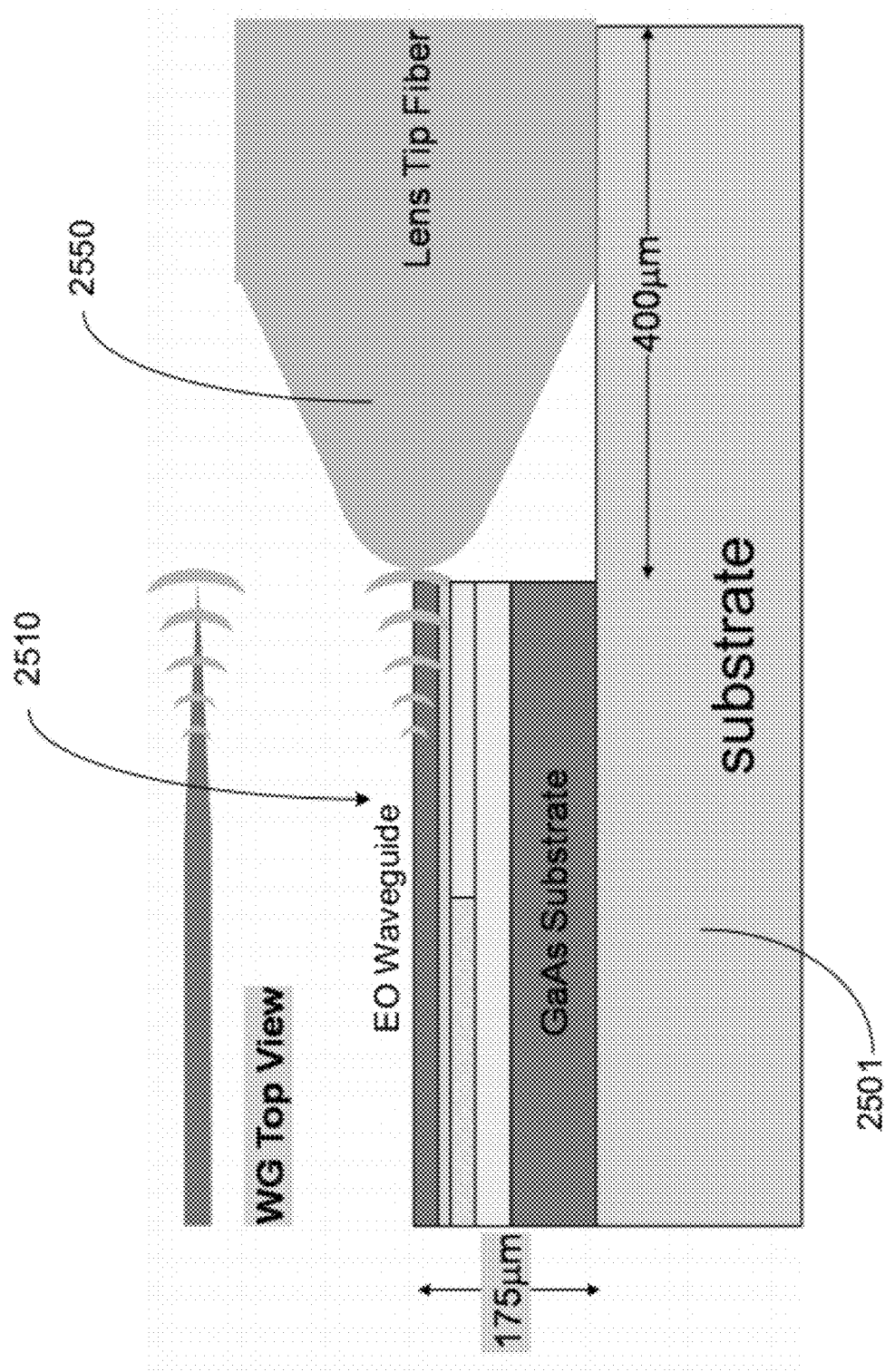
FIG. 25 shows schematically a coupling scheme using a down-tapered waveguide and an optical fiber with a lens tip according to one embodiment of the present invention.

In one embodiment, as shown in FIG. 25, to enable ease in fiber mounting, a slightly larger substrate 2501 is provided so that the extended edge of the substrate 2501 is etched down about 175 µm. The edge has an extended length of about 400 µm, which gives enough room to epoxy down the lens-tip fiber 2550 after alignment. For a waveguide down taper, a lens-tip fiber 2550 is used for coupling light from the fiber to the down taper. The intensity monitoring of light from the retro-reflector end of the detection derive (chip) 2510 utilizes a waveguide coupler to split out 1% of the light and emit it towards the back-end of the chip. This enables one to measure the light power inside the waveguide, which is useful for aligning the fiber to the chip.

Figure 26:
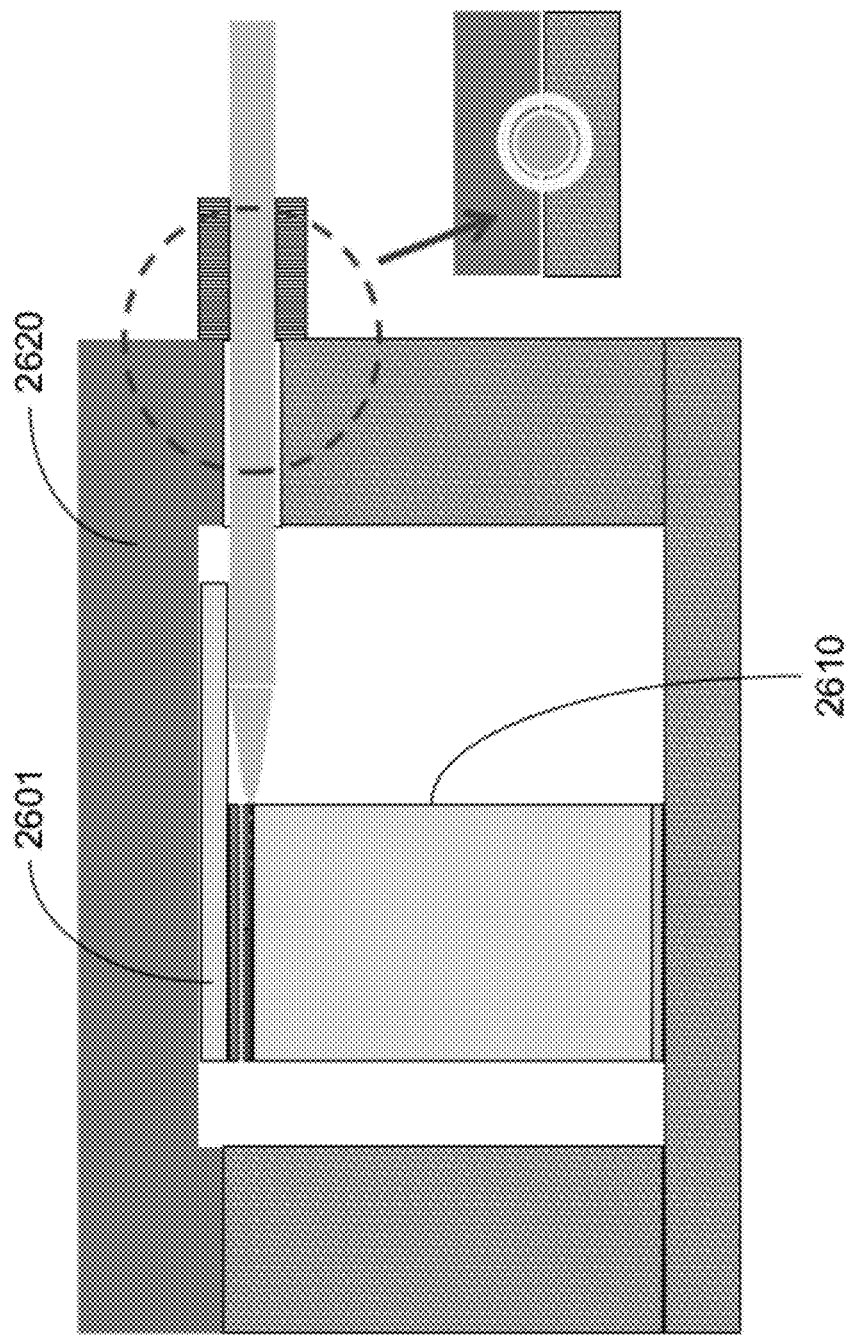
FIG. 26 shows schematically the packaging of a single electric field detection device according to one embodiment of the present invention.

In another embodiment, the reflected power returning from the retro-reflector 2610 is used to monitor the return power after the circulation. The entire fiber coupled chip 2610 is mounted into a ceramic substrate 2601. The fiber mounted chip 2610 is turned upside-down into a ceramic miniature can 2620, as shown in FIG. 26.

EXAMPLE 10

5×5 Array Realization with Hybrid and Monolithic (DWDM) Approach

Figure 27:
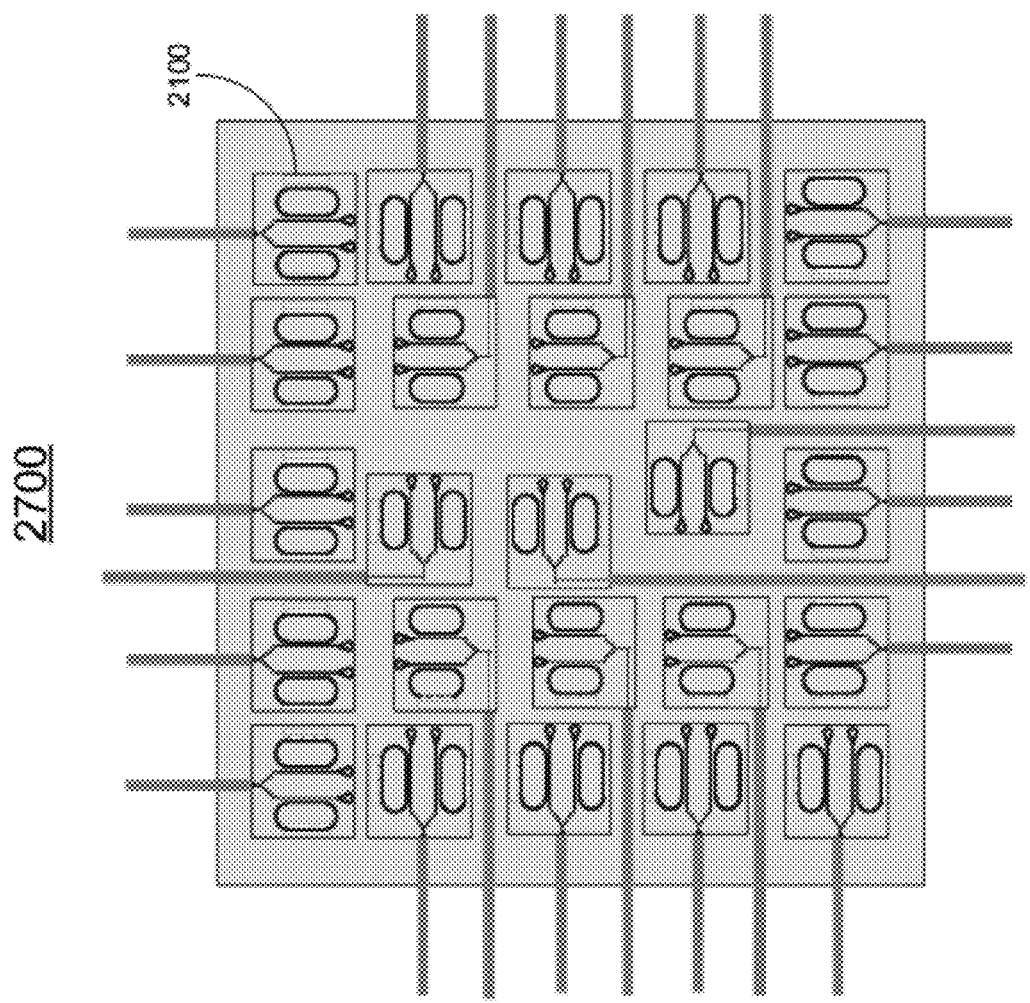
FIG. 27 shows schematically a 5×5 electric field detector array realized by individual device mounting management according to one embodiment of the present invention.

In one embodiment as shown in FIG. 27, an electric field detection module 2700 has 5×5 above-disclosed electric field detection devices 2710 arranged in an array. Other numbers of the electric field detection devices 2710 can also be used to practice the present invention. The electric field detection module also has a dense wavelength division multiplexer (DWDM) coupled to the plurality of electric field detection devices via an optical fiber and a gradient-index (GRIN) lens. The DWDM may include a diffraction grating.

For the array fabrication, two processes are provided: (a) a hybrid process involving the hybrid mounting of 25 chips (electric field detection devices) onto a single substrate, and (b) an monolithically integrated process involving on-chip wavelength division multiplexing of 25 wavelengths in which each wavelength is used for measuring a single detector.

In the process (a), the 25 detectors are fabricated individually and then mounted back onto a single substrate with appropriate fiber mounting management so the chip at the outer rim of the array has fiber connected to the center of the chip, as shown in FIG. 27 and the chip inside the array has fiber connected to the right or left edge of the chip.

Figure 28:
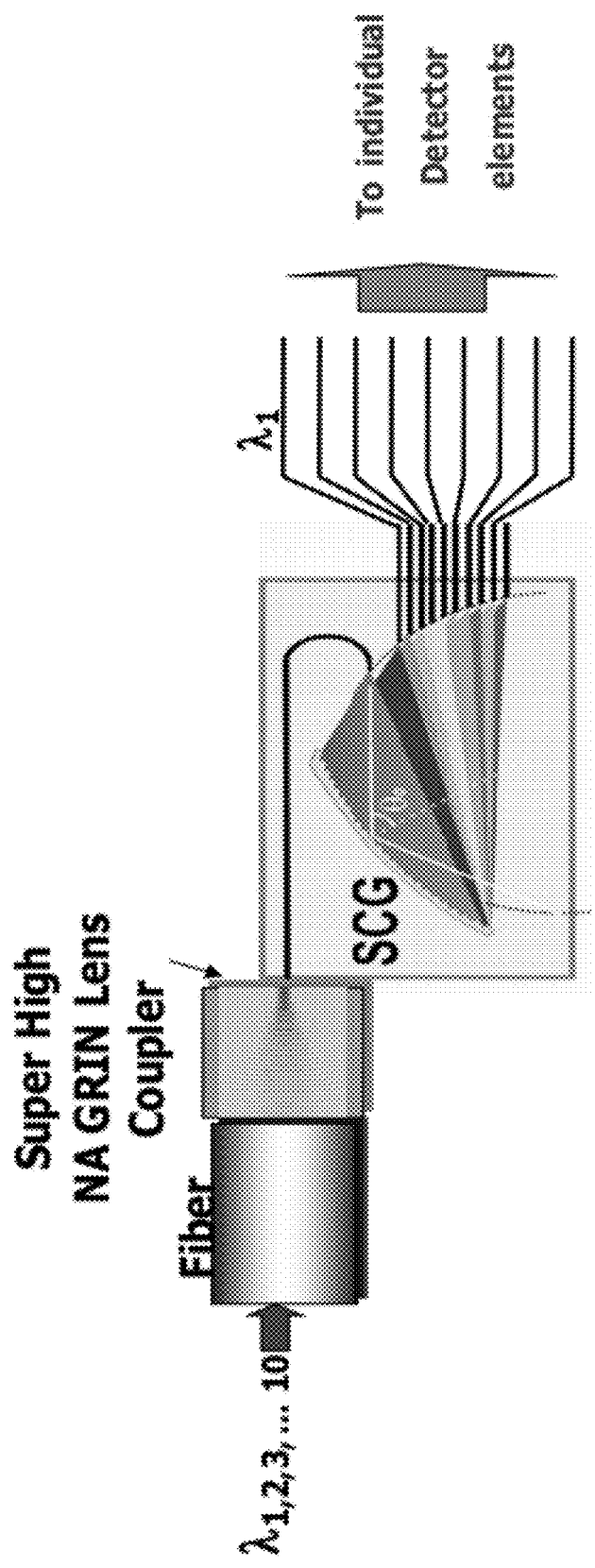
FIG. 28 shows schematically a 5×5 electric field detector array coupled to a dense wavelength division multiplexer (DWDM) according to one embodiment of the present invention.

In the process (b), the array is monolithically fabricated on a single substrate and an on-chip DWDM wavelength de-multiplexer (DeMux) with 25 DWDM wavelength channels is used to channel the 25 wavelengths to 25 detectors. In this example, there is only one single input fiber needed, as shown in FIG. 28. The on-chip DWDM DeMux is fabricated on the GaAs based case to demonstrate the approach.

Figure 29:
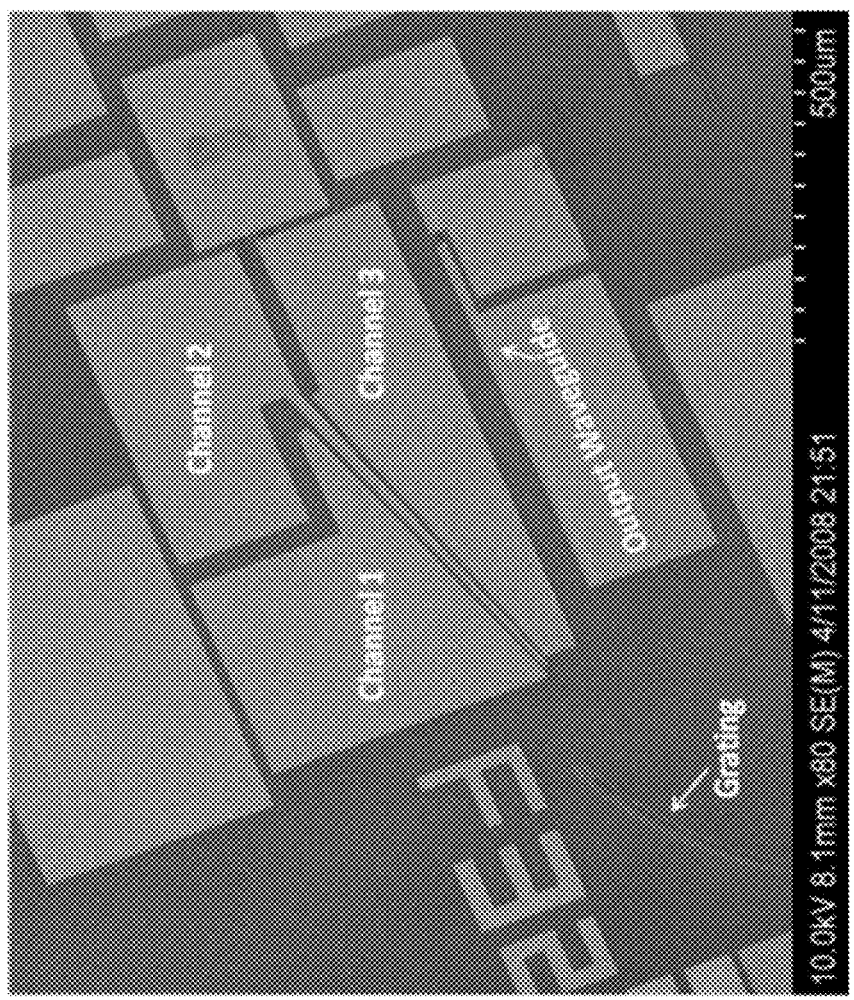
FIG. 29 shows an SEM image of an integrated multi-channel laser transmitter according to one embodiment of the present invention.
Figure 30:
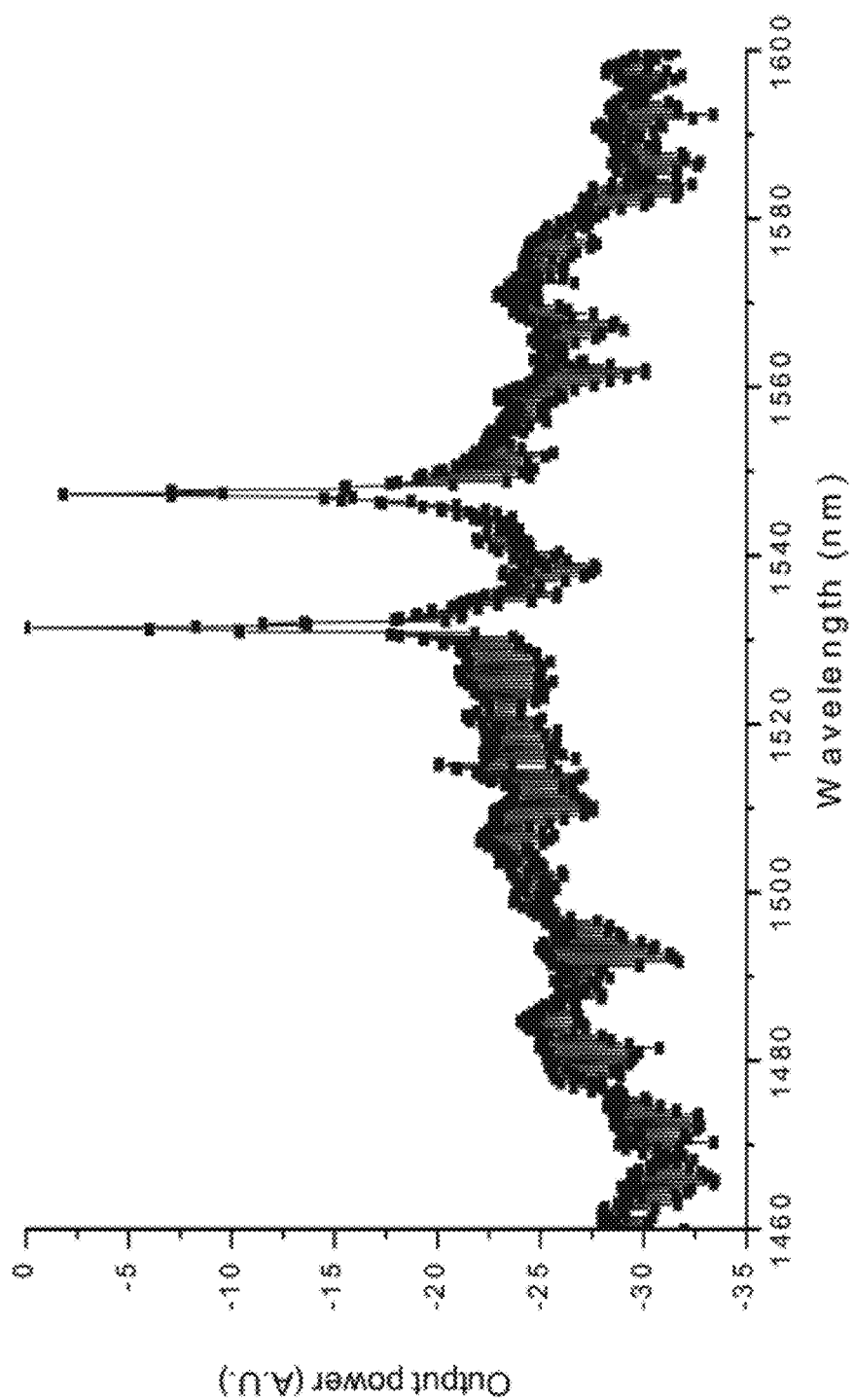
FIG. 30 shows a spectrum of the simultaneous outputs at channel 1 (1547 nm) and channel 2 (1531 nm) separated by 16 nm according to one embodiment of the present invention.

The DWDM DeMux is based on a WDM-On-A-Chip technology that is developed recently enabling the realization of "external grating laser" on a single monolithically integrated chip. The key element is an integrated curved diffraction grating on III-V chip with very small physical size call the super-compact grating (SCG). For example, wavelength multiplexers (Mux's) with 100 GHz DWDM channel spacing is realizable with a grating size less than 0.5 mm². The novel curved grating is computationally generated with full spatial aberration correction, fabricated by vertical etching into the side wall of a planar waveguide on an III-V chip. This results in an integrated curved diffraction grating with the highest spectral resolution and the smallest physical size. These gratings actually operate with a very small slit size defined by the integrated waveguide to achieve high resolution. The small slit size results in large beam diffraction angle, and the aberration-free grating enables focusing back to a small slit giving ultra-high spectral resolution. The grating region is based on a planar waveguide (instead of channel waveguides such as in arrayed waveguide grating or AWG) and hence the propagation loss in SCG is substantially lower (<1 dB) than III-V based AWG (typically >10 dB). An example of the highly integrated multi-wavelength InGaAsP laser chip based on the SCG that is realized recently is shown in FIG. 29. FIG. 30 shows a spectrum of the simultaneous outputs at channel 1 (1547 nm) and channel 2 (1531 nm) separated by 16 nm according to one embodiment of the present invention.

Figure 31:
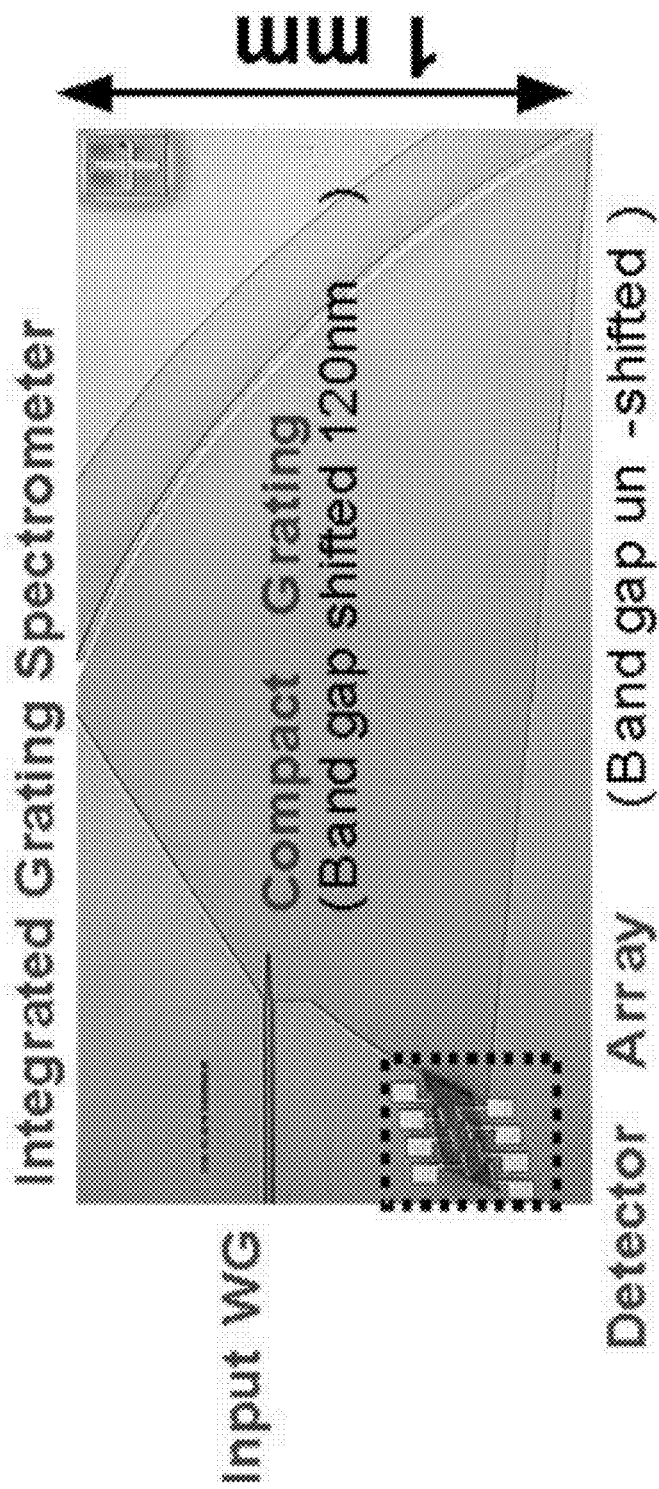
FIG. 31 shows an image of a DWDM based on a Super-Compact Grating fabricated on an III-V chip according to one embodiment of the present invention.
Figure 32:
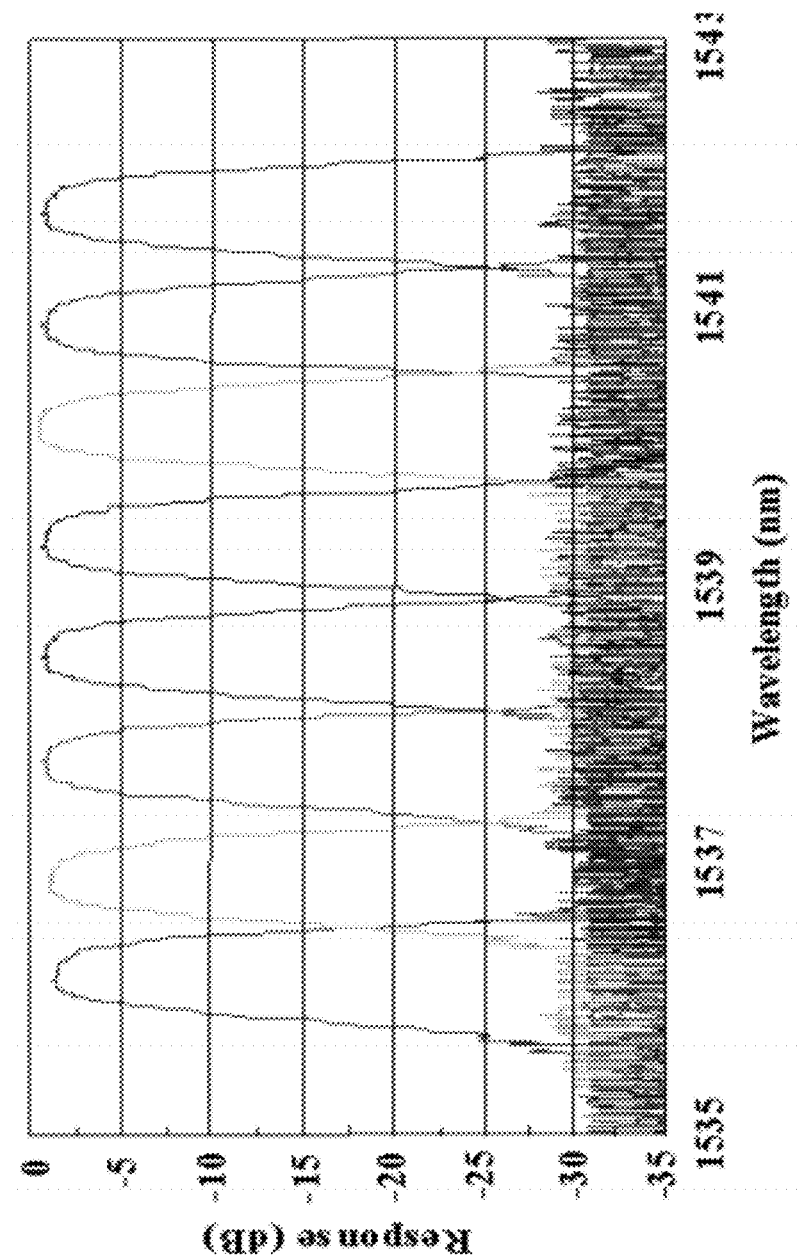
FIG. 32 shows spectra of the channel outputs of a SCG DWDM according to one embodiment of the present invention.

Experimental results verifying the ultra-large-angle aberration-corrected grating (i.e. SCG) design has been achieved. FIG. 31 shows an integrated WDM grating optical spectrometer on InP chip only 2 mm² in size capable of 100 GHz channel spacing (50 GHz resolution) based on the SCG. It involved integration of SCG with a detector array to pick up powers in multiple channels. FIG. 32 shows the attractive device performances of the spectrometer with channel cross talks <−25 dB, experimentally confirming the SCG design.

EXAMPLE 11

Overall System Engineering and Power/Cost Estimates

There are a number of choices in terms of the actual combination of technologies. They are not all equal in cost and power requirement. Here are some best case analyses to give an idea of the wall-plug power requirement. As discussed, the GaAs and organic waveguide based electric field detectors are comparable in some way. The analyses are focused on the GaAs waveguide based electric field detector. Quantum well structures is used to gain about 3 times higher electro-optic response than that provided by bulk GaAs. With a 150 times enhancement by the micro-antenna, a 2 times enhancement by a dual pass scheme, and a detector sensitivity of 30 $fW/Hz^{1/2}$, the performance parameters listed under Embodiment II in Table 1 can be reached. A module-type photodetector is also used.

For this configuration, the wall plugged power is basically dominated by the 20 mW fixed wavelength DFB laser diode with controller giving 2-3 W wall-plugged power requirement and the RF photodetctor module with a few Watts wall-plugged power requirement. Thus, the total wall-plugged power is about 10 W or lower.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:
1. An electric field detection device, comprising:
an interferometer having a reference arm and an active arm, wherein the reference arm comprises a first electro-optic (EO) waveguide, and wherein the active arm comprises:
(a) a first metallic plate;
(b) a second metallic plate spaced apart from the first metallic plate defining a first gap therebetween;
(c) a third metallic plate disposed in the first gap and vertically extending from the first metallic plate to define a T-shape structure and a second gap between the third metallic plate and the second metallic plate, wherein the second gap is substantially smaller than the first gap;
  (d) a second electro-optic waveguide disposed in the second gap, wherein the second electro-optic waveguide comprises:
    (i) a waveguide layer;
    (ii) a first cladding layer disposed between the third metallic plate and the waveguide layer; and
    (iii) a second cladding layer disposed between the waveguide layer and the second metallic plate; and
  (e) a dielectric layer disposed in the first gap and surrounding the third metallic plate and the second electro-optic waveguide,
  wherein the second electro-optic waveguide is in electrical communication with the third metallic plate and the second metallic plate, respectively.

2. The electric field detection device of claim 1, wherein the first and third metallic plates are formed integrally.

3. The electric field detection device of claim 1, wherein the dielectric layer comprises CYTOP™.

4. The electric field detection device of claim 1, wherein each of the first and second cladding layers is formed of a transparent conducting oxide (TCO).

5. The electric field detection device of claim 4, wherein the TCO comprises one of Sn-doped $In_2O_3$, $In_2O_3$, ZnO, and NiO.

6. The electric field detection device of claim 1, wherein each of the first and second cladding layers is formed of an electrically non-conductive material.

7. The electric field detection device of claim 1, wherein the waveguide layer is formed of a semiconductor material selected from groups III-V of the Period Table.

8. The electric field detection device of claim 7, wherein the semiconductor material comprises GaAs.

9. The electric field detection device of claim 7, wherein the waveguide layer comprises quantum well structures or quantum dot structures of the semiconductor material.

10. The electric field detection device of claim 1, wherein the waveguide layer is formed of an organic electro-optic material.

11. The electric field detection device of claim 10, wherein the organic electro-optic material comprises molecularly self-assembled superlattices.

12. The electric field detection device of claim 11, wherein the organic electro-optic material comprises an organic material with an electro-optic coefficient $r_{33}$ higher than about 100 pm/V.

13. The electric field detection device of claim 1, wherein each of the first and second electro-optic waveguides comprises a retro-reflector at the end thereof.

14. The electric field detection device of claim 13, wherein the retro-reflector comprises a micro-loop mirror.

15. The electric field detection device of claim 13, wherein the retro-reflector comprises a metallic coating at the end of a respective electro-optic waveguide.

16. The electric field detection device of claim 1, further comprising a first optical ring resonator coupled to the first electro-optic waveguide and a second optical ring resonator coupled to the second electro-optic waveguide.

17. The electric field detection device of claim 1, wherein the interferometer further comprises an input/output waveguide having a first end and a second end, wherein the first end is optically coupled to both the first and second electro-optic waveguides, and the second end is optically coupled to an optical fiber.

18. The electric field detection device of claim 17, wherein the second end of the input/output waveguide is tapered to a pointed tip such that the width of the tip is less than half of the wavelength of a light beam propagating in the input/output waveguide.

19. The electric field detection device of claim 18, wherein the optical fiber has a lens tip.

20. The electric field detection device of claim 17, further comprising a gradient-index (GRIN) lens configured to facilitate the optical coupling between the second end of the input/output waveguide and the optical fiber.

21. The electric field detection device of claim 1, wherein the reference arm has an optical path-length that is about $\lambda/8$ longer than the optical path-length of the active arm, where $\lambda$ is the wavelength of a light beam propagating in the interferometer.

22. The electric field detection device of claim 21, further comprising a heater disposed in the vicinity of the reference arm adapted for tuning the optical path-length of the reference arm.

23. An electric field detection device, comprising:
  an interferometer having a reference arm and an active arm, wherein the reference arm comprises a first electro-optic (EO) waveguide, and wherein the active arm comprises:
  (a) a first electrically conductive plate;
  (b) a second electrically conductive plate spaced apart from the first electrically conductive plate defining a first gap therebetween;
  (c) a third electrically conductive plate disposed in the first gap and vertically extending from the first electrically conductive plate to define a T-shape structure and a second gap between the third electrically conductive plate and the second electrically conductive plate, wherein the second gap is substantially smaller than the first gap; and
  (d) a second electro-optic waveguide disposed in the second gap, the second electro-optic waveguide having a first surface and an opposite, second surface, wherein the first surface is in electrical communication with the third electrically conductive plate and the second surface is in electrical communication with the second electrically conductive plate.

24. The electric field detection device of claim 23, wherein each of the first, second and third electrically conductive plates is formed of a metal.

25. The electric field detection device of claim 23, wherein the first and third electrically conductive plates are formed integrally.

26. The electric field detection device of claim 23, wherein the active arm further comprises a dielectric layer disposed in the first gap and surrounding the third electrically conductive plate and the second electro-optic waveguide.

27. The electric field detection device of claim 23, wherein the second electro-optic waveguide further comprises a first cladding layer disposed on the first surface thereof and a second cladding layer disposed on the second surface thereof.

28. The electric field detection device of claim 27, wherein each of the first and second cladding layers is formed of a transparent conducting oxide (TCO).

29. The electric field detection device of claim 27, wherein each of the first and second cladding layers is formed of an electrically non-conductive material.

30. The electric field detection device of claim 23, wherein each of the first and second electro-optic waveguides comprises a high-refractive-index-contrast waveguide.

31. The electric field detection device of claim 30, wherein the high-refractive-index-contrast waveguide is formed of a semiconductor material selected from groups III-V of the Period Table.

32. The electric field detection device of claim 31, wherein the semiconductor material comprises GaAs.

33. The electric field detection device of claim 31, wherein the high-refractive-index-contrast waveguide comprises quantum well structures or quantum dot structures of the semiconductor material.

34. The electric field detection device of claim 23, wherein each of the first and second electro-optic waveguides is formed of an organic electro-optic material.

35. The electric field detection device of claim 34, wherein the organic electro-optic material comprises molecularly self-assembled superlattices.

36. The electric field detection device of claim 23, wherein each of the first and second electro-optic waveguides comprises a retro-reflector at the end thereof.

37. The electric field detection device of claim 23, further comprising a first optical ring resonator coupled to the first electro-optic waveguide and a second optical ring resonator coupled to the second electro-optic waveguide.

38. The electric field detection device of claim 23, wherein the interferometer further comprises an input/output waveguide having a first end and a second end, wherein the first end is optically coupled to both the first and second electro-optic waveguides, and the second end is optically coupled to an optical fiber.

39. The electric field detection device of claim 38, further comprising a gradient-index (GRIN) lens configured to facilitate the optical coupling between the second end of the input/output waveguide and the optical fiber.

40. The electric field detection device of claim 23, wherein the reference arm has an optical path-length that is about $\lambda/8$ longer than the optical path-length of the active arm, where $\lambda$ is the wavelength of a light beam propagating in the interferometer.

41. The electric field detection device of claim 40, further comprising a heater disposed in the vicinity of the reference arm adapted for tuning the optical path-length of the reference arm.

42. An electric field detection system, comprising:
(a) an electric field detection device of claim 23; and
(b) an optical circulator having a first port configured to receive an input light beam, a second port configured to transmit the input light beam to and to receive an output light beam from the electric field detection device, and a third port configured to transmit the output light beam received from the electric field detection device to a light detection system.

43. The electric field detection system of claim 42, further comprising a first beam splitter, the first beam splitter having an input port configured to receive a source light beam, a first output port configured to transmit a first part of the source light beam to the first port of the optical circulator, and a second output port configured to transmit a second part of the source light beam to the light detection system.

44. The electric field detection system of claim 43, wherein the light detection system comprises a second beam splitter, the second beam splitter having a first input port configured to receive the output light beam transmitted from the third port of the optical circulator, a second input port configured to receive the second part of the source light beam transmitted from the second output port of the first beam splitter, a first output port configured to output an enhanced light beam resulted from a constructive interference of the light beams received from the first and the second input ports of the second beam splitter, and a second output port configured to output a reduced light beam resulted from a destructive interference of the light beams received from the first and second input ports of the second beam splitter.

45. The electric field detection system of claim 44, wherein the light detection system further comprises a light detector configured to receive the light beam transmitted from the second output port of the second beam splitter.

46. The electric field detection system of claim 45, wherein the light detection system further comprises a phase shifter and an optical attenuator coupled in series between the second output port of the first beam splitter and the second input port of the second beam splitter.

47. The electric field detection system of claim 46, wherein the light detection system further comprises a feedback controller coupled between the light detector and the phase shifter and between the light detector and the optical attenuator, respectively.

48. An electric field detection module comprising a plurality of electric field detection devices of claim 23 arranged in an array.

49. The electric field detection module of claim 48, further comprising a dense wavelength division multiplexer (DWDM) coupled to the plurality of electric field detection devices via an optical fiber and a gradient-index (GRIN) lens.

50. The electric field detection module of claim 49, wherein the DWDM comprises a diffraction grating.

* * * * *